United States Patent
Jung et al.

(10) Patent No.: US 11,315,929 B2
(45) Date of Patent: Apr. 26, 2022

(54) SEMICONDUCTOR MEMORY DEVICE INCLUDING CAPACITOR WITH SHAPED ELECTRODE AND METHOD FOR FABRICATING THEREOF

(71) Applicant: Samsung Electronics Co., Ltd., Suwon-si (KR)

(72) Inventors: Seung Jae Jung, Suwon-si (KR); Jae Hoon Kim, Seoul (KR); Kwang-Ho Park, Cheonan-si (KR); Yong-hoon Son, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/038,606

(22) Filed: Sep. 30, 2020

(65) Prior Publication Data

US 2021/0257368 A1   Aug. 19, 2021

(30) Foreign Application Priority Data

Feb. 17, 2020   (KR) .................. 10-2020-0018974

(51) Int. Cl.
*H01L 27/108*   (2006.01)
*H01L 27/13*   (2006.01)
*H01L 25/18*   (2006.01)
*H01L 27/12*   (2006.01)

(52) U.S. Cl.
CPC .. *H01L 27/10805* (2013.01); *H01L 27/10802* (2013.01); *H01L 27/13* (2013.01); *H01L 25/18* (2013.01); *H01L 27/1207* (2013.01)

(58) Field of Classification Search
CPC ......... H01L 27/10805; H01L 27/10802; H01L 27/13
See application file for complete search history.

(56) References Cited

U.S. PATENT DOCUMENTS

| | | | |
|---|---|---|---|
| 8,502,340 B2 | 8/2013 | Oganesian et al. | |
| 9,859,337 B2 | 1/2018 | Ratnam et al. | |
| 10,008,505 B2 | 6/2018 | Lee et al. | |
| 2017/0092370 A1* | 3/2017 | Harari ............... | G11C 16/0491 |

(Continued)

FOREIGN PATENT DOCUMENTS

| | | |
|---|---|---|
| KR | 101924861 B1 | 12/2018 |
| KR | 20190095138 A | 8/2019 |

*Primary Examiner* — Sheng-Bai Zhu
(74) *Attorney, Agent, or Firm* — Harness, Dickey & Pierce, P.L.C.

(57) ABSTRACT

A semiconductor device includes a bit line extending in a first direction, a gate electrode extending in a second direction, and a semiconductor pattern extending in a third direction and connected to the bit line, and a capacitor. The capacitor includes a first electrode connected to the semiconductor pattern and a dielectric film between the first and second electrodes. The first or the second direction is perpendicular to an upper surface of the substrate. The first electrode includes an upper and a lower plate region parallel to the upper surface of the substrate, and a connecting region which connects the upper and the lower plate regions. The upper and the lower plate regions of the first electrode include an upper and a lower surface facing each other. The dielectric film extends along the upper and the lower surfaces of the upper and lower plate regions of the first electrode.

19 Claims, 53 Drawing Sheets

(56) References Cited

U.S. PATENT DOCUMENTS

2018/0301454 A1* 10/2018 Mathew ............ H01L 27/10841
2019/0006376 A1*  1/2019 Ramaswamy ...... H01L 29/1037
2019/0164985 A1   5/2019 Lee et al.

* cited by examiner

SEMICONDUCTOR MEMORY DEVICE INCLUDING CAPACITOR WITH SHAPED ELECTRODE AND METHOD FOR FABRICATING THEREOF

CROSS REFERENCE TO RELATED APPLICATION

This application claims priority under 35 U.S.C. § 119 to Korean Patent Application No. 10-2020-0018974 filed Feb. 17, 2020, the disclosure of which is incorporated herein in its entirety by reference.

BACKGROUND

1. Field

Inventive concepts relate to a semiconductor memory device and/or a method for fabricating the same, and more particularly, to a three-dimensional semiconductor memory device with improved electrical characteristics and/or a method for fabricating the same.

2. Description of Related Art

Increasing a degree of integration of semiconductor elements may be required for satisfying performance and lowering prices for consumers. In the case of the semiconductor elements, since the degree of integration is an important factor for determining the price of a product, an increased density may be particularly required.

In the case of a conventional two-dimensional or planar semiconductor element, since the degree of integration mainly may be determined by an area occupied by a unit memory cell, it is greatly affected by the level of technique of forming fine patterns. However, since ultra-expensive apparatuses are used for miniaturization of the patterns, the degree of integration of two-dimensional semiconductor elements is increasing, but is still limited. Accordingly, three-dimensional semiconductor memory elements including memory cells arranged three-dimensionally have been proposed.

SUMMARY

Aspects of inventive concepts provide a three-dimensional semiconductor memory device in which element characteristics are improved by engineering a shape of an electrode.

Aspects of inventive concepts also provide a method for fabricating a three-dimensional semiconductor memory device in which element characteristics are improved by engineering a shape of an electrode.

According to example embodiments of inventive concepts, a semiconductor device includes a substrate, a bit line on the substrate and extending in a first direction; a gate electrode on the substrate and extending in a second direction different from the first direction; a semiconductor pattern connected to the bit line and extending in a third direction different from the first direction and the second direction; and a capacitor including a first electrode connected to the semiconductor pattern, a second electrode spaced apart from the first electrode, and a dielectric film between the first electrode and the second electrode. One of the first direction or the second direction is perpendicular to an upper surface of the substrate. The first electrode includes an upper plate region and a lower plate region parallel to the upper surface of the substrate, and a connecting region that connects the upper plate region and the lower plate region. Each of the upper plate region of the first electrode and the lower plate region of the first electrode includes an upper surface and a lower surface facing each other. The dielectric film extends along the upper surface of the upper plate region of the first electrode and the lower surface of the upper plate region of the first electrode, and the dielectric film extends along the upper surface of the lower plate region of the first electrode and the lower surface of the lower plate region of the first electrode.

According to example embodiments of inventive concepts, a semiconductor device includes a substrate; a bit line on the substrate and extending in a first direction; a gate electrode on the substrate and extending in a second direction different from the first direction; a semiconductor pattern connected to the bit line and extending in a third direction different from the first direction and the second direction; and a capacitor including a first electrode connected to the semiconductor pattern, a second electrode spaced apart from the first electrode, and a dielectric film between the first electrode and the second electrode. One of the first direction and the second direction is perpendicular to an upper surface of the substrate. In a cross-sectional view taken in the third direction, the first electrode includes a first sub-electrode region and a second sub-electrode region on both sides with the second electrode therebetween. Each of the first and second sub-electrode regions include a connecting part extending in a direction perpendicular to the upper surface of the substrate, a first protruding part protruding from one end of the connecting part in the third direction, and a second protruding part protruding from an other end of the connecting part in the third direction. The dielectric film extends along profiles of the first and second protruding parts of the first sub-electrode region and the dielectric film extends along profiles of the first and second protruding parts of the second sub-electrode region.

According to some example embodiments of inventive concepts, a semiconductor memory device includes a substrate; a bit line located on the substrate and extending in a first direction perpendicular to a upper surface of the substrate; a gate electrode on the substrate and including an upper gate electrode and a lower gate electrode extending in a second direction parallel to the upper surface of the substrate, the upper gate electrode being spaced apart from the lower gate electrode in the first direction; a semiconductor pattern disposed between the lower gate electrode and the upper gate electrode and electrically connected to the bit line; and a capacitor including a first electrode connected to the semiconductor pattern, a second electrode spaced apart from the first electrode, and a dielectric film between the first electrode and the second electrode. The first electrode includes an upper plate region and a lower plate region parallel to the upper surface of the substrate, and a connecting region that connects the upper plate region and the lower plate region. The connecting region of the first electrode has a closed-loop shape. Each of the upper plate region of the first electrode and the lower plate region of the first electrode includes an upper surface and a lower surface facing each other. The dielectric film extends along upper and lower surfaces of the upper plate region of the first electrode, and the dielectric film extends along upper and lower surfaces of the lower plate region of the first electrode.

However, aspects of inventive concepts are not restricted to the one set forth herein. The above and other aspects of inventive concepts will become more apparent to one of ordinary skill in the art by the description of example embodiments below.

BRIEF DESCRIPTION OF THE DRAWINGS

The above and other aspects and features of inventive concepts will become more apparent by describing in detail example embodiments thereof with reference to the attached drawings, in which:

FIG. 4b is a cross-sectional view taken and combined along the line D-D of FIG. 4a;

DETAILED DESCRIPTION

Figure 1:
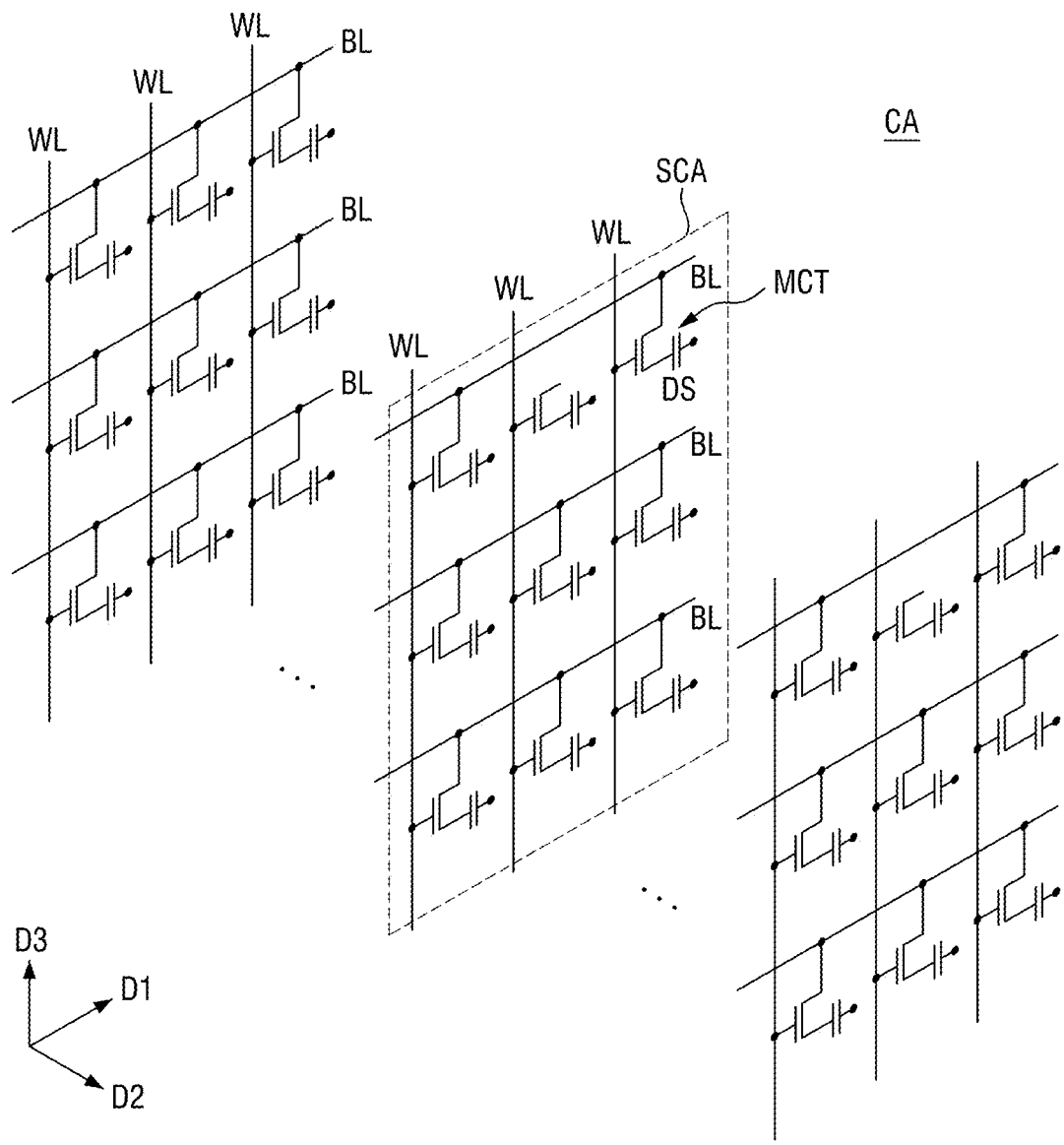
FIG. 1 is a schematic circuit diagram showing a cell array of a three-dimensional semiconductor memory device according to some embodiments.

FIG. 1 is a schematic circuit diagram showing a cell array of a three-dimensional semiconductor memory device according to some embodiments.

Referring to FIG. 1, a cell array CA of the three-dimensional semiconductor memory device according to embodiments of inventive concepts may include a plurality of sub-cell arrays SCA. As an example, the sub-cell arrays SCA may be arranged along a second direction D2.

Each sub-cell array SCA may include a plurality of bit lines BL, a plurality of word lines WL, and a plurality of memory cell transistors MCT. A single memory cell transistor MCT may be disposed between the single word line WL and the single bit line BL.

The bit lines BL may be conductive patterns (e.g., metal lines) stacked on the substrate in a third direction D3. Each bit line BL may extend in a first direction D1. The bit lines BL adjacent to each other may be spaced apart from each other in the third direction D3.

The word lines WL may be conductive patterns (e.g., metal lines) extending in a direction perpendicular to the substrate (e.g., in the third direction D3). The word lines WL in one sub-cell array SCA may be arranged in the first direction D1. The word lines WL adjacent to each other may be spaced apart from each other in the first direction D1.

A gate of the memory cell transistor MCT may be connected to the word line WL, and a first source/drain of the memory cell transistor MCT may be connected to the bit line BL. A second source/drain of the memory cell transistor MCT may be connected to the information storage elements DS.

The information storage elements DS may be memory elements that may store data. Each of the information storage elements DS may be a memory element using a capacitor, a memory element using a magnetic tunnel junction pattern or a memory element using a variable resistor including a phase change material. As an example, each information storage element DS may be a capacitor. In the semiconductor memory device according to some embodiments, the information storage element DS may be a capacitor. The second source/drain of the memory cell transistor MCT may be connected to a first electrode of the capacitor.

The semiconductor memory device explained using FIGS. 2 to 14b may have a cell array circuit diagram as in FIG. 1.

Figure 2:
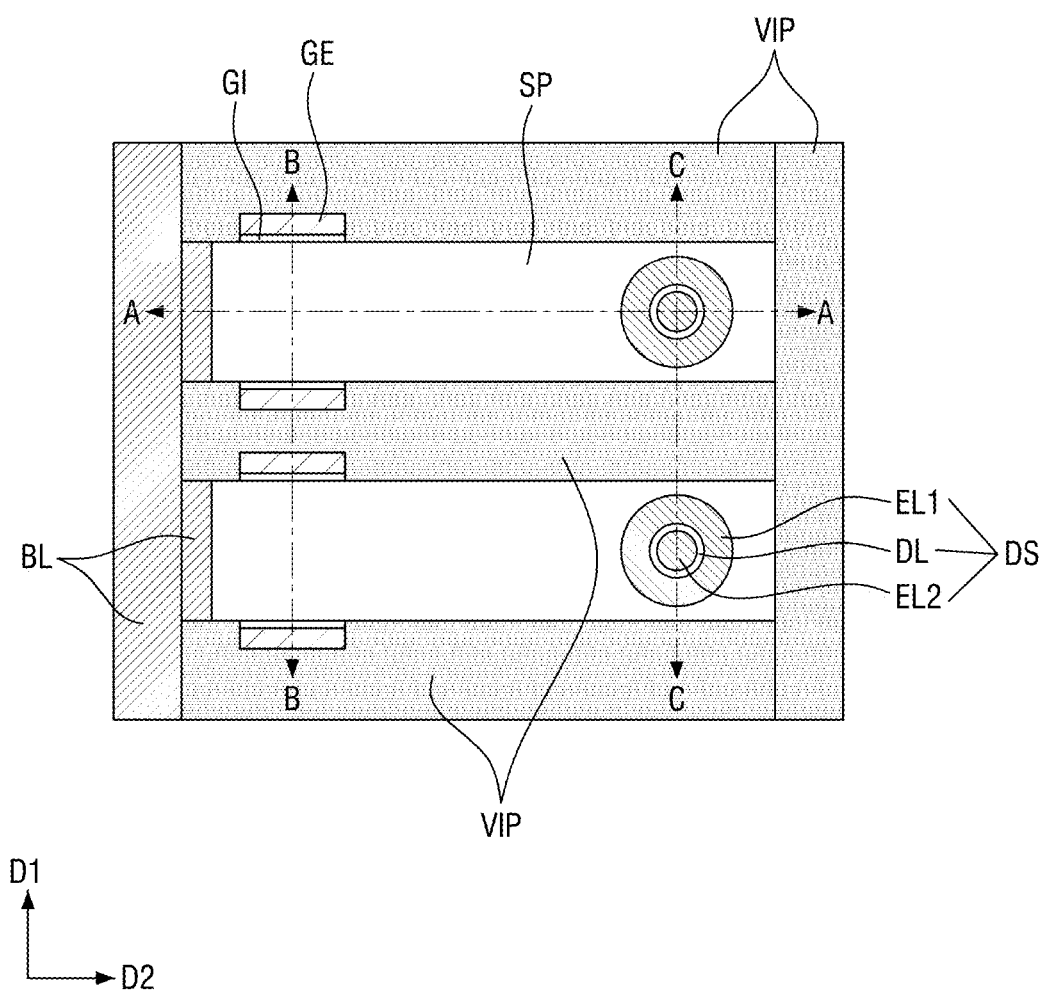
FIG. 2 is a plan view showing the semiconductor memory device according to some embodiments.
Figure 3A:
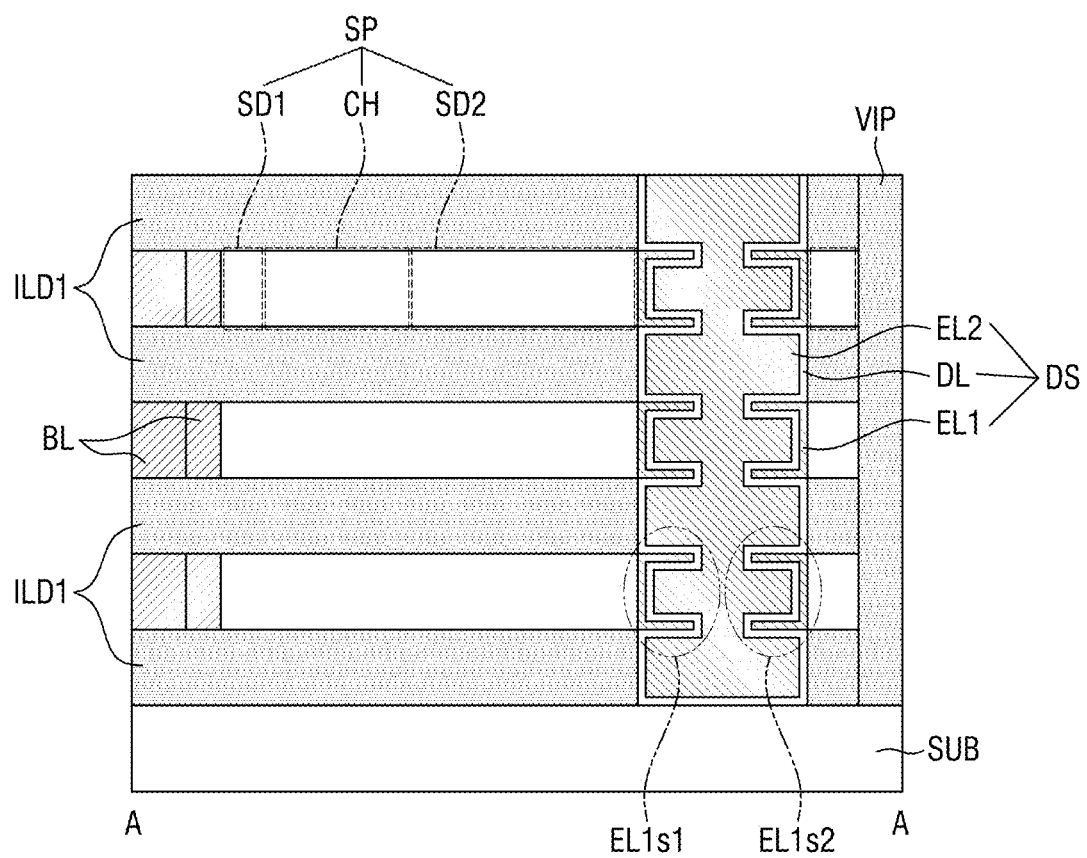
FIGS. 3a to 3c are cross-sectional views taken along lines A-A, B-B, and C-C of FIG. 2, respectively.
Figure 3B:
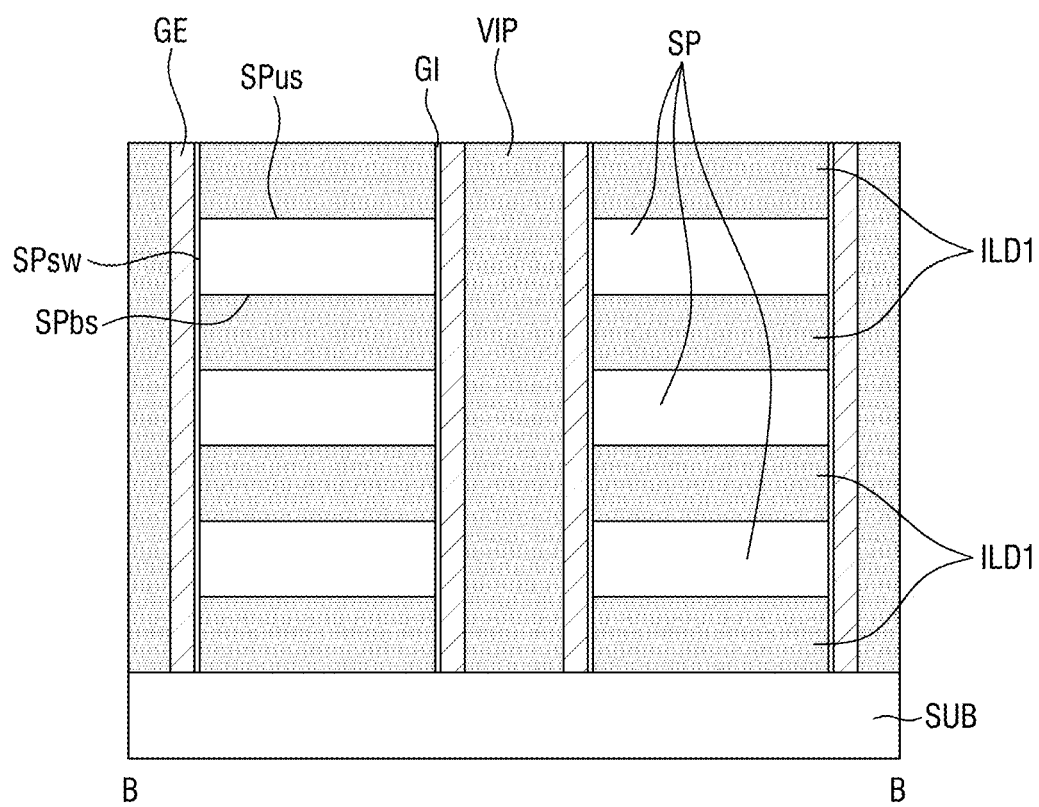
Figure 3C:
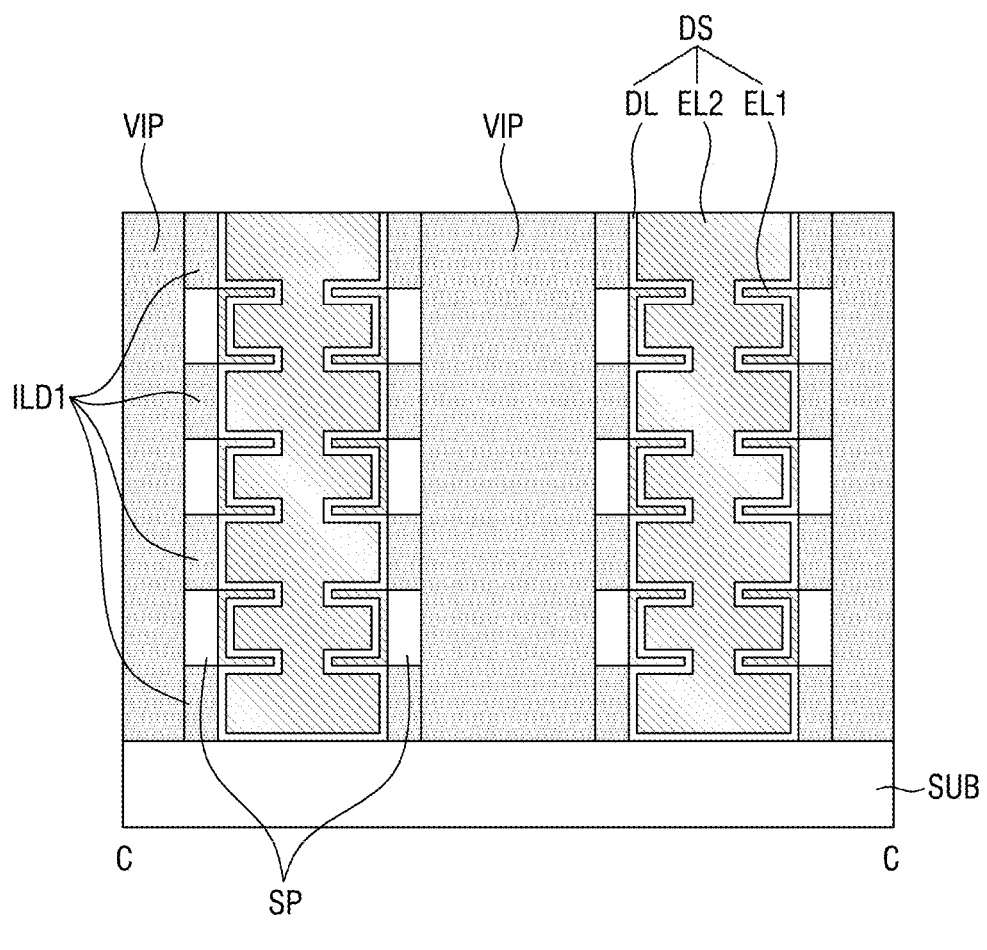
Figure 4A:
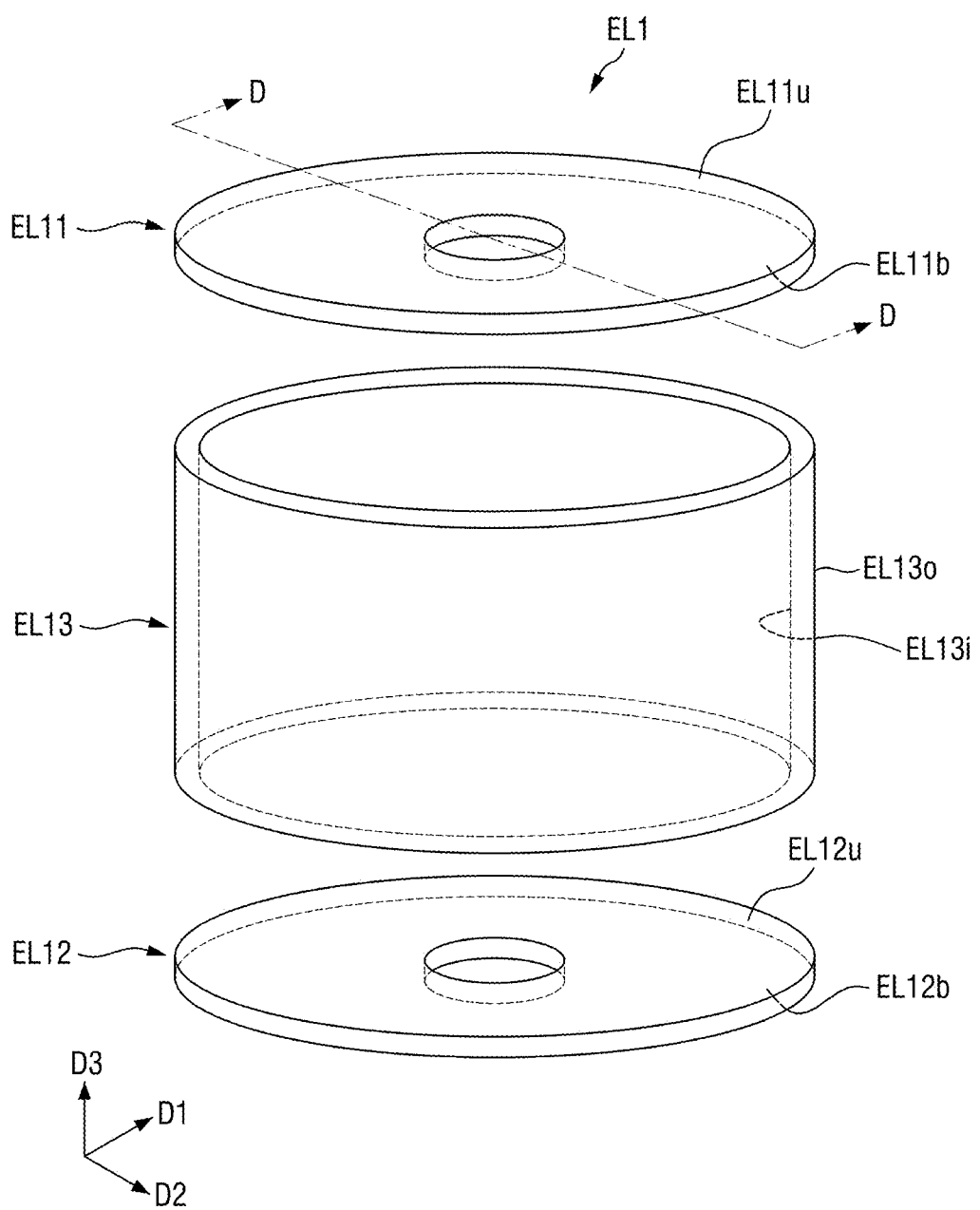
FIG. 4a is an exploded perspective view showing a first electrode of FIG. 2 in a three-dimensional manner.
Figure 4B:
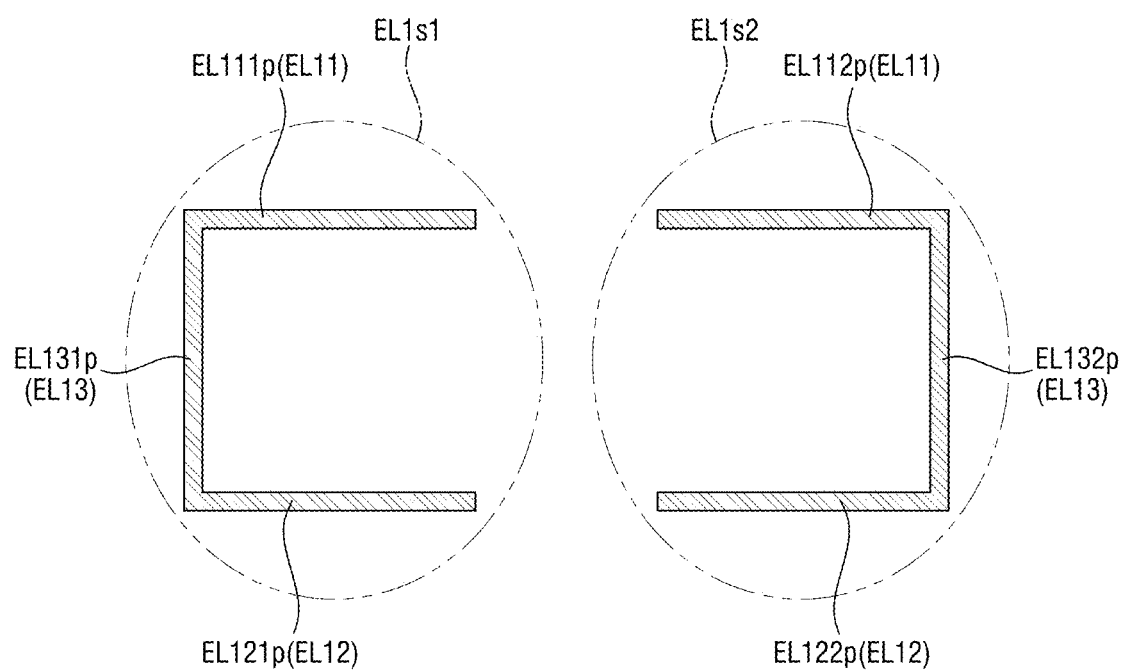

FIG. 2 is a plan view showing a semiconductor memory device according to some embodiments. FIGS. 3a to 3c are cross-sectional views taken along lines A-A, B-B, and C-C of FIG. 2, respectively. FIG. 4a is an exploded perspective view showing the first electrode of FIG. 2 in a three-dimensional manner. FIG. 4b is a cross-sectional view taken and combined along a line D-D of FIG. 4a.

For reference, FIG. 2 may show some of the sub-cell arrays SCA of the semiconductor memory device explained in FIG. 1. FIG. 4a may be an example shape of the second electrode shown in FIG. 2.

As an example, the first direction D1, the second direction D2, and the third direction D3 may be perpendicular to each other, but are not limited thereto. Further, the first direction D1 and the second direction D2 may be parallel to an upper surface of the substrate SUB, and the third direction D3 may be perpendicular to the upper surface of the substrate SUB.

Referring to FIGS. 2 to 4b, the semiconductor memory device according to some embodiments may include a semiconductor pattern SP, a bit line BL, a gate electrode GE, an information storage element DS, and a vertical insulating structure VIP.

The plurality of first mold insulating layers ILD1 may be disposed on the substrate SUB. Each of the first mold insulating layers ILD1 may be disposed to be spaced apart from each other in the third direction D3. Although the four first mold insulating layers ILD1 are shown, it is only for convenience of explanation, and the number thereof is not limited thereto.

The first mold insulating layer ILD1 may include an insulating material. The first mold insulating layer ILD1 may include, for example, at least one of a silicon oxide film, a silicon nitride film, a silicon oxynitride film, a carbon-containing silicon oxide film, a carbon-containing silicon nitride film, and a carbon-containing silicon oxynitride film. For example, the first mold insulating layer ILD1 may include a silicon oxide film.

The substrate SUB may be bulk silicon or SOI (silicon-on-insulator). Alternatively, the substrate SUB may be a silicon substrate or may include, but is not limited to, other materials, for example, silicon germanium, silicon germanium on insulator (SGOI), indium antimonide, lead telluride, indium arsenide, indium phosphide, gallium arsenide or gallium antimonide. In the following description, the substrate SUB will be explained as a silicon substrate.

The plurality of semiconductor patterns SP may be disposed on the substrate SUB. The semiconductor patterns SP may be disposed to be spaced apart from each other along the first direction D1. Further, the semiconductor patterns SP may be stacked along the third direction D3. The semiconductor patterns SP stacked in the third direction D3 may be spaced apart from each other. The semiconductor patterns SP stacked in the third direction D3 may be disposed between the adjacent first insulating mold layers ILD.

Each of the semiconductor patterns SP may have a line shape or a bar shape extending in the second direction D2. Each semiconductor pattern SP may include a channel region CH, and a first impurity region SD1 and a second impurity region SD2 disposed in the second direction D2 with the channel region CH therebetween. The first impurity region SD1 is adjacent to the bit line BL and may be connected to the bit line BL. The second impurity region SD2 is adjacent to the information storage element DS and may be connected to the information storage element DS.

Each of the semiconductor patterns SP facing each other in the third direction D3 may include an upper surface SPus and a lower surface SPbs facing each other in the third direction D3. Each of the semiconductor patterns SP may include side walls SPsw facing each other in the first direction D1.

The semiconductor patterns SP may include a semiconductor material such as silicon, germanium, silicon-germanium or metal oxide. As an example, the semiconductor patterns SP may include polysilicon. As another example, the semiconductor patterns SP may include an amorphous metal oxide, a polycrystalline metal oxide, a combination of the amorphous metal oxide and the polycrystalline metal oxide or the like. When the semiconductor patterns SP include a metal oxide, the semiconductor patterns SP may include at least one of an In—Ga-based oxide (IGO), an In—Zn-based oxide (IZO) or an In—Ga—Zn-based oxide (IGZO).

The gate electrodes GE may have a line shape or a bar shape extending in the first direction D1. The gate electrodes GE may be spaced apart from each other along the first direction D1 and stacked. Each gate electrode GE may extend in the third direction D1 across the semiconductor patterns SP stacked in the third direction D3.

Each gate electrode GE may be disposed on side walls SPsw of the semiconductor pattern. The gate electrode GE may be disposed on each of the side walls SPsw of the semiconductor pattern facing each other. For example, the semiconductor memory device according to some embodiments may have, but is not limited to, a double gate transistor structure. Unlike the shown case, the gate electrode GE may, of course, be disposed on one of the side walls SPsw of the semiconductor patterns facing each other.

The gate electrodes GE may include a conductive material. As an example, the gate electrodes GE may be one of a doped semiconductor material (doped silicon, doped germanium, etc.), a conductive metal nitride (titanium nitride, tantalum nitride, etc.), a metal (tungsten, titanium, tantalum, etc.), and metal-semiconductor compounds (tungsten silicide, cobalt silicide, titanium silicide, etc.).

The gate insulating film GI may be interposed between the gate electrode GE and the semiconductor patterns SP. The gate insulating film GI may include at least one of a high dielectric constant insulating film, a silicon oxide film, a silicon nitride film, and a silicon oxynitride film. As an example, the high dielectric constant insulating film may include at least one of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate.

A plurality of bit lines BL extending in the first direction D1 may be disposed on the substrate SUB. Each bit line BL may have a line shape or a bar shape extending in the first direction D1. The bit lines BL are arranged along the third direction D3. Each bit line BL may be electrically connected to the first impurity regions SD1 of the semiconductor patterns SP arranged along the first direction D1.

The bit lines BL stacked in the third direction D3 may be disposed between the adjacent first mold insulating layers ILD1. Although each bit line BL is shown as including a portion protruding toward the semiconductor pattern SP in the second direction D2, the embodiment is not limited thereto.

The bit lines BL may include a conductive material, and may be, for example, one of a doped semiconductor material, a conductive metal nitride, a metal, a metal-semiconductor compound.

A plurality of vertical insulating structures VIP may be disposed on the substrate SUB. Each vertical insulating structure VIP may extend long in the third direction D3. The semiconductor patterns SP arranged in the first direction D1 and the third direction D3 may be defined by the vertical insulating structure VIP. That is, in the semiconductor memory device according to some embodiments, the regions of the semiconductor patterns SP including the channel region CH may be defined by the vertical insulating structure VIP.

The vertical insulating structure VIP may include, for example, at least one of a silicon oxide film, a silicon nitride film, a silicon oxynitride film, a carbon-containing silicon oxide film, a carbon-containing silicon nitride film and a carbon-containing silicon oxynitride film.

The information storage elements DS may include a first electrode EL1, a dielectric film DL, and a second electrode EL2, respectively. The first electrode EL1 may be spaced apart from the second electrode EL2. The dielectric film DL may be interposed between the first electrode EL1 and the second electrode EL2. Each information storage elements DS may be connected to the semiconductor patterns SP, respectively. The first electrode EL1 may be connected to each semiconductor pattern SP.

The information storage elements DS electrically connected to the semiconductor patterns SP stacked in the third direction D3 may share the single dielectric film DL and the single second electrode EL2. In other words, a plurality of first electrodes EL1 connected to each of the plurality of semiconductor patterns SP stacked in the third direction D3 may be disposed, and the single dielectric film DL may be formed along the surfaces of the plurality of first electrodes EL1. Also, the single second electrode EL2 may be disposed on the single dielectric film DL.

Each first electrode EL1 may be electrically connected to the second impurity region SD2 of each semiconductor pattern SP. Each first electrode EL1 may be disposed between the adjacent first mold insulating layers ILD1. Each first electrode EL1 may have a loop shape, and may have, for example, a closed-loop shape.

In the semiconductor memory device according to some embodiments, the information storage elements DS may penetrate the semiconductor patterns SP.

In FIGS. 4a and 4b, the first electrode EL1 may include an upper plate region EL11 and a lower plate region EL12 spaced apart from each other in the third direction D3, and a connecting region EL13 which connects the upper plate region EL11 and the lower plate region EL12.

The upper plate region EL11 of the first electrode and the lower plate region EL12 of the first electrode may be parallel to the upper surface of the substrate SUB. The connecting region EL13 of the first electrode may extend in a direction perpendicular to the upper surface of the substrate SUB.

In a plane view, each of the upper plate region EL11 of the first electrode, the lower plate region EL12 of the first electrode, and the connecting region EL13 of the first electrode may have a closed-loop shape.

The upper plate region EL11 of the first electrode may include a first surface EL11$u$ and a second surface EL11$b$ facing each other in the third direction D3. The lower plate region EL12 of the first electrode may include a third surface EL12$u$ and a fourth surface EL12$b$ facing each other in the third direction D3. The connecting region EL13 of the first electrode may include an outer wall EL13$o$ and an inner wall EL13$i$ facing each other.

The first electrode EL1 may be connected to the semiconductor pattern SP through the outer wall EL13$o$ of the connecting region EL13 of the first electrode. For example, the outer wall EL13$o$ of the connecting region EL13 of the first electrode may be connected to the second impurity region SD2.

In the semiconductor memory device according to some embodiments, the semiconductor pattern SP may be disposed along the entire periphery of the connecting region EL13 of the first electrode. In other words, the first electrode EL1 may penetrate the semiconductor pattern SP. Some of the semiconductor patterns SP may be disposed between the connecting region EL13 of the first electrode and the vertical insulating structure VIP.

The dielectric film DL may be disposed on the first electrode EL1. The dielectric film DL may extend along an inner wall EL13$i$ of the connecting region of the first electrode, a first surface EL11$u$ of the upper plate region of the first electrode, a second surface EL11$b$ of the upper plate region of the first electrode, a third surface EL12$u$ of the lower plate region of the first electrode, and a fourth surface EL12$b$ of the lower plate region of the first electrode.

The dielectric film DL includes a portion extending along the profile of the first electrode EL1, and a portion extending along the profile of the first mold insulating layer ILD1 between the adjacent first electrodes ELL The second electrode EL2 may be disposed on the dielectric film DL. The second electrode EL2 may penetrate the first electrodes EL1 stacked in the third direction D3. The second electrode EL2 may penetrate the upper plate region EL11 of the first electrode, the lower plate region EL12 of the first electrode, and the connecting region EL13 of the first electrode. The second electrode EL2 may have, for example, a pillar shape extending in the third direction D3. In other words, the first electrode EL1 may be disposed along the periphery of the second electrode EL2.

From viewpoint of a cross-sectional view, for example, the second electrode EL2 may have a fish-bone shape extending in the third direction D3.

The inner wall EL13$i$ of the connecting region of the first electrode, the first surface EL11$u$ of the upper plate region of the first electrode, the second surface EL11$b$ of the upper plate region of the first electrode, the third surface EL12$u$ of the lower plate region of the first electrode, and the fourth surface EL12$b$ of the lower plate region of the first electrode may be used as electrodes of a capacitor. Accordingly, an area between the first electrode EL1 and the second electrode EL2 facing each other may increase. As a result, the capacitance of the capacitor may be significantly increased within a small area in a plan view.

From the viewpoint of a cross-sectional view taken along the second direction D2, the shape of the information storage element DS may also be described as follows.

In FIGS. 3a and 4b, the first electrode EL1 may include a first sub-electrode region EL1$s$1 and a second sub-electrode region EL1$s$2. The first sub-electrode region EL1$s$1 and the second sub-electrode region EL1$s$2 may face each other with the second electrode EL2 interposed therebetween. The first sub-electrode region EL1$s$1 and the second sub-electrode region EL1$s$2 may each have a "U" shape.

The first sub-electrode region EL1$s$1 may include a first connecting part EL131$p$ extending in the third direction D3, a first_1 protruding part EL111$p$ protruding from one end of the first connecting part EL131$p$ in the second direction D2, and a first_2 protruding part EL121$p$ protruding from the other end of the first connecting part EL131$p$ in the second direction D2.

The second sub-electrode region EL1$s$2 may include a second connecting part EL132$p$ extending in the third direction D3, a second_1 protruding part EL112$p$ protruding from one end of the second connecting part EL132$p$ in the second direction D2, and a second_2 protruding part EL122$p$ protruding from the other end of the second connecting part EL132$p$ in the second direction D2.

The first connecting part EL131$p$ and the second connecting part EL132$p$ are included in the connecting region EL13 of the first electrode. The first_1 protruding part EL111$p$ and the second_1 protruding part EL112$p$ are included in the upper plate region EL11 of the first electrode. The first_2 protruding part EL121$p$ and the second_2 protruding part EL122$p$ are included in the lower plate region EL12 of the first electrode.

The first sub-electrode region EL1$s$1 may be closer to the bit line BL than the second sub-electrode region EL1$s$2. The first sub-electrode region EL1$s$1 and the second sub-electrode region EL1$s$2 may be connected to the semiconductor pattern SP. In the cross-sectional view, the first sub-electrode region EL1$s$1 may be connected to the bit line BL. However, the second sub-electrode region EL1$s$2 may be shown to be not connected to the bit line BL.

The dielectric film DL may extend along profiles of the first connecting part EL131$p$, the first_1 protruding part EL111$p$, and the first_2 protruding part EL121$p$. The dielectric film DL may extend along the profiles of the second connecting part EL132$p$, the second_1 protruding part EL112$p$, and the second_2 protruding part EL122$p$.

The second electrode EL2 may be disposed between the first sub-electrode region EL1$s$1 and the second sub-electrode region EL1$s$2 facing each other.

The first electrode EL1 and the second electrode EL2 may include, for example, but are not limited to, doped semiconductor materials, conductive metal nitrides (e.g., titanium nitride, tantalum nitride, niobium nitride, or tungsten nitride, etc.), metals (e.g., ruthenium, iridium, titanium or tantalum etc.), and conductive metal oxides (e.g., iridium oxide or niobium oxide). Here, the conductive metal nitride, the metal, and the conductive metal oxide may be included in the metallic conductive film.

The dielectric film DL may include, for example, a high dielectric constant material (e.g., hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, lead zinc niobate or a combination thereof). In the semiconductor memory device according to some embodiments, the dielectric film DL may include a stacked film structure in which zirconium oxide, aluminum oxide, and zirconium oxide are sequentially stacked. In the semiconductor memory device according to some embodiments, the dielectric film DL may include hafnium (Hf).

In FIGS. 2 and 4a, in a plan view, the connecting region EL13 of the first electrode may have a shape bulging toward the bit line BL at a portion facing the bit line BL.

Figure 5:
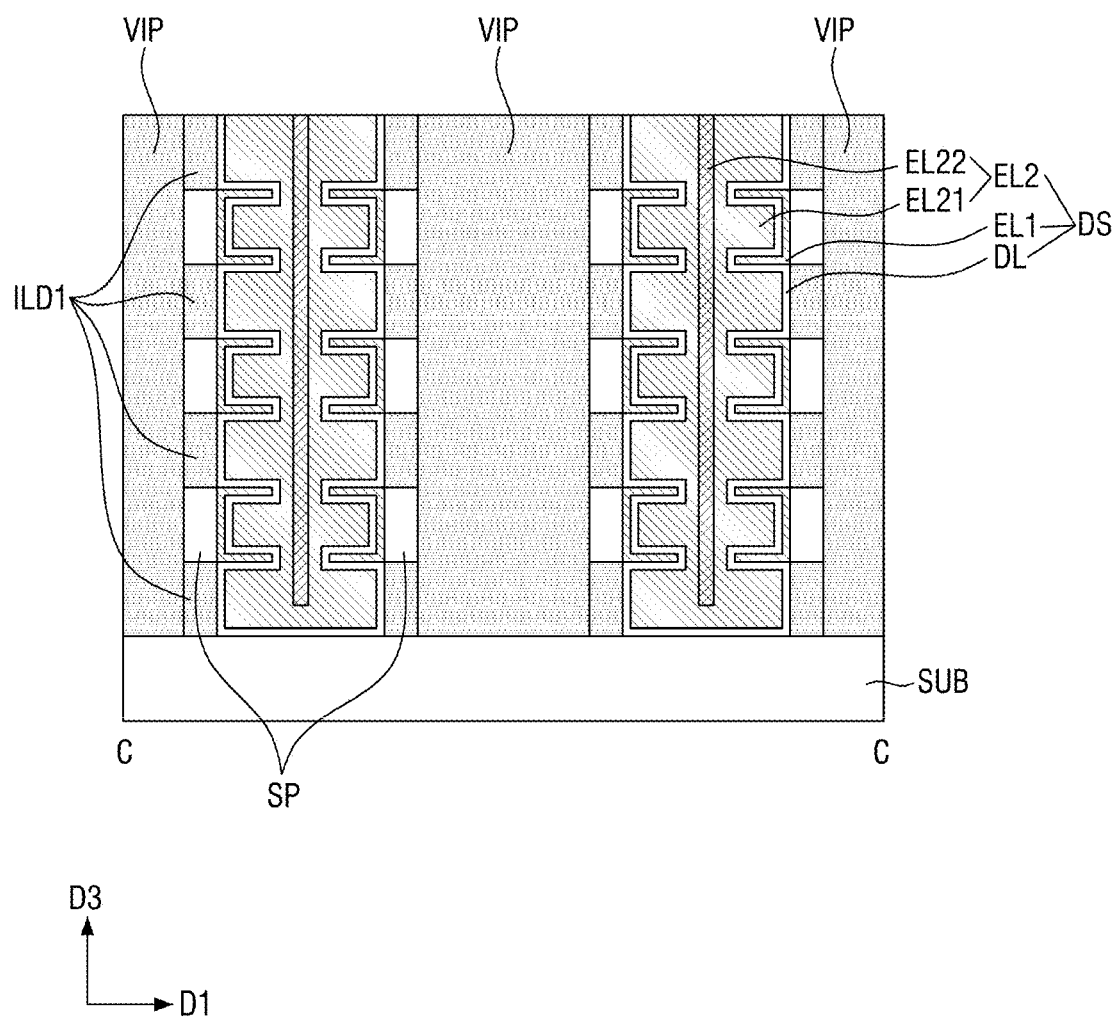
FIGS. 5 to 7 are diagrams for explaining the semiconductor memory device according to some embodiments.
Figure 6:
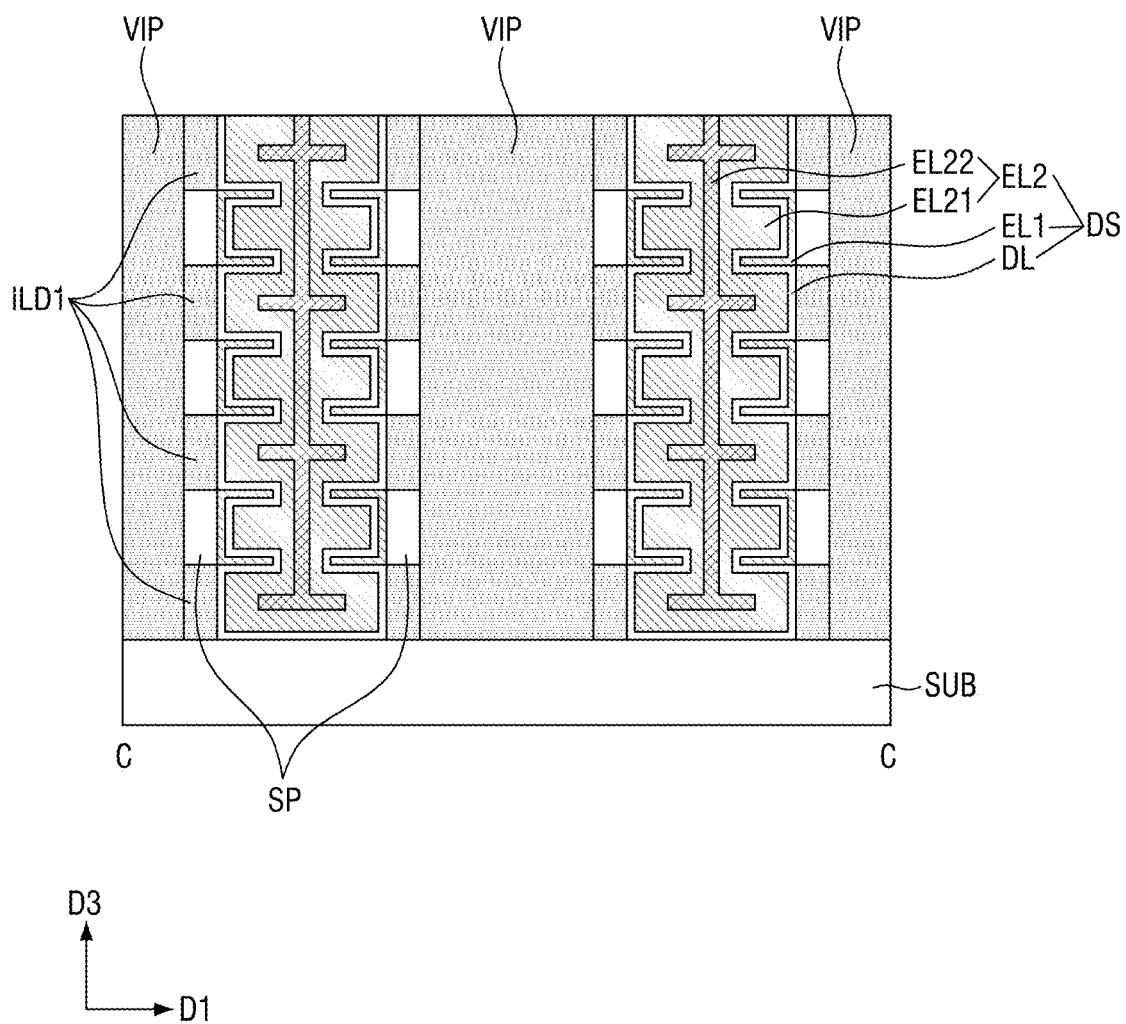
Figure 7:
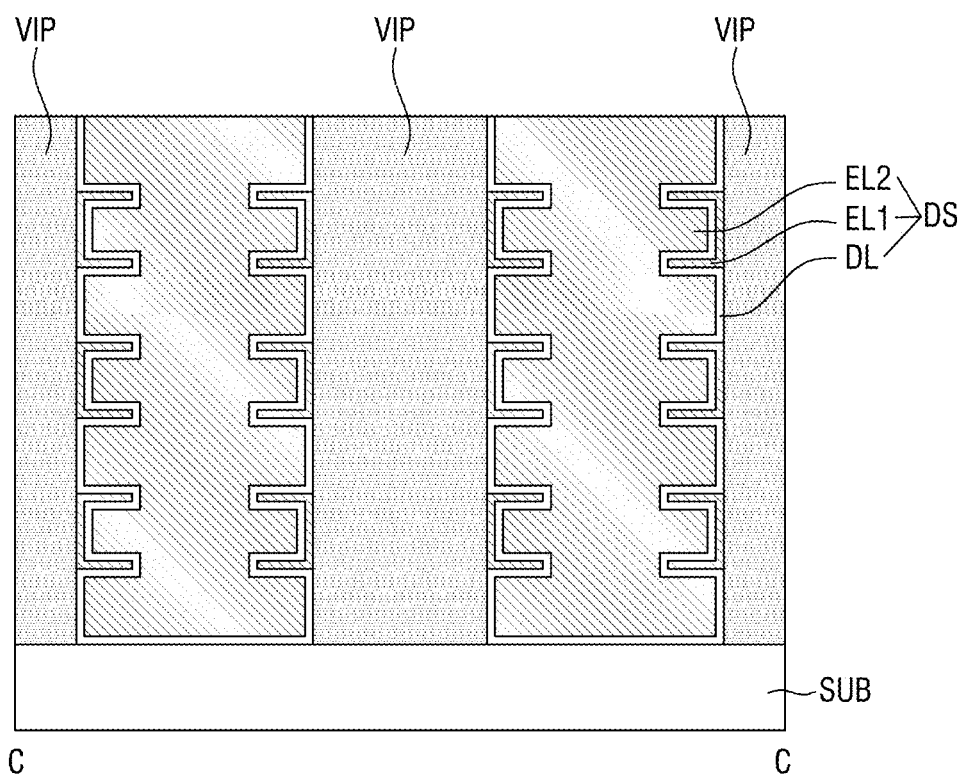
Figure 7:
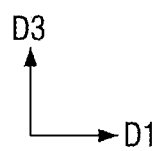

FIGS. 5 to 7 are diagrams showing the semiconductor memory device according to some embodiments. For convenience of explanation, differences from those explained using FIGS. 2 to 4b will be mainly explained.

Referring to FIGS. 5 and 6, in the semiconductor memory device according to some embodiments, the second electrode EL2 may include a second lower electrode EL21 and a second upper electrode EL22.

The second lower electrode EL21 may be disposed on the dielectric film DL. The second upper electrode EL22 may be disposed on the second lower electrode EL21. The second lower electrode EL21 may be interposed between the dielectric film DL and the second upper electrode EL22.

The second lower electrode EL21 may include, for example, at least one of a conductive metal nitride (e.g., titanium nitride, tantalum nitride, niobium nitride or tungsten nitride, etc.), a metal (e.g., ruthenium, iridium, titanium or tantalum, etc.), and a conductive metal oxide (e.g., iridium oxide or niobium oxide, etc.). The second upper electrode EL22 may include, for example, a doped semiconductor material.

In FIG. 5, the second upper electrode EL22 may have a pillar shape extending long in the third direction D3. The second upper electrode EL22 may not include a portion protruding in the direction parallel to the upper surface of the substrate SUB.

In FIG. 6, the second upper electrode EL22 may include a pillar part extending in the third direction D3, and a protruding part protruding in a direction parallel to the upper surface of the substrate SUB. In the cross-sectional view, the second upper electrode EL22 may have a fish-bone shape extending in the third direction D3.

Referring to FIGS. 2, 4a, and 7, in the semiconductor memory device according to some embodiments, the first electrode EL1 may be in contact with the vertical insulating structure VIP.

The semiconductor pattern SP may not be disposed along a part of the periphery of the connecting region EL13 of the first electrode. The semiconductor pattern (SP of FIG. 2) may not cover a part of the outer wall EL13o of the connecting region EL13 of the first electrode.

Although the dielectric film DL between the first electrodes EL1 adjacent to each other in the third direction D3 is shown as extending along the side wall of the vertical insulating structure VIP, it is not limited thereto. During the fabricating process, depending on the degree of recess of the first mold insulating layer (ILD1 of FIG. 3c), the first mold insulating layer ILD1 may, of course, be interposed between the first electrodes EL1 adjacent to each other in the third direction D3.

Figure 8:
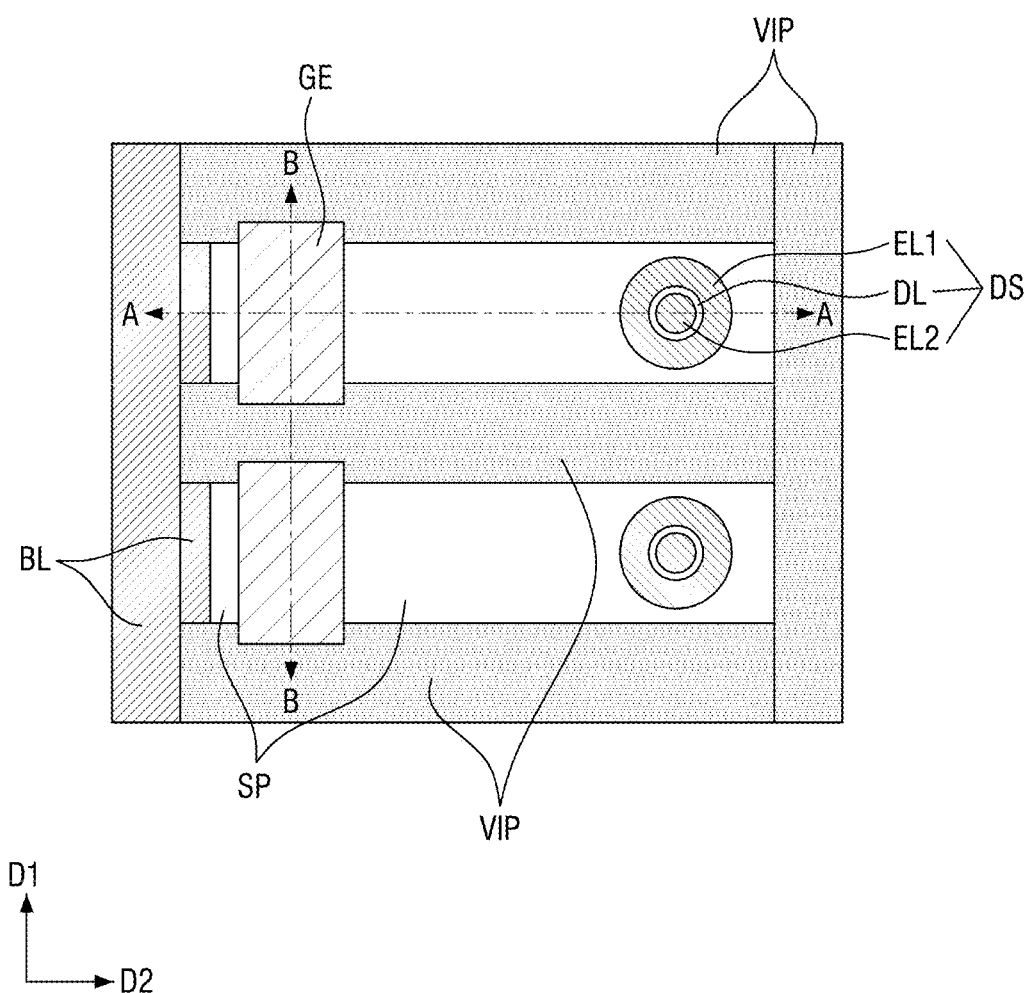
FIGS. 8 to 9b are diagrams for explaining the semiconductor memory device according to some embodiments.
Figure 9A:
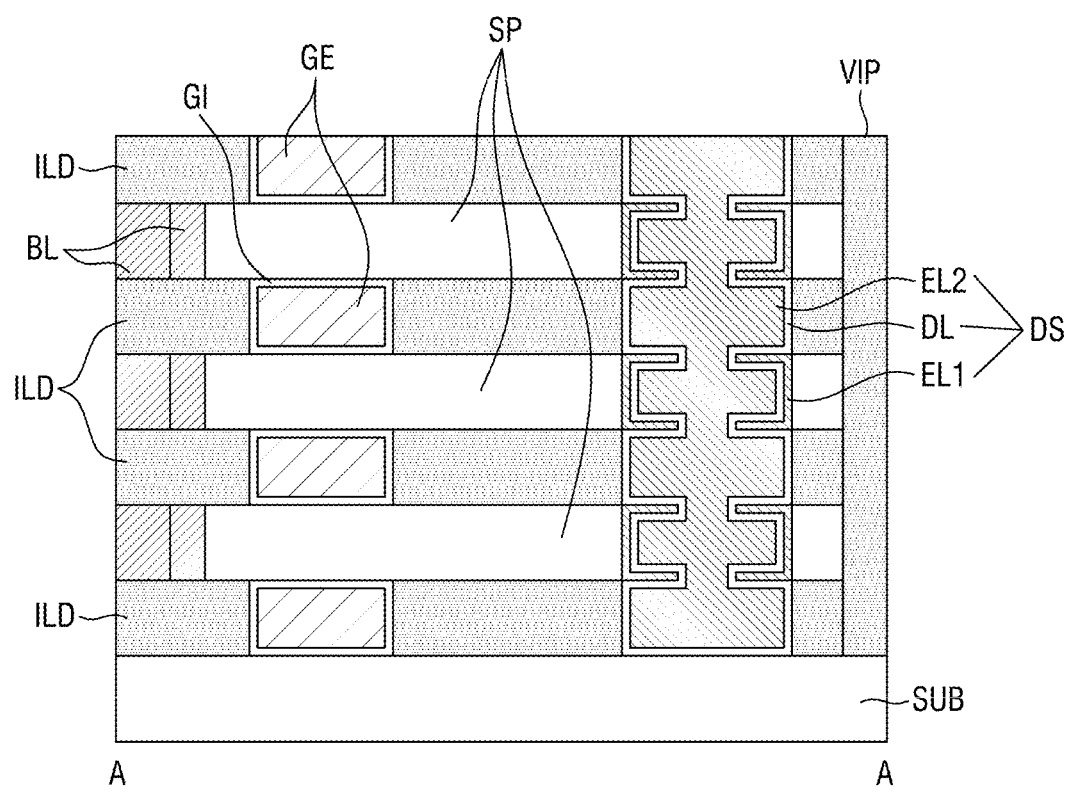
Figure 9A:
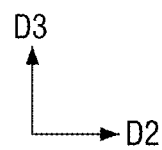
Figure 9B:
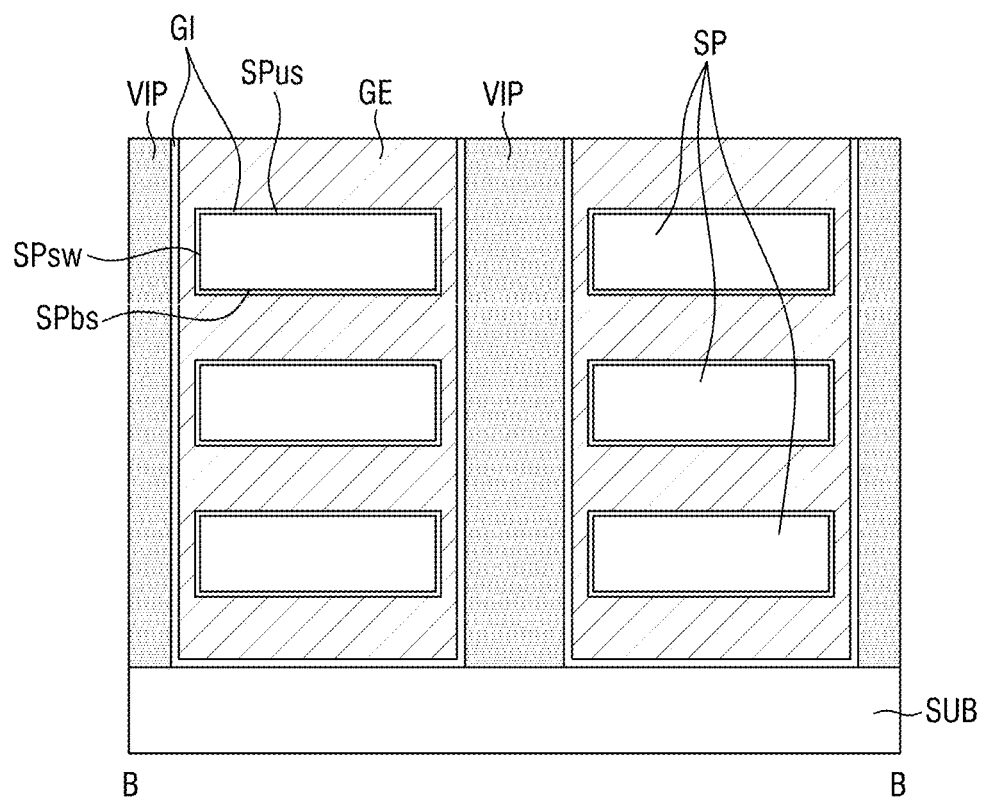

FIGS. 8 to 9b are diagrams for explaining the semiconductor memory device according to some embodiments. FIG. 8 is a plan view. FIGS. 9a and 9b are cross-sectional views taken along lines A-A and B-B of FIG. 8, respectively. For convenience of explanation, differences from those explained using FIGS. 2 to 4b will be mainly explained.

Referring to FIGS. 8 to 9b, in the semiconductor memory device according to some embodiments, a gate electrode GE may surround the periphery of the semiconductor pattern SP.

The gate electrode GE may surround the side wall SPsw of the semiconductor pattern, the upper surface SPus of the semiconductor pattern, and the lower surface SPbs of the semiconductor pattern. For example, the semiconductor memory device according to some embodiments may include a transistor having a gate-all-around structure.

The gate insulating film GI may extend along the side wall SPsw of the semiconductor pattern, the upper surface SPus of the semiconductor pattern, and the lower surface SPbs of the semiconductor pattern. Further, the gate insulating film GI may extend along the upper surface of the substrate SUB.

Although the gate insulating film GI is shown as extending along the side wall of the vertical insulating structure VIP, it is not limited thereto. Depending on the step of forming the gate electrode GE and the step of forming the vertical insulating structure VIP, there may be no gate insulating film GI on the side wall of the vertical insulating structure VIP.

Figure 10:
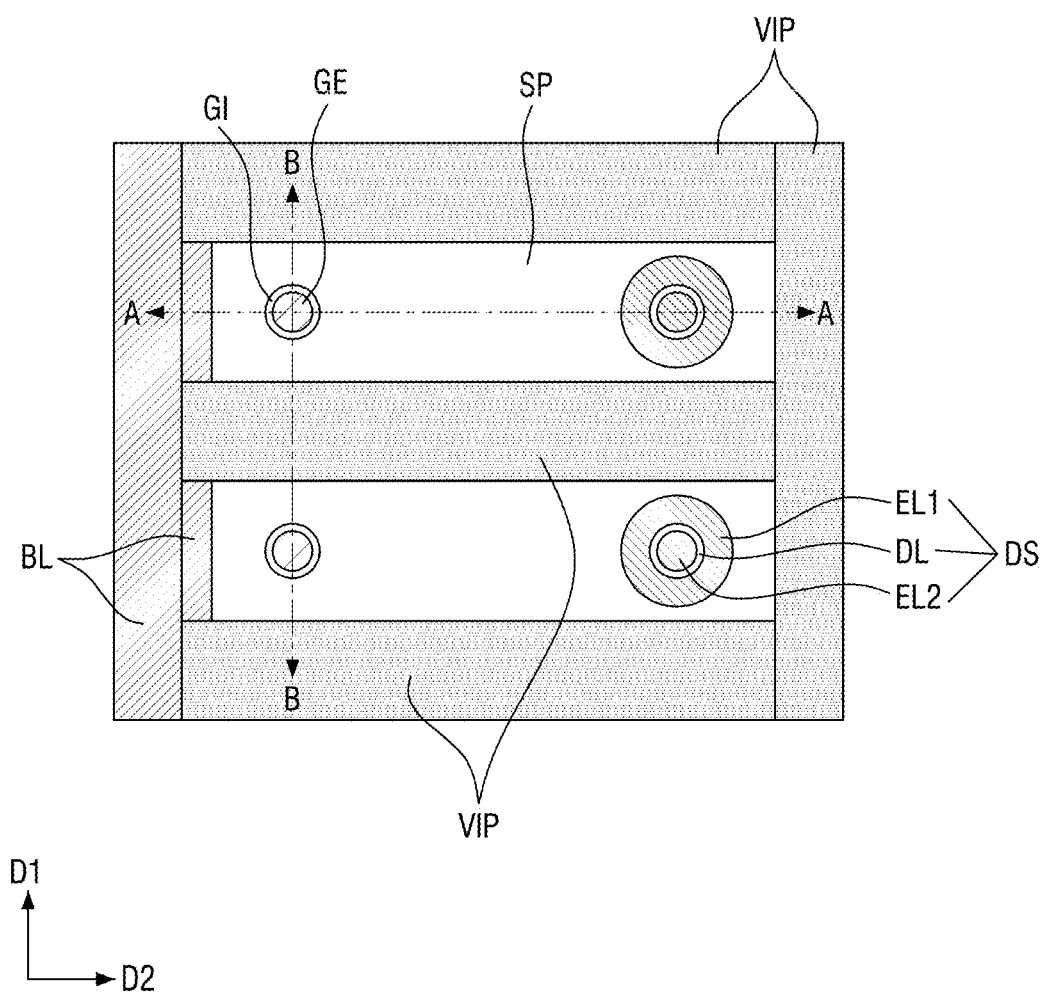
FIGS. 10 to 11b are diagrams for explaining the semiconductor memory device according to some embodiments.
Figure 11A:
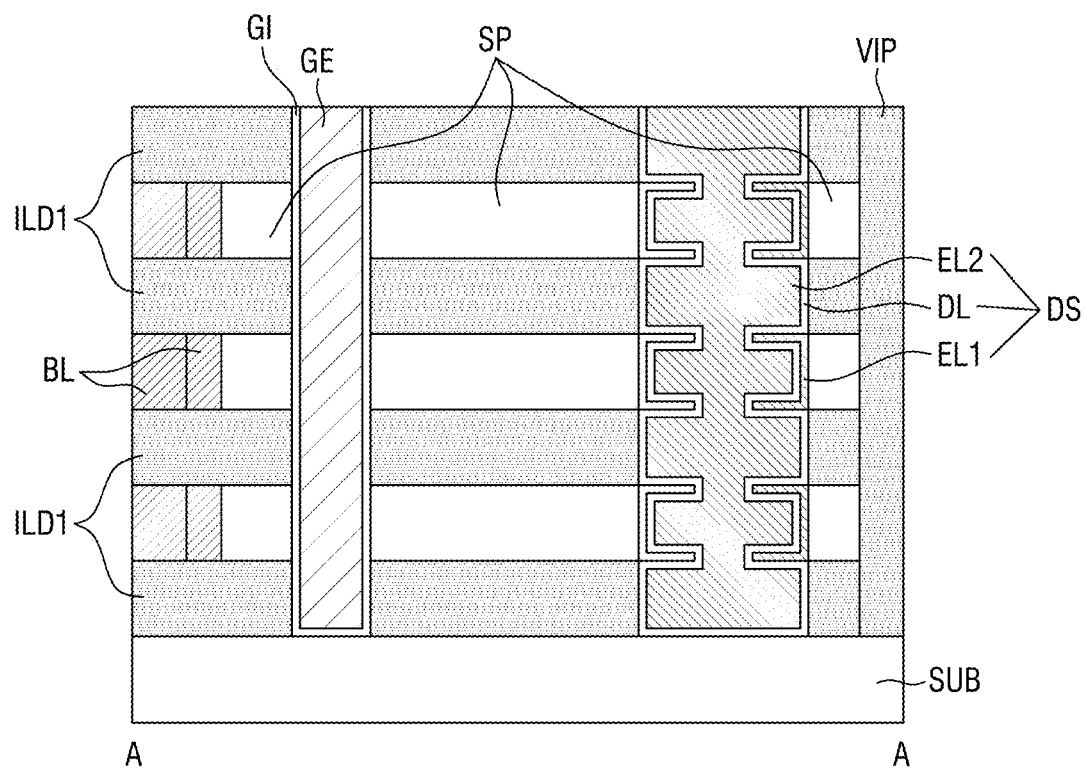
Figure 11A:
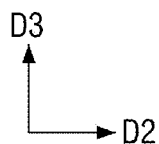
Figure 11B:
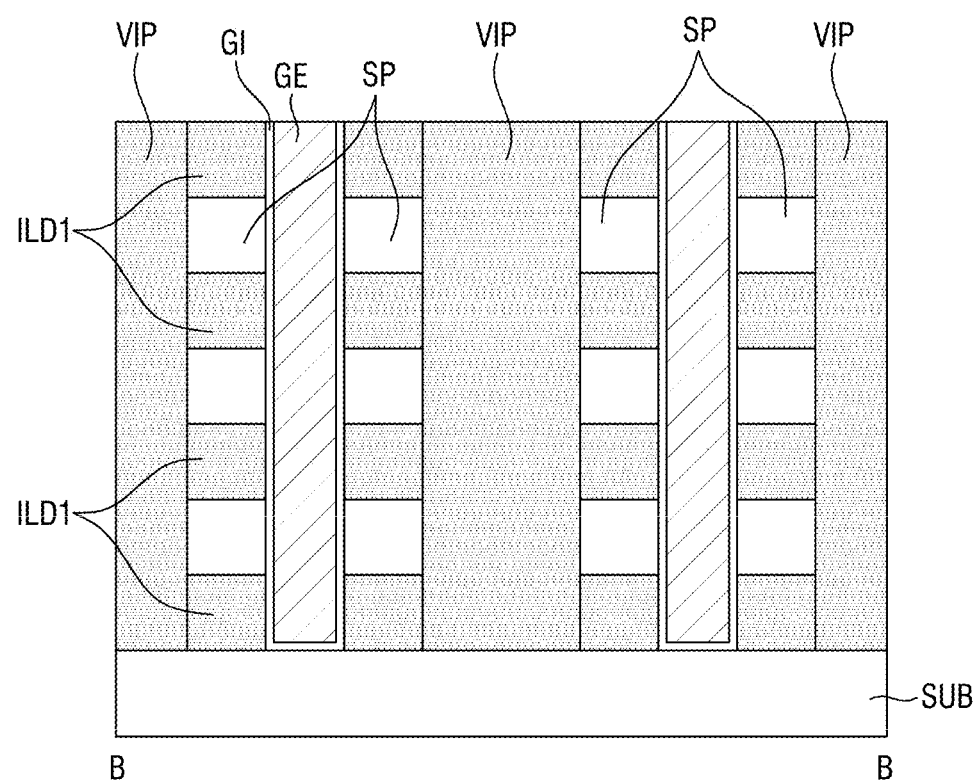
Figure 11B:
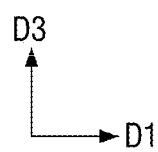

FIGS. 10 to 11b are diagrams for explaining the semiconductor memory device according to some embodiments. FIG. 10 is a plan view. FIGS. 11a and 11b are cross-sectional views taken along lines A-A and B-B of FIG. 10, respectively. For convenience of explanation, differences from those explained using FIGS. 2 to 4b will be mainly explained.

Referring to FIGS. 10 to 11b, in the semiconductor memory device according to some embodiments, a gate electrode GE may penetrate the semiconductor pattern SP.

In the plan view, the gate electrode GE may be surrounded by the semiconductor pattern SP. Further, the gate electrode GE may also penetrate the first mold insulating layer ILD1.

Like the gate electrode GE, the gate insulating film GI may also penetrate the semiconductor pattern SP.

Figure 12:
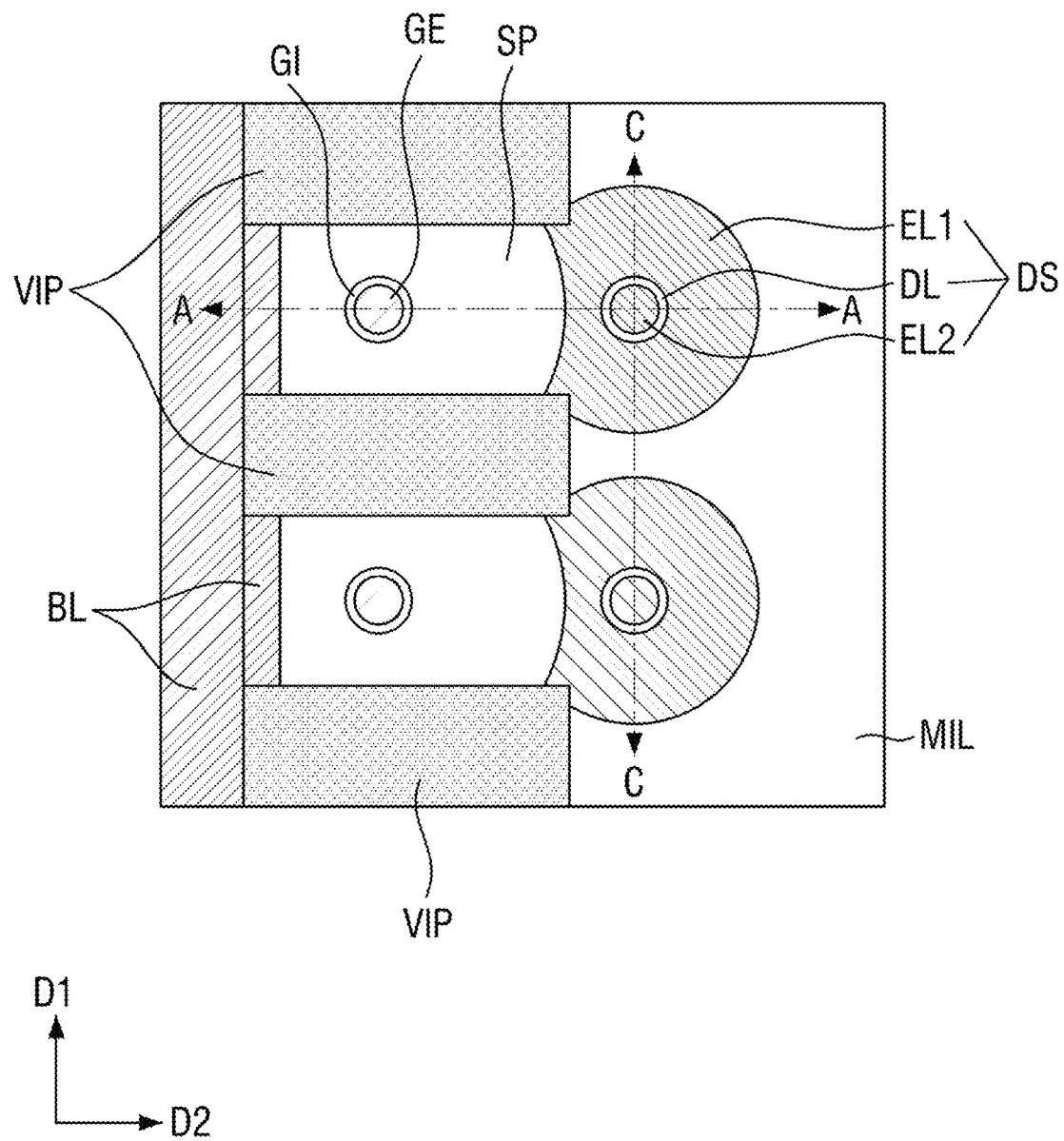
FIGS. 12 to 13b are diagrams for explaining the semiconductor memory device according to some embodiments.
Figure 13A:
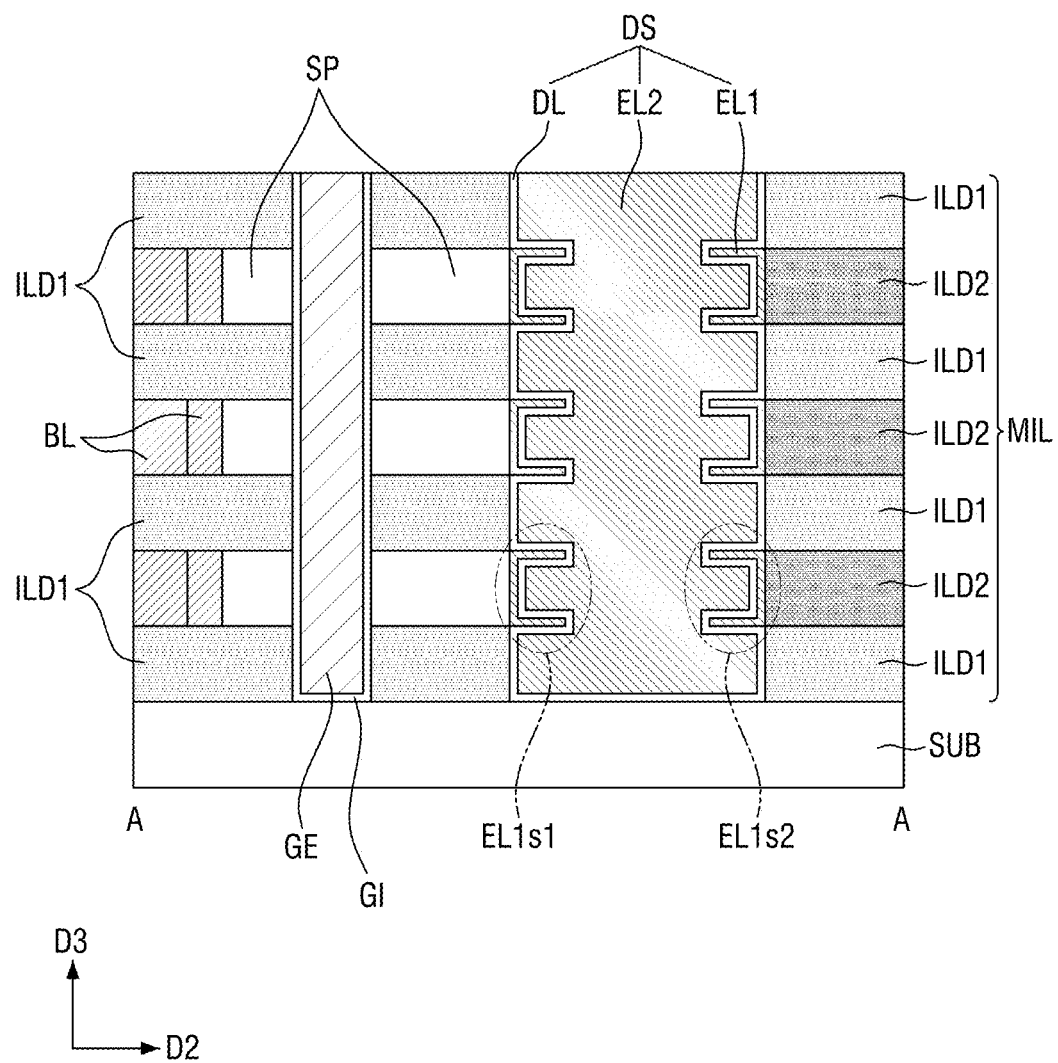
Figure 13B:
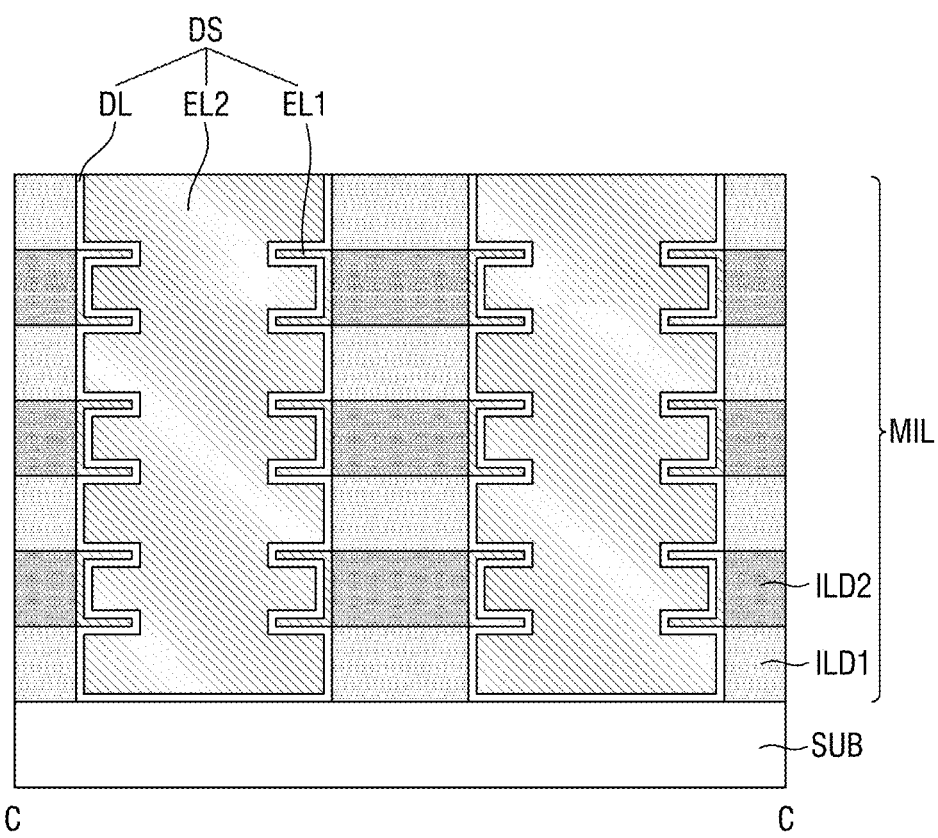
Figure 13B:
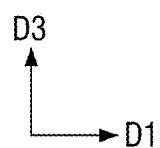

FIGS. 12 to 13b are diagrams for explaining the semiconductor memory device according to some embodiments. FIG. 12 is a plan view. FIGS. 13a and 13b are cross-sectional views taken along lines A-A and C-C of FIG. 12, respectively. For convenience of explanation, differences from those explained using FIGS. 2 to 4b will be mainly explained.

Referring to FIGS. 4a, 4b, 12 and 13b, in the semiconductor memory device according to some embodiments, the information storage element DS may be formed in the mold structure MIL.

The mold structure MIL may be disposed on the substrate SUB. The mold structure MIL may include a first mold insulating layer ILD1 and a second insulating mold layer ILD2. The mold structure MIL may include the first mold insulating layer ILD1 and the second insulating mold layer ILD2 alternately stacked on the substrate SUB. Although FIGS. 13a and 13b show that the number of the first mold insulating layers ILD1 is four and the number of the second insulating mold layers ILD2 is three, this is only for convenience of explanation, and inventive concepts are not limited thereto. Further, although the mold structure MIL directly adjacent to the substrate SUB is shown to be the first mold insulating layer ILD1, inventive concepts are not limited thereto.

The first insulating material included in the first mold insulating layer ILD1 may have an etching selectivity with respect to the second insulating material included in the second insulating mold layer ILD2. The second insulating mold layer ILD2 may include, for example, at least one of a silicon oxide film, a silicon nitride film, a silicon oxynitride film, a carbon-containing silicon oxide film, a carbon-containing silicon nitride film, and a carbon-containing silicon oxynitride film. As an example, the first mold insulating layer ILD1 may include a silicon oxide film, and the second insulating mold layer ILD2 may include a silicon nitride film. For example, the mold structure MIL may be an ON (oxide/nitride) mold structure.

The first electrode EL1 may be formed in the mold structure MIL. Therefore, a part of the first electrode EL1 may be in contact with the mold structure MIL. For example, a part of the connecting region EL13 of the first electrode may be surrounded by the semiconductor pattern SP. The remaining part of the connecting region EL of the first electrode may be surrounded by the mold structure MIL, for example, the second mold insulating layer ILD2. In other words, a part of the outer wall EL13o of the connecting region of the first electrode may be covered by the semiconductor pattern SP. The remaining part of the outer wall EL13o of the connecting region of the first electrode may be covered by the mold structure MIL.

From the viewpoint of a cross-sectional view taken along the second direction D2, the first sub-electrode region EL1s1 may be connected to the semiconductor pattern SP. However, since the second sub-electrode region EL1s2 is in contact with the mold structure MIL, the second sub-electrode region EL1s2 is not connected to the semiconductor pattern SP. In other words, the first connecting part EL131p of the first sub-electrode region EL1s1 is connected to the semiconductor pattern SP, but the second connecting part EL132p of the second sub-electrode region EL1s2 is in contact with the mold structure MIL.

In FIG. 12, the connecting region EL13 of the first electrode may have a shape bulging toward the second electrode EL2 at a portion facing the bit line BL in a plan view.

Figure 14A:
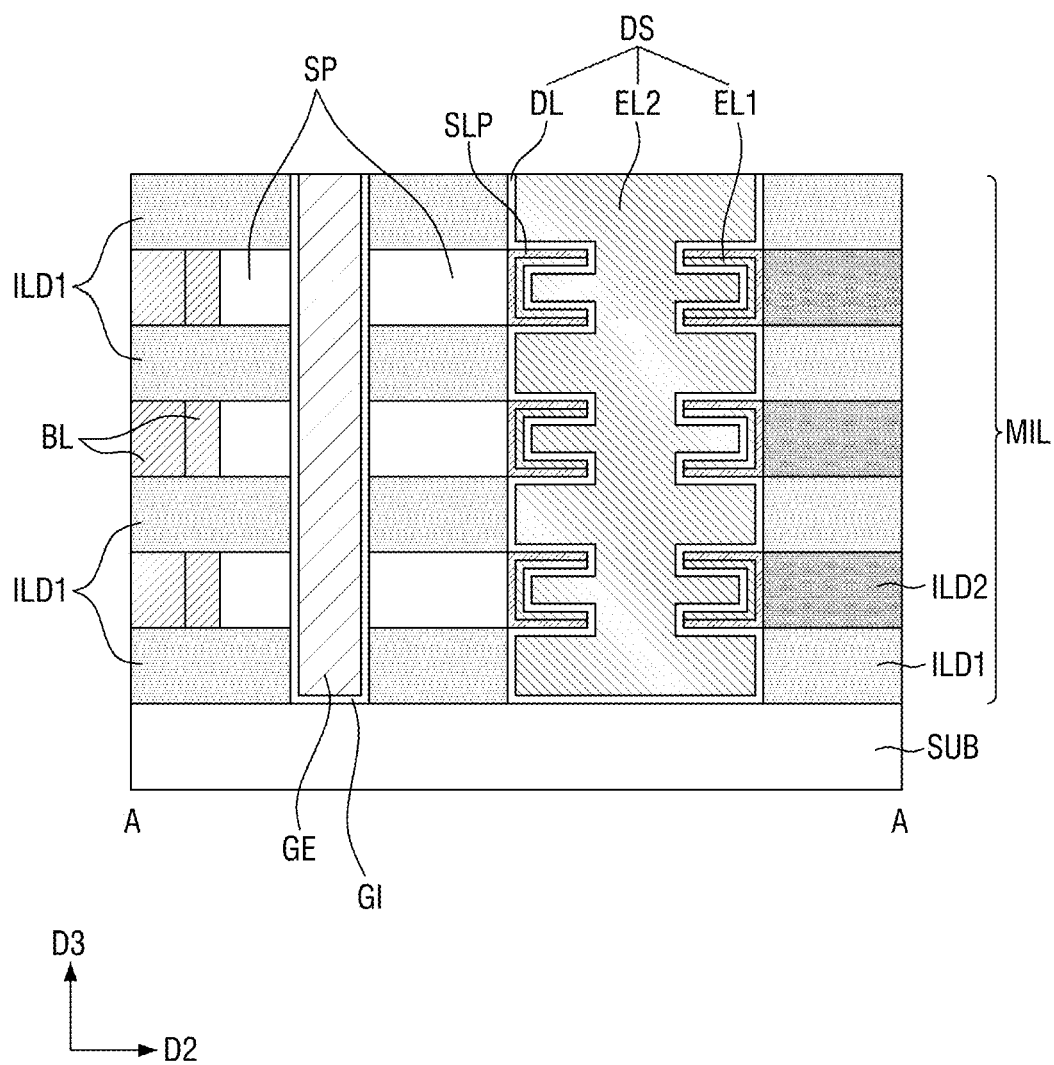
FIGS. 14a and 14b are diagrams for explaining the semiconductor memory device according to some embodiments.
Figure 14B:
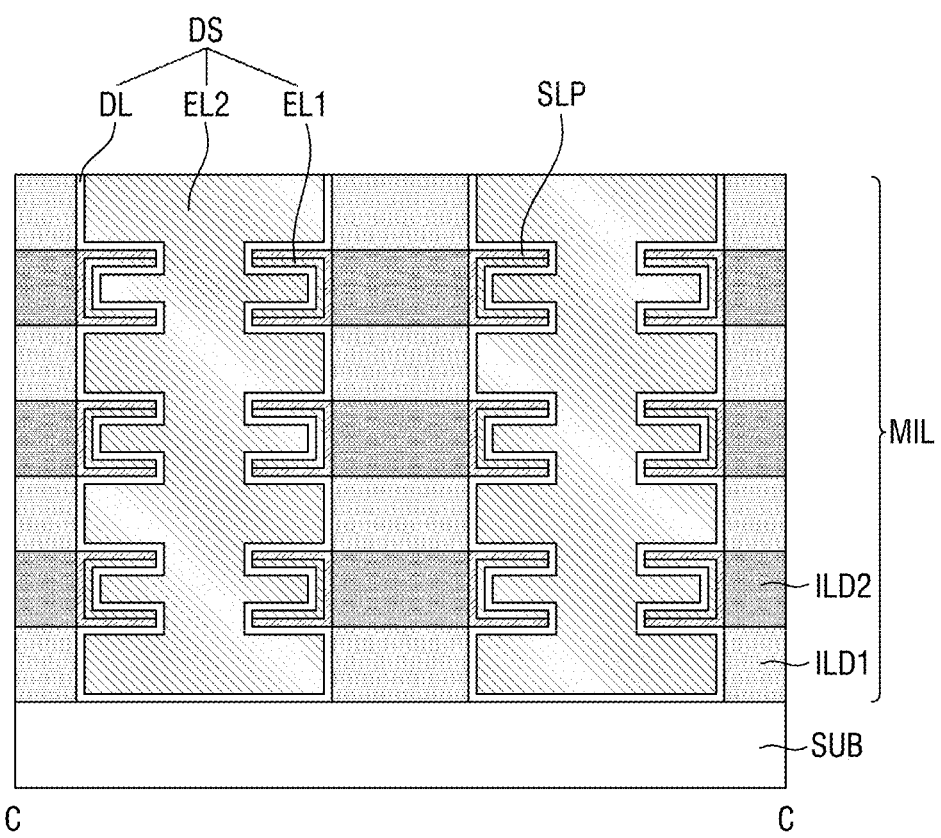
Figure 14B:
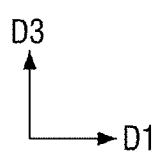

FIGS. 14a and 14b are diagrams for explaining the semiconductor memory device according to some embodiments. For convenience of explanation, differences from those explained using FIGS. 12 to 13b will be mainly explained.

For reference, FIGS. 14a and 14b may be cross-sectional views taken along lines A-A and C-C of FIG. 12, respectively.

Referring to FIGS. 4a, 4b, 14a, and 14b, the semiconductor memory device according to some embodiments may further include a semiconductor liner SLP.

The semiconductor liner SLP may be disposed between the first electrode EL1 and the semiconductor pattern SP, and between the first electrode EL1 and the mold structure MIL. The semiconductor liner SLP may extend along the outer wall EL13o of the connecting region of the first electrode, a first surface EL11u of the upper plate region of the first electrode, and a fourth surface EL12b of the lower plate region of the first electrode. In the fabricating process, the semiconductor liner SLP may be formed earlier than the first electrode ELL From the viewpoint of a cross-sectional view taken along the second direction D2, the semiconductor liner SLP may extend along the profiles of the first sub-electrode region EL1s1 and the second sub-electrode region EL1s2. The first sub-electrode region EL1s1 and the second sub-electrode region EL1s2 may be disposed between the semiconductor liner SLP and the dielectric film DL, respectively.

The semiconductor liner SLP may include, for example, a semiconductor material. In order to reduce the contact resistance between the first electrode EL1 and the semiconductor pattern SP, the semiconductor liner SLP may include a doped impurity. The semiconductor liner SLP may also serve as the first electrode EL1 of the information storage element DS.

Figure 15:
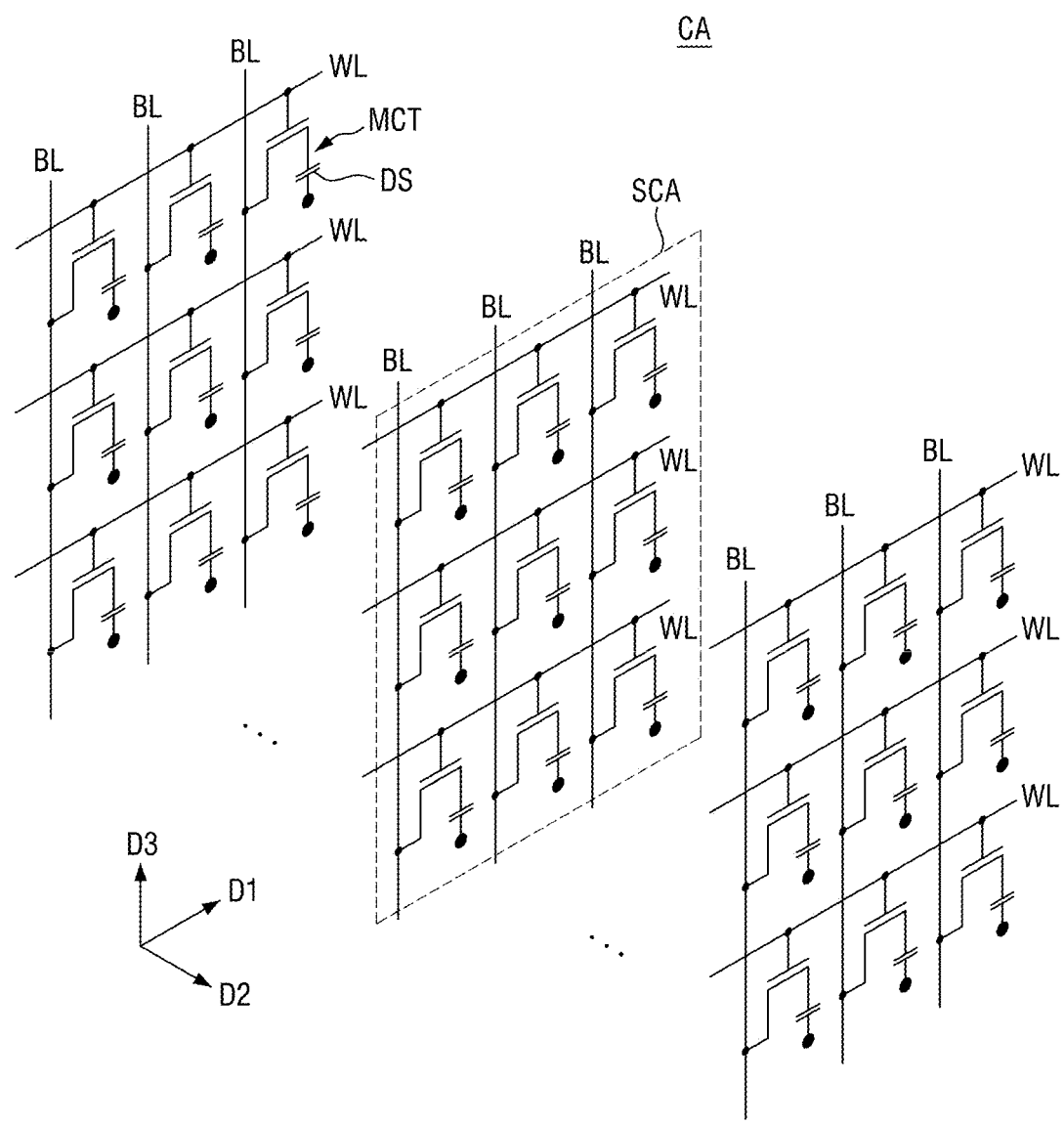
FIG. 15 is a schematic circuit diagram showing a cell array of a three-dimensional semiconductor memory device according to some embodiments.

FIG. 15 is a schematic circuit diagram showing a cell array of a three-dimensional semiconductor memory device according to some embodiments. For convenience of explanation, differences from those explained using FIG. 1 will be mainly explained.

The bit lines BL may be conductive patterns (e.g., metal lines) extending in a direction perpendicular to the substrate (e.g., in the third direction D3). The bit lines BL in a single sub-cell array SCA may be arranged in the first direction D1. The bit lines BL adjacent to each other may be spaced apart from each other in the first direction D1.

The word lines WL may be conductive patterns (e.g., metal lines) stacked on the substrate in the third direction D3. Each word line WL may extend in the first direction D1. The word lines WL adjacent to each other may be spaced apart from each other in the third direction D3.

The semiconductor memory device explained using FIGS. 16 to 23 may have a cell array circuit diagram as shown in FIG. 15.

Figure 16:
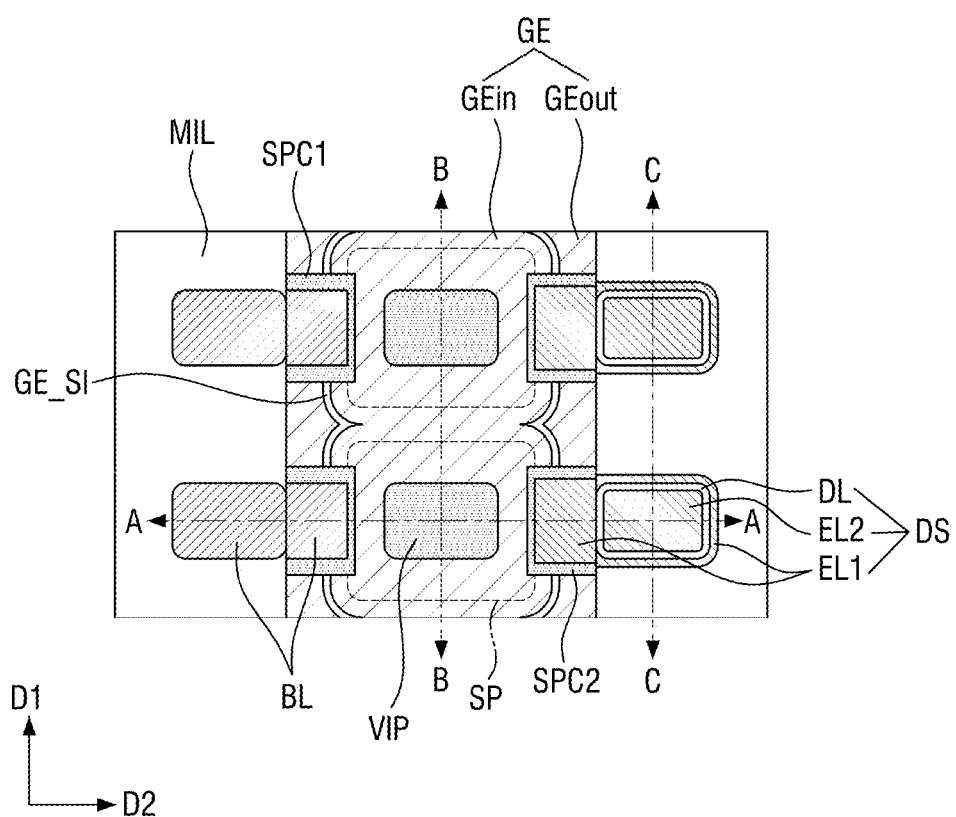
FIGS. 16 to 17c are diagrams for explaining the semiconductor memory device according to some embodiments.
Figure 17A:
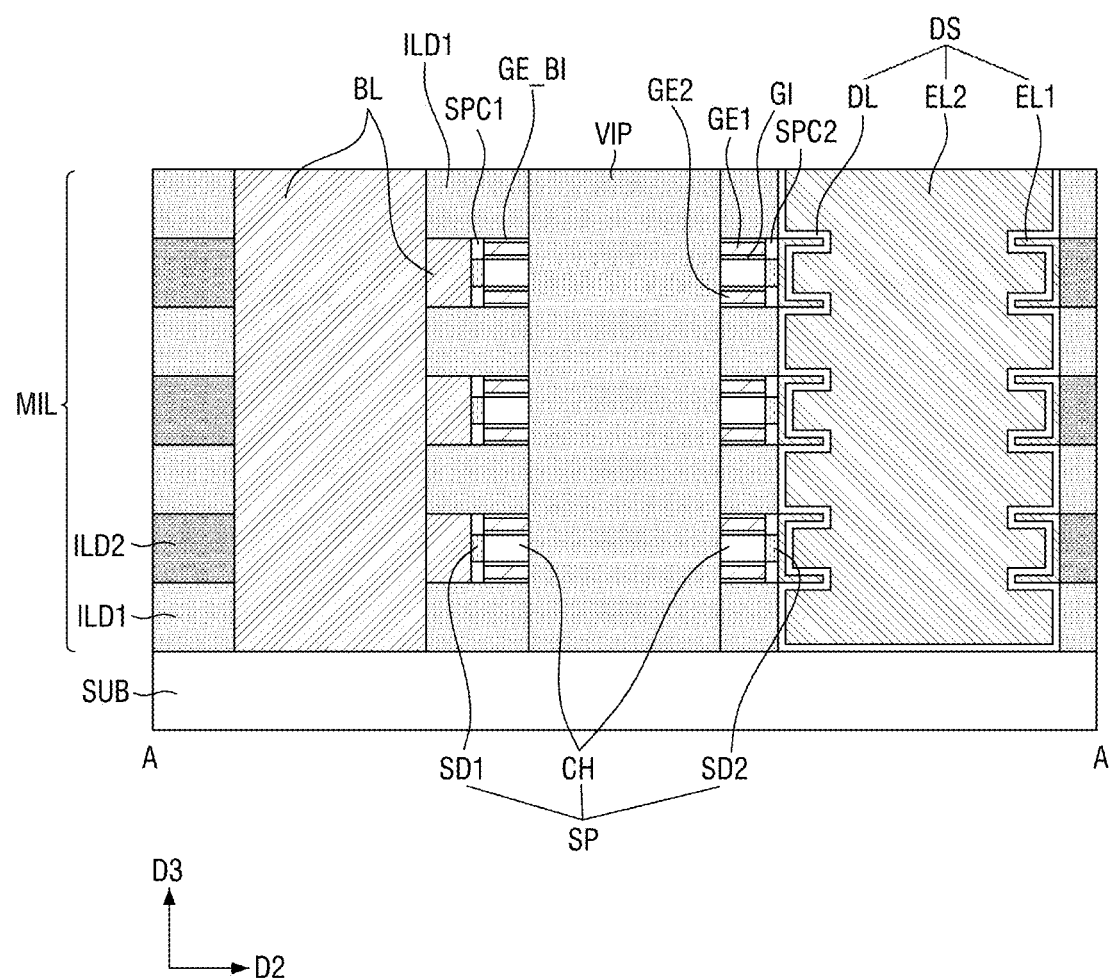
Figure 17B:
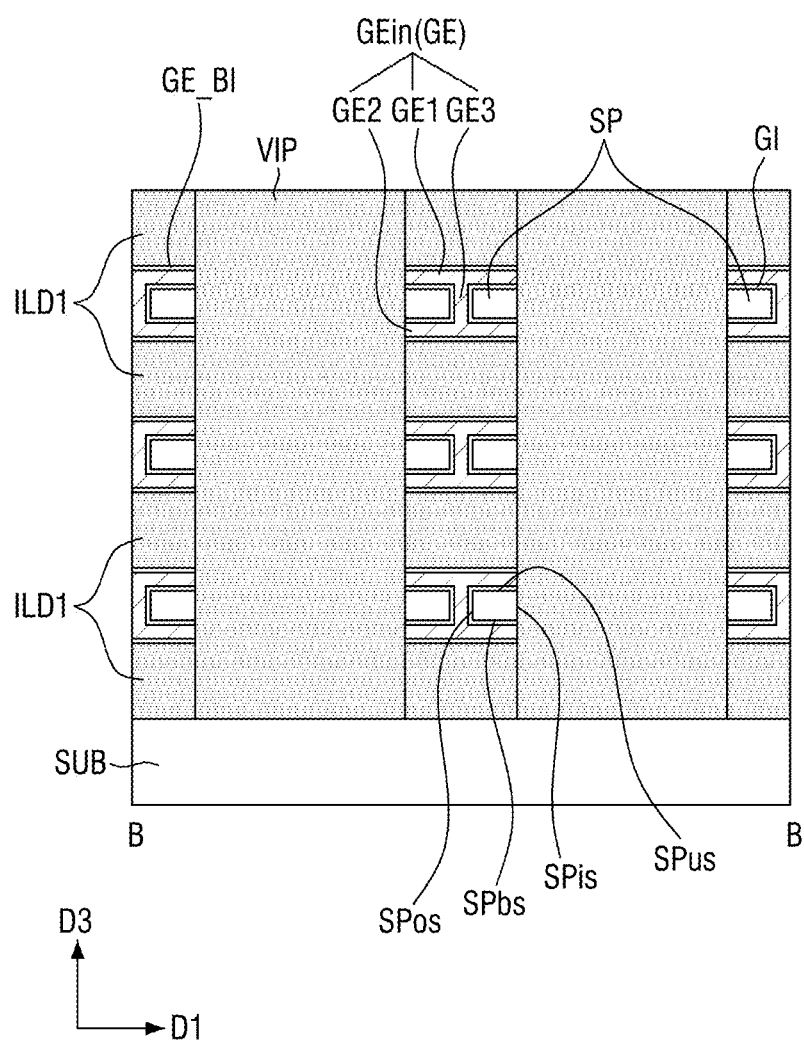
Figure 17C:
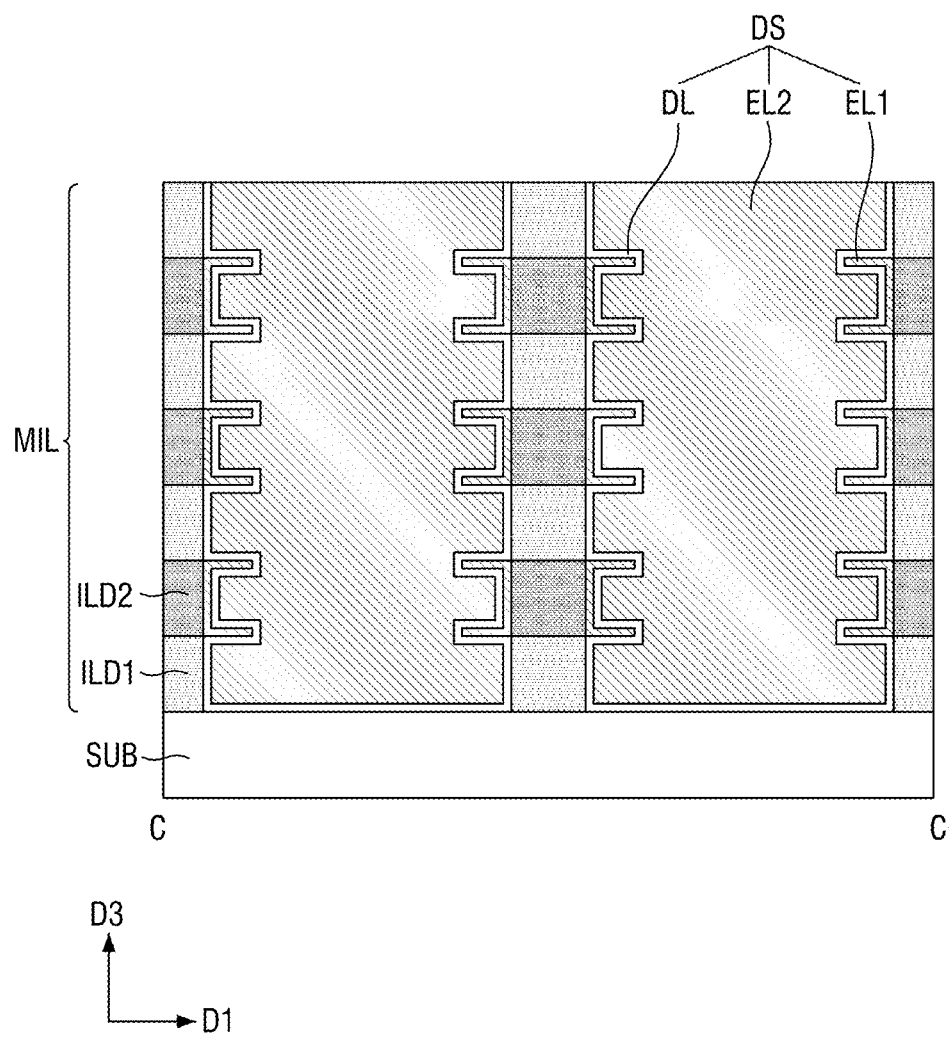

FIGS. 16 to 17c are diagrams showing a semiconductor memory device according to some embodiments. FIG. 16 is a plan view. FIGS. 17a to 17c are cross-sectional views taken along lines A-A, B-B, and C-C of FIG. 16, respectively. For convenience of explanation, differences from those explained using FIGS. 2 to 14b will be mainly explained.

Referring to FIGS. 4a, 4b, and 16 to 17c, in the semiconductor memory device according to some embodiments, semiconductor patterns SP may have a loop shape, for example, a closed-loop shape.

Each semiconductor pattern SP may include an outer wall SPos and an inner wall SPis which connect the upper surface SPus of the semiconductor pattern and the lower surface SPbs of the semiconductor pattern. In each of the semiconductor patterns SP, a first impurity region SD1 and a second impurity region SD2 may be formed at positions facing each other in the second direction D2.

Each gate electrode GE may include an upper gate electrode GE1 on the upper surface SPus of the semiconductor pattern, and a lower gate electrode GE2 on the lower surface SPbs of the semiconductor pattern. Each gate electrode GE may include a plurality of connection gate electrodes GE3 which connects the upper gate electrode GE1 and the lower gate electrode GE2. Like the semiconductor patterns SP, the gate electrodes GE adjacent to each other in the third direction D3 may be disposed between the first mold insulating layers ILD1 adjacent to each other. Each gate electrode GE may constitute a single word line (WL of FIG. 15).

The upper gate electrode GE1 and the lower gate electrode GE2 may be spaced apart from each other in the third direction D3 with the semiconductor pattern SP interposed therebetween. The upper gate electrode GE1 and the lower gate electrode GE2 may extend in the first direction D1 alongside each other.

The semiconductor patterns SP may be disposed between the connection gate electrodes GE3 adjacent to each other in the first direction D1. The connection gate electrode GE3 may separate the semiconductor patterns SP adjacent to each other in the first direction D1. The connection gate electrode GE3 may be disposed between the outer walls SPos of the semiconductor patterns adjacent to each other in the first direction D1. In the semiconductor memory device according to some embodiments, each gate electrode GE is not disposed on the inner wall SPis of the semiconductor pattern.

Each gate electrode GE may include an inner gate electrode GEin extending in the first direction D1, and an outer gate electrode GEout extending along a part of the inner gate electrode GEin. The outer gate electrode GEout may be electrically insulated from the inner gate electrode GEin. The insertion insulating film GE_SI may be disposed between the inner gate electrode GEin and the outer gate electrode GEout. The outer gate electrode GEout and the inner gate electrode GEin may be electrically insulated from each other by the insertion insulating film GE_SI.

The inner gate electrode GEin includes the upper gate electrode GE1, the lower gate electrode GE2, and the connection gate electrode GE3. For example, the outer gate electrode GEout may be disposed on the side wall of the connection gate electrode GE3. The insertion insulating film GE_SI may be disposed between the connection gate electrode GE3 and the outer gate electrode GEout. The inner gate electrode GEin may be a normal gate electrode. The outer gate electrode GEout may be a dummy gate electrode that does not function as a word line.

A blocking insulating film GE_BI may be disposed between the upper gate electrode GE1 and the first mold insulating layer ILD1, and between the lower gate electrode GE2 and the first mold insulating layer ILD1. From the viewpoint of the fabricating process, the blocking insulating film GE_BI may include the same material as the insertion insulating film GE_SI.

Unlike the shown case, the block insulating film GE_BI and the insertion insulating film GE_SI may be omitted. In such a case, the inner gate electrode GEin and the outer gate electrode GEout may be electrically connected to each other.

The gate insulating film GI may extend along the upper surface SPus of the semiconductor pattern, the lower surface SPbs of the semiconductor pattern, and the outer wall SPos of the semiconductor pattern. The gate insulating film GI is not disposed on the inner wall SPis of the semiconductor pattern.

The plurality of vertical insulating structures VIP may be arranged along the first direction D1. Each vertical insulating structure VIP may extend long in the third direction D3. The vertical insulating structure VIP may have a pillar shape. The vertical insulating structure VIP may penetrate the semiconductor patterns SP arranged in the third direction D3. In other words, the semiconductor patterns SP arranged in the third direction D3 may be disposed along the periphery of the vertical insulating structure VIP. The inner wall SPis of the semiconductor pattern may face the vertical insulating structure VIP. For example, a vertical insulating structure VIP may be in contact with the inner wall SPis of the semiconductor pattern.

The vertical insulating structure VIP may penetrate the gate electrode GE. The vertical insulating structure VIP may intersect the gate electrode GE. The vertical insulating structure VIP may penetrate the lower gate electrode GE2 and the upper gate electrode GE1.

The plurality of bit lines BL may be arranged along the first direction D1. Each bit line BL may extend in the third direction D3 perpendicular to the upper surface of the substrate SUB. The bit line BL may be connected to the first impurity region SD1 of the semiconductor pattern SP. A first spacer SPC1 may be interposed between the bit line BL and the gate electrode GE. The first spacer SPC1 may insulate the bit line BL and the gate electrode GE.

The first electrode EL1 may be formed in the mold structure MIL. A part of the first electrode EL1 may be in contact with the mold structure MIL. For example, a part of the connecting region EL13 of the first electrode may be surrounded by the semiconductor pattern SP. The remaining part of the connecting region EL of the first electrode may be surrounded by the mold structure MIL, for example, the second mold insulating layer ILD2. In other words, a part of the outer wall EL13o of the connecting region of the first electrode may be covered by the semiconductor pattern SP. The remaining part of the outer wall EL13o of the connecting region of the first electrode may be covered by the mold structure MIL.

A second spacer SPC2 may be interposed between the first electrode EL1 and the gate electrode GE. The second spacer SPC2 may insulate the first electrode EL1 and the gate electrode GE.

Figure 18:
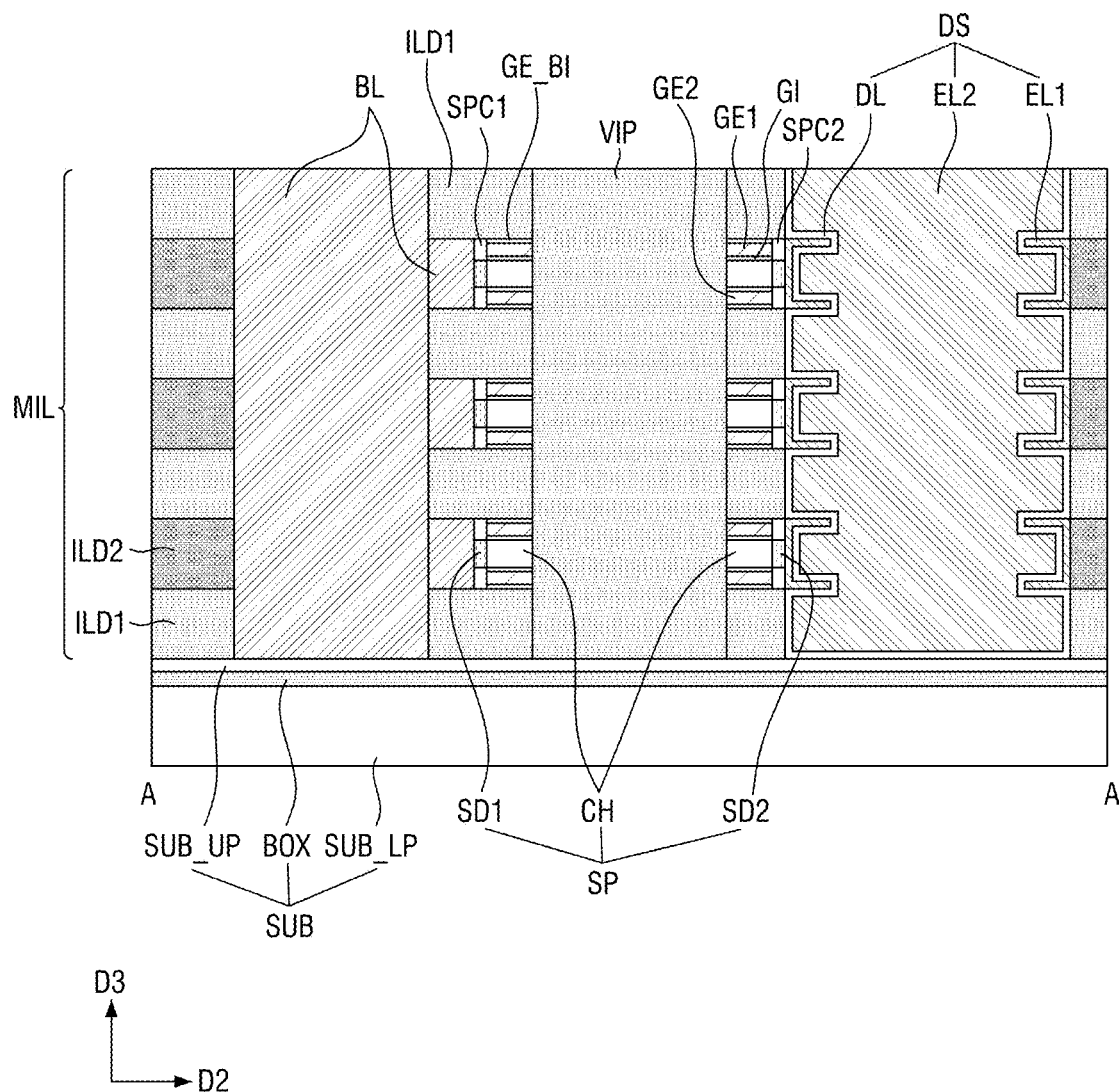
FIGS. 18 to 20 are diagrams for explaining the semiconductor memory device according to some embodiments.
Figure 19:
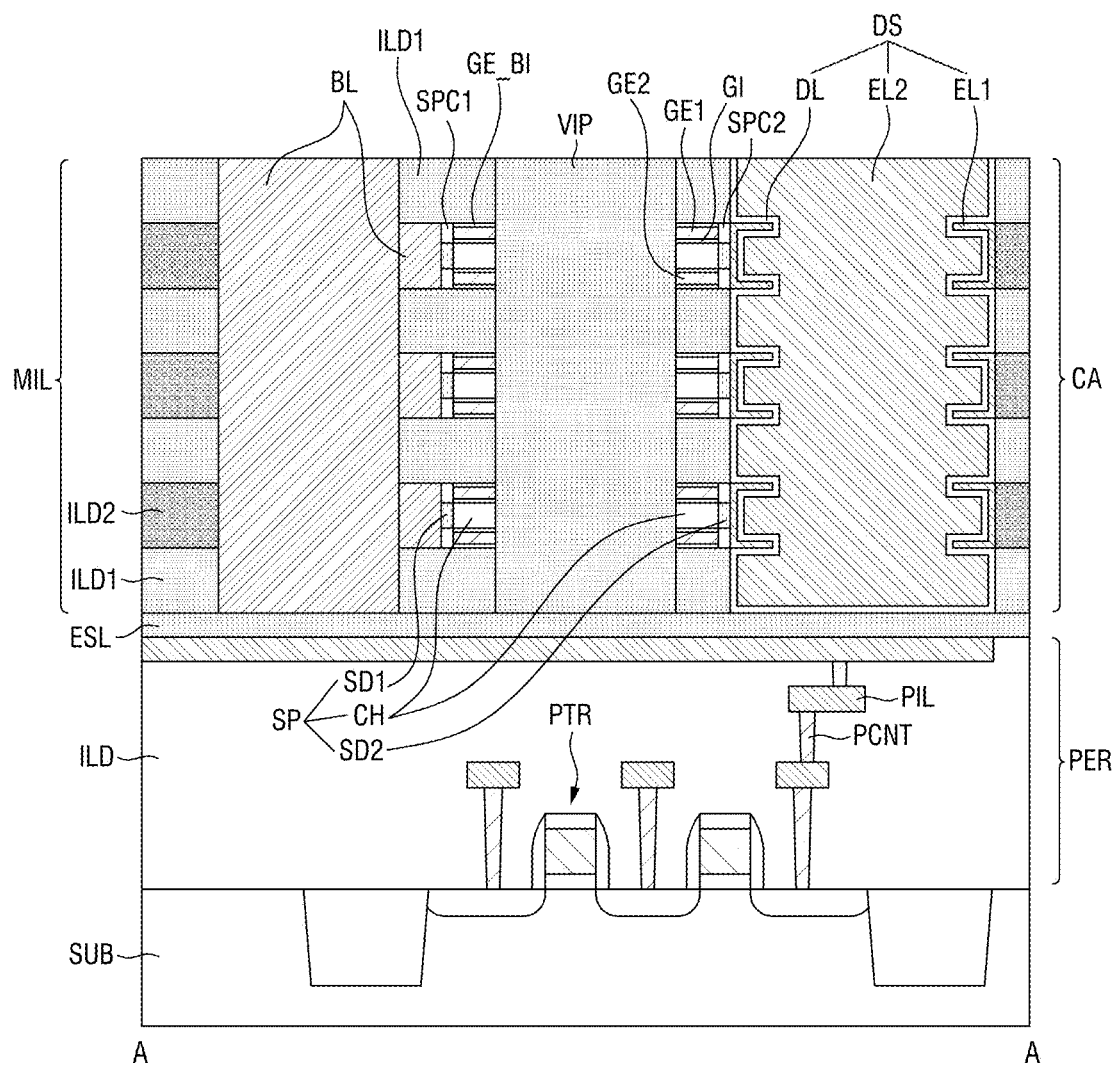
Figure 20:
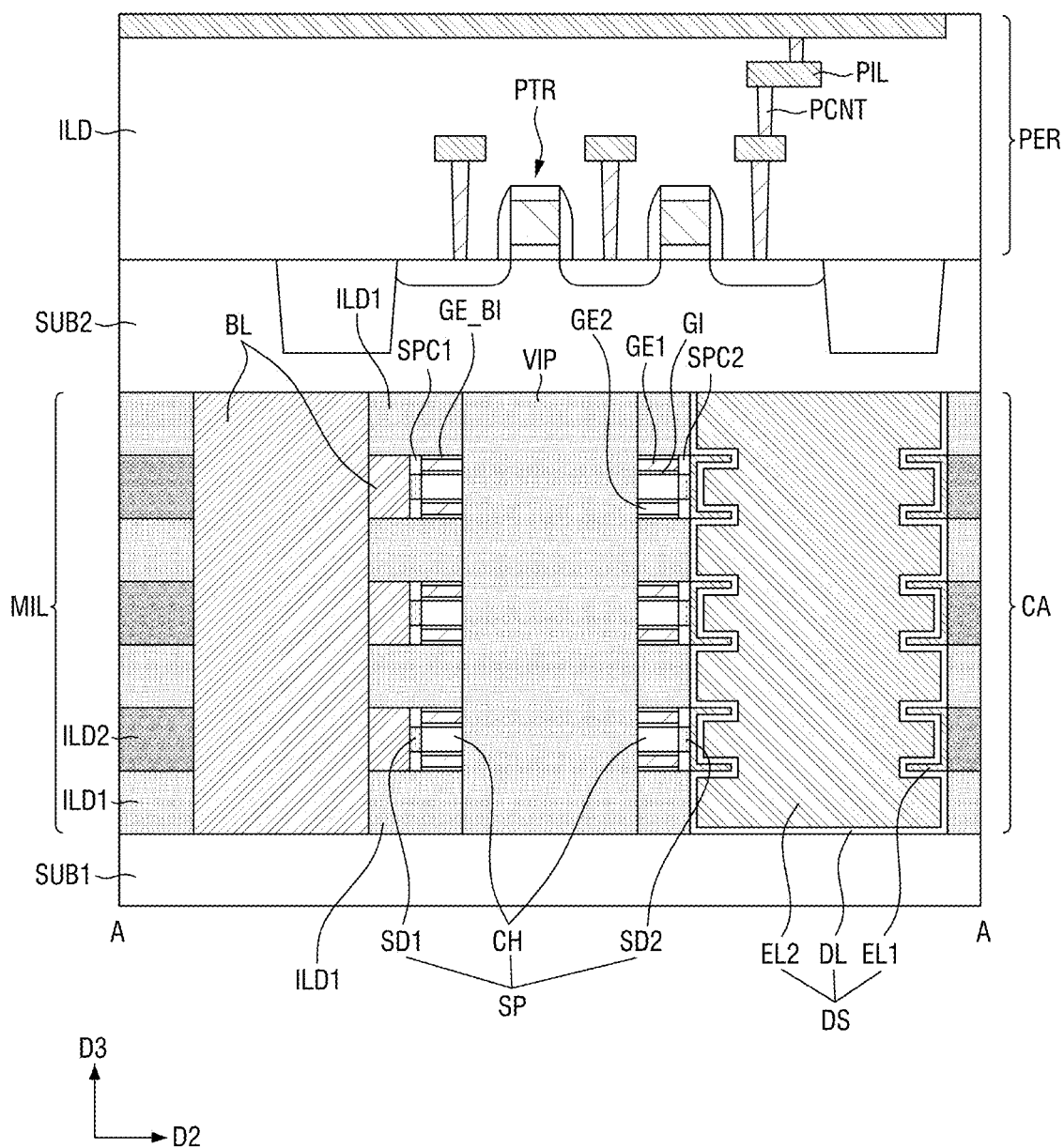

FIGS. 18 to 20 are diagrams for explaining the semiconductor memory device according to some embodiments. For convenience of explanation, differences from those explained using FIGS. 16 to 17 will be mainly explained.

Referring to FIG. 18, in the semiconductor memory device according to some embodiments, the substrate SUB may include a lower semiconductor film SUB_LP, an upper semiconductor film SUB_UP, and a buried insulating film BOX between the lower semiconductor film SUB_LP and the upper semiconductor film SUB_UP. The substrate SUB may be, for example, an SOI (Silicon on Insulator) substrate.

Referring to FIG. 19, the cell array CA explained using 15 may be provided on the substrate SUB. A peripheral circuit region PER may be provided between the cell array CA and the substrate SUB. The peripheral circuit region PER may include a circuit for operating the cell array CA.

Specifically, the peripheral circuit region PER may include peripheral transistors PTR, peripheral wirings PIL on the peripheral transistors PTR, and peripheral contacts PCNT that vertically connect the peripheral wirings PIL. Although it is not shown, the peripheral wirings PIL may be electrically connected to the cell array CA through a penetration electrode.

As an example, an etching stop layer ESL may be additionally interposed between the cell array CA and the peripheral circuit region PER. As another example, the etching stop layer ESL may not be interposed between the cell array CA and the peripheral circuit region PER.

The semiconductor memory device according to some embodiments may have a cell-on-peri (COP) structure in which a memory cell is provided on a peripheral circuit region. By three-dimensionally stacking the peripheral circuit region PER and the cell array CA, an area of the semiconductor memory chip may be reduced and high integration of the circuit may be achieved.

Referring to FIG. 20, the cell array CA may be provided on the first substrate SUB1. The second substrate SUB2 may be provided on the cell array CA. The peripheral circuit region PER may be provided on the second substrate SUB2. The peripheral circuit region PER may include a circuit for operating the cell array CA.

Formation of the semiconductor memory device according to some embodiments may include formation of the cell array CA on the first substrate SUB1, formation of the peripheral circuit region PER on the second substrate SUB2, and attachment of the second substrate SUB2 onto the cell array CA in a wafer bonding manner.

The semiconductor memory device according to some embodiments may have a peri-on-cell (POC) structure in which the peripheral circuit region PER is provided on the memory cell. By three-dimensionally stacking the cell array CA and the peripheral circuit region PER, the area of the semiconductor memory chip may be reduced and high integration of the circuit may be achieved.

Figure 21:
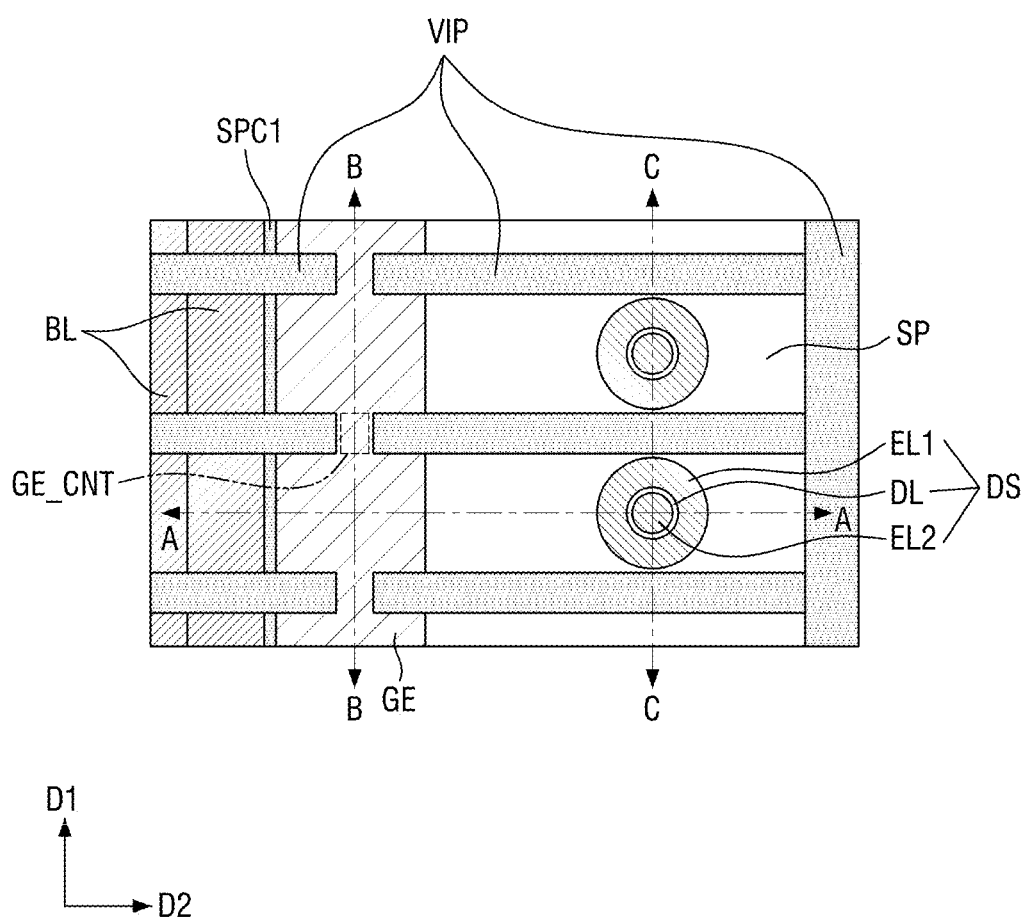
FIGS. 21 to 22c are diagrams for explaining the semiconductor memory device according to some embodiments.
Figure 22A:
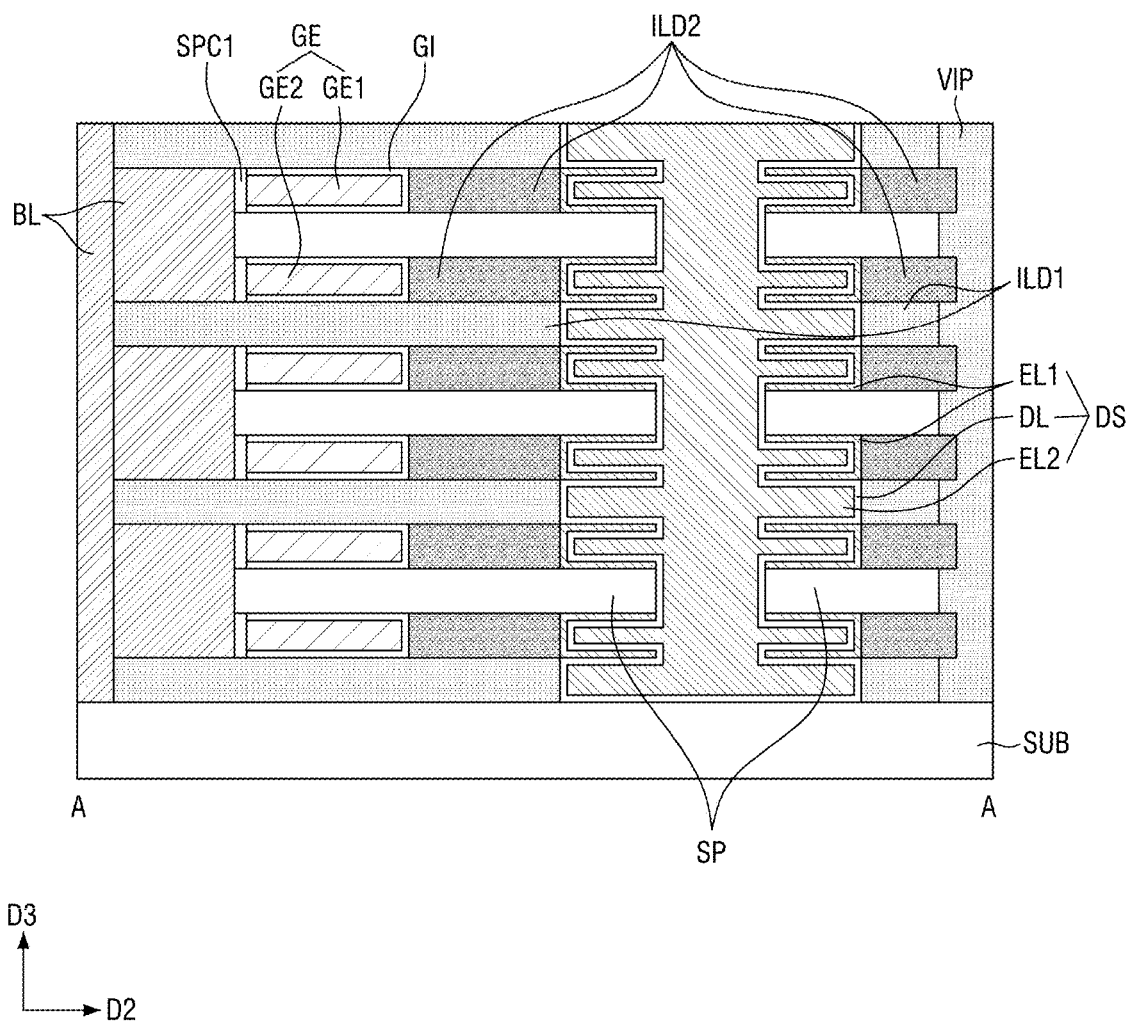
Figure 22B:
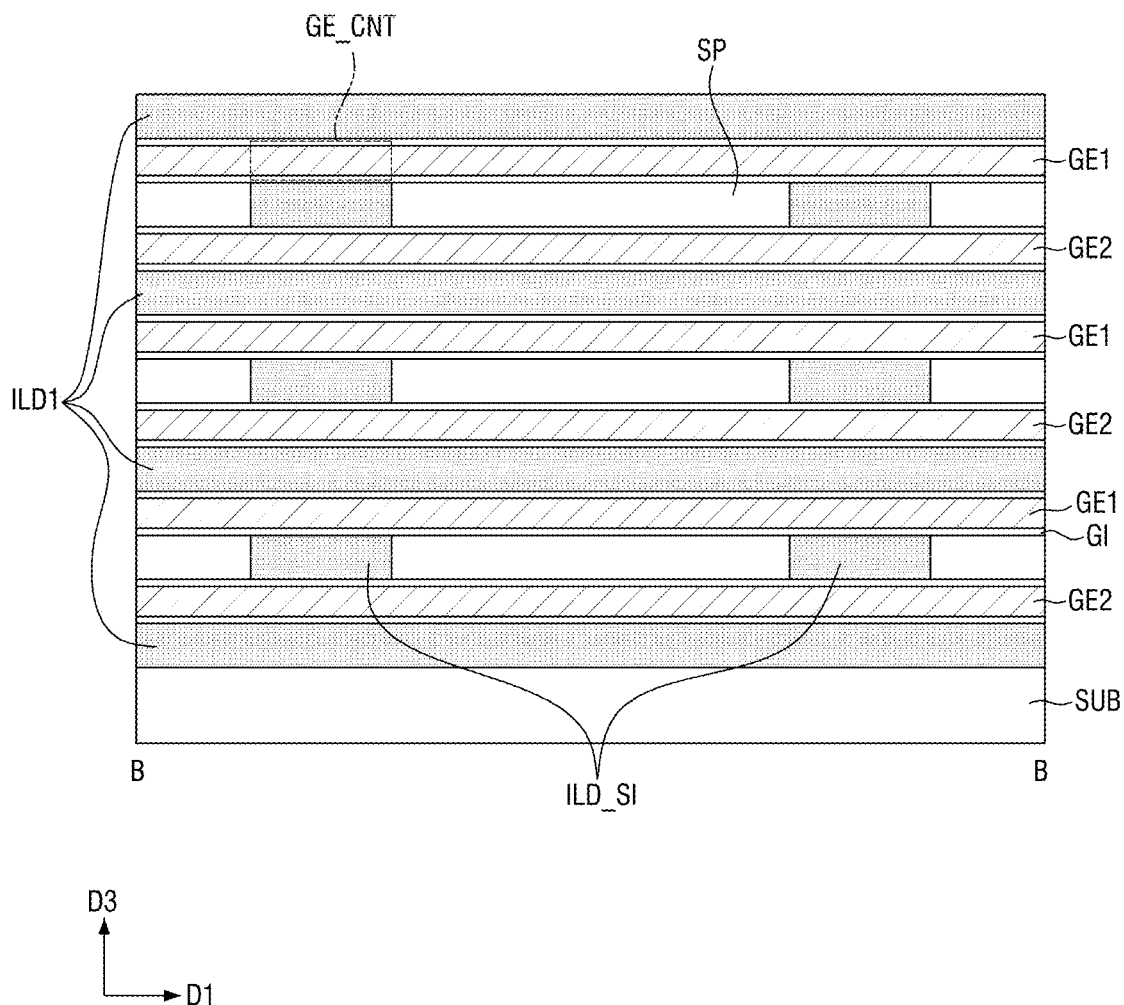
Figure 22C:
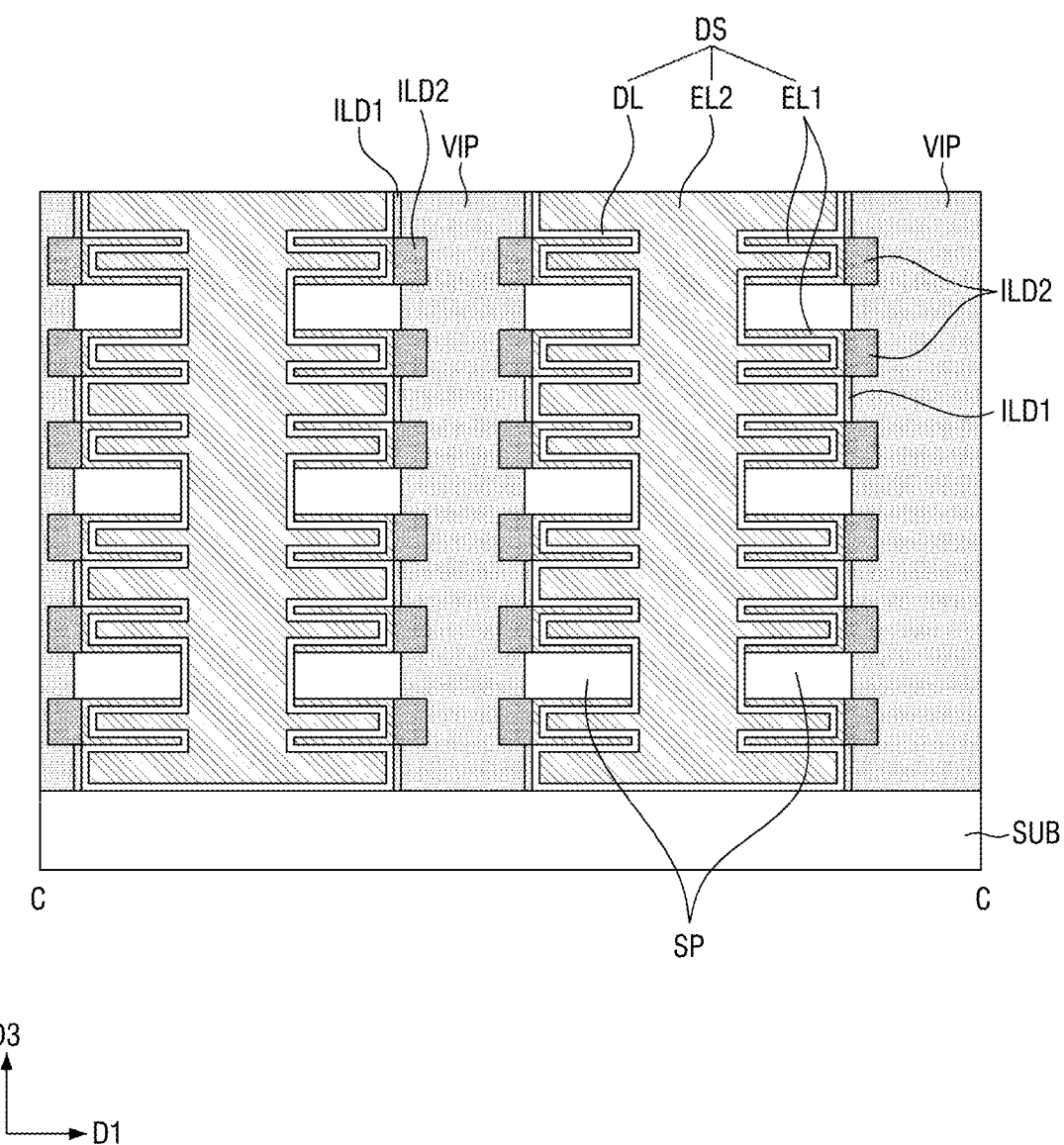

FIGS. 21 to 22c are diagrams for explaining the semiconductor memory device according to some embodiments. FIG. 21 is a plan view. FIGS. 22a to 22c are cross-sectional views taken along lines A-A, B-B, and C-C of FIG. 21, respectively.

Referring to FIGS. 21 to 22c, in the semiconductor memory device according to some embodiments, each semiconductor pattern SP may have a bar shape extending long in the second direction D2. Each semiconductor pattern SP may be defined by the vertical insulating structure VIP.

The upper gate electrode GE1, the semiconductor pattern SP, and the lower gate electrode GE2 may be sequentially disposed between the first mold insulating layers ILD1 adjacent to each other in the third direction D3. The semiconductor patterns SP adjacent to each other in the first direction D1 may be separated by the insertion mold insulating layer ILD_SI. The gate electrode GE may not include the connection gate electrode (GE3 of FIG. 17b) located between the semiconductor patterns SP adjacent to each other in the first direction D1.

The upper gate electrode GE1 and the lower gate electrode GE2 include gate connecting parts GE_CNT located above and below the insertion mold insulating layer ILD_SI.

Some of the second mold insulating layers ILD2 may be interposed between the semiconductor pattern SP and the first mold insulating layer ILD1 adjacent to each other. That is, the second mold insulating layers ILD2 may be disposed above and below the semiconductor pattern SP, respectively.

The first electrodes EL1 may be disposed above and below the semiconductor pattern SP, respectively. The first electrode EL1 may include two structures adjacent to each other in the third direction D3 and connected to the single semiconductor pattern SP.

The first electrodes EL1 disposed with the semiconductor pattern SP interposed therebetween may not be directly connected to each other. The first electrodes EL1 disposed with the semiconductor pattern SP interposed therebetween may be electrically connected via the semiconductor pattern SP. The first electrode EL1 may be formed in the second mold insulating layer ILD2 disposed above and below the semiconductor pattern SP.

The first electrode EL1 located above the semiconductor pattern SP and the first electrode EL1 located below the semiconductor pattern SP may have the same shape as in FIG. 4a, respectively. In the semiconductor memory device according to some embodiments, the first electrode EL1 may have a shape in which two structures having a closed-loop shape (a shape as shown in FIG. 4a) are connected via the semiconductor pattern SP.

A part of the dielectric film DL may extend along the side wall of the semiconductor pattern SP.

Unlike the shown case, the semiconductor pattern SP may not be located between the two first electrodes EL1 connected to the single semiconductor pattern SP. It is a matter of course that a silicide pattern obtained by silicidization of the semiconductor pattern SP may be located between the two first electrodes EL1 connected to the semiconductor pattern SP.

Figure 23:
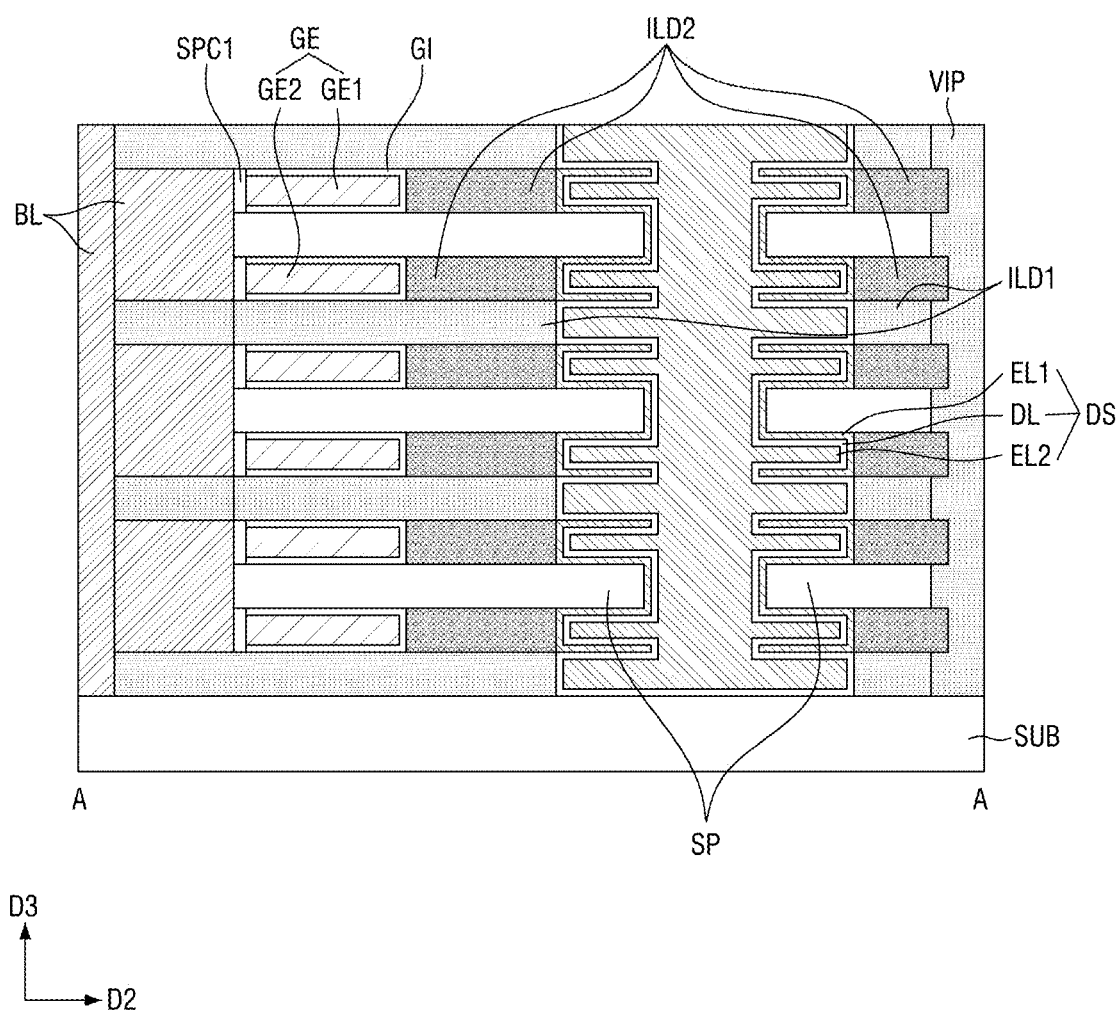
FIG. 23 is a diagram for explaining the semiconductor memory device according to some embodiments.

FIG. 23 is a diagram for explaining the semiconductor memory device according to some embodiments. For convenience of explanation, differences from those explained using FIGS. 21 to 22c will be mainly explained.

Referring to FIG. 23, in the semiconductor memory device according to some embodiments, the first electrodes EL1 disposed with the semiconductor pattern SP interposed therebetween may be directly connected to each other.

On the basis of the cross-sectional view taken along the second direction D2, the first electrode EL1 may extend along the upper surface, the side walls and the lower surface of the semiconductor pattern SP protruding in the second direction D2 beyond the second mold insulating layer ILD2.

FIGS. 24a to 30 are intermediate stage diagrams for explaining a method for fabricating a semiconductor memory device according to some embodiments. A fabricating process described below may be a process performed after forming the bit line BL and the gate electrode GE. However, inventive concepts are not limited thereto, and after forming the information storage element (DS of FIG. 2), the bit line BL and/or the gate electrode GE may of course be formed.

Figure 24A:
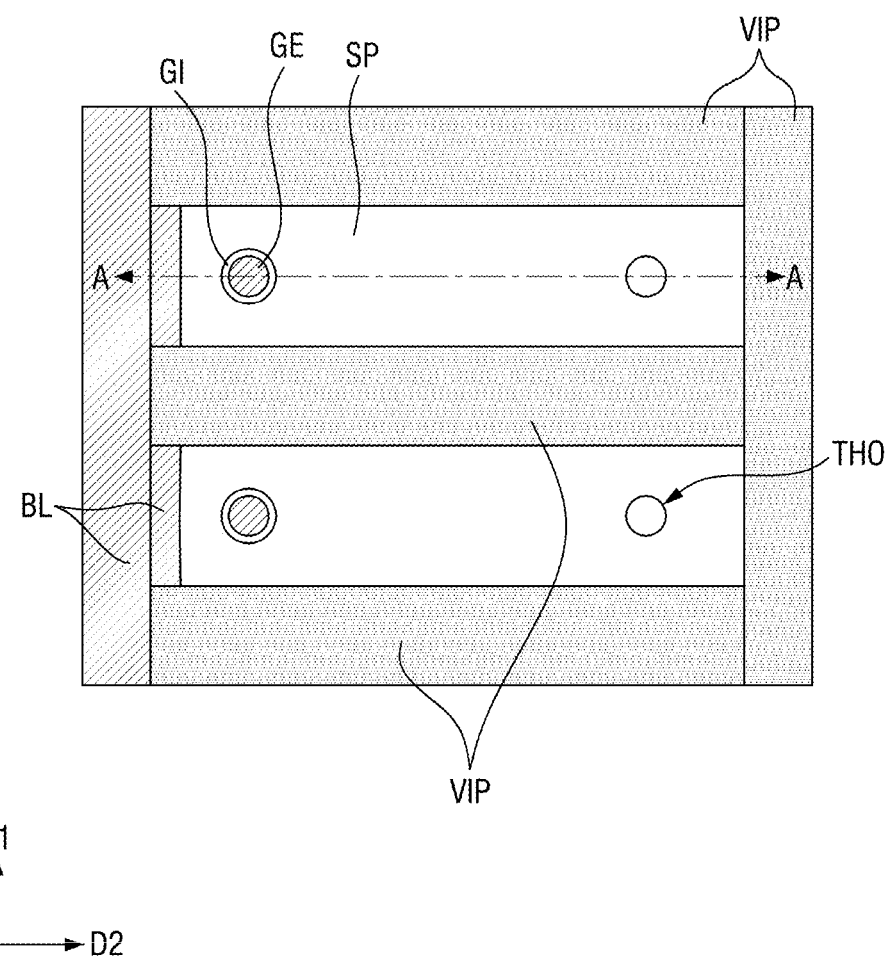
FIGS. 24a to 30 are intermediate stage diagrams for explaining a method for fabricating a semiconductor memory device according to some embodiments.
Figure 24B:
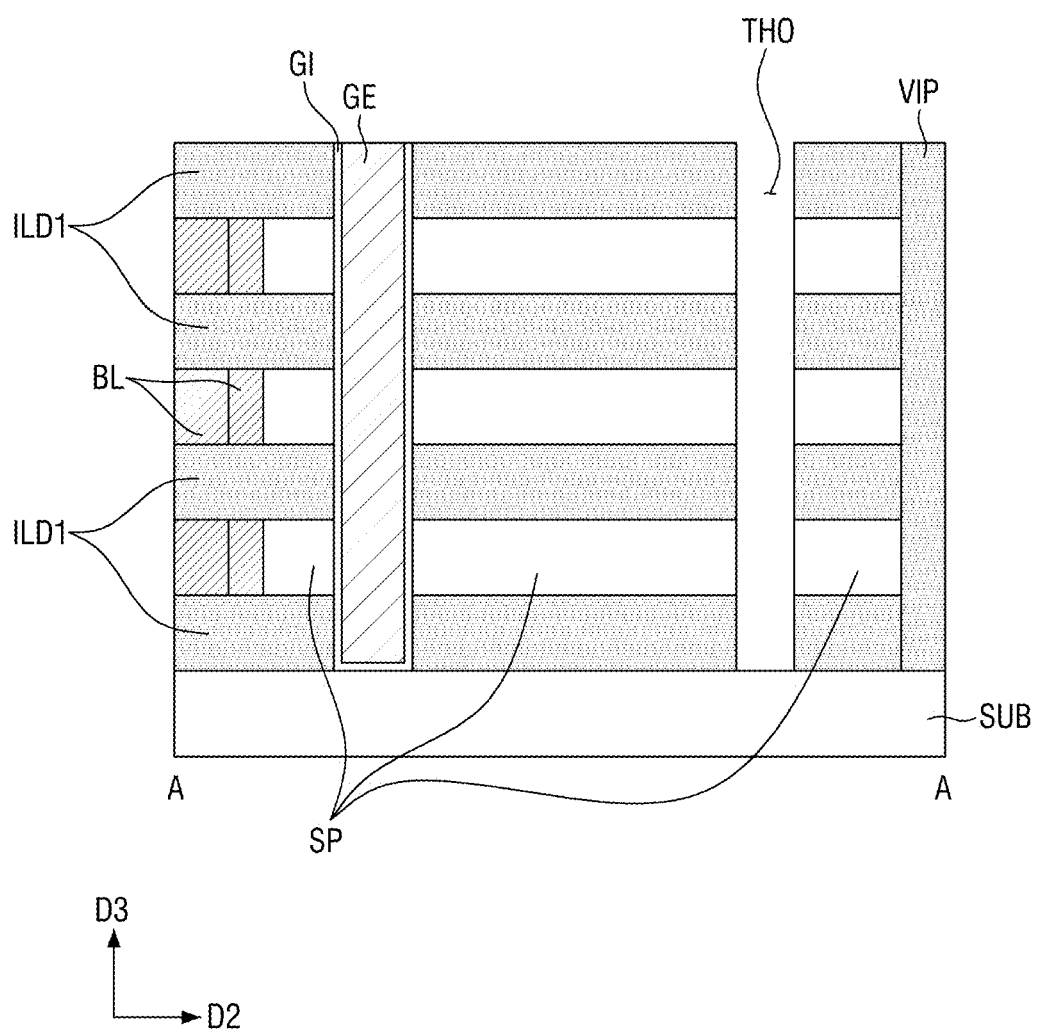

Referring to FIGS. 24a and 24b, a mold layer including the first mold insulating layer ILD1 and the semiconductor pattern SP may be formed on the substrate SUB. A stacked structure including a plurality of mold layers may be formed on the substrate SUB.

The semiconductor pattern SP may include, for example, a silicon film. The first mold insulating layer ILD1 may include a silicon oxide film. In the method for fabricating the semiconductor memory device some embodiments, a region of the stacked structure may be defined by the vertical insulating structure VIP.

A penetration hole THO penetrating the stacked structure may be formed. The penetration hole THO may be defined by the first mold insulating layer ILD1 and the semiconductor pattern SP.

Figure 25A:
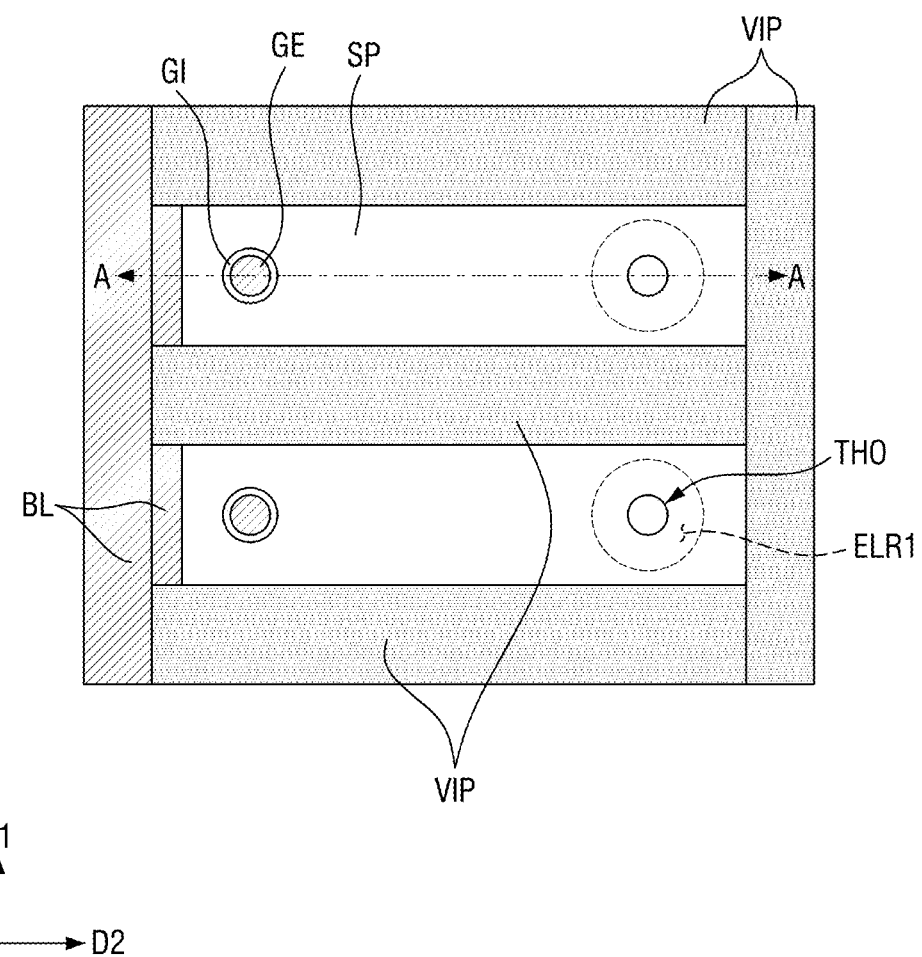
Figure 25B:
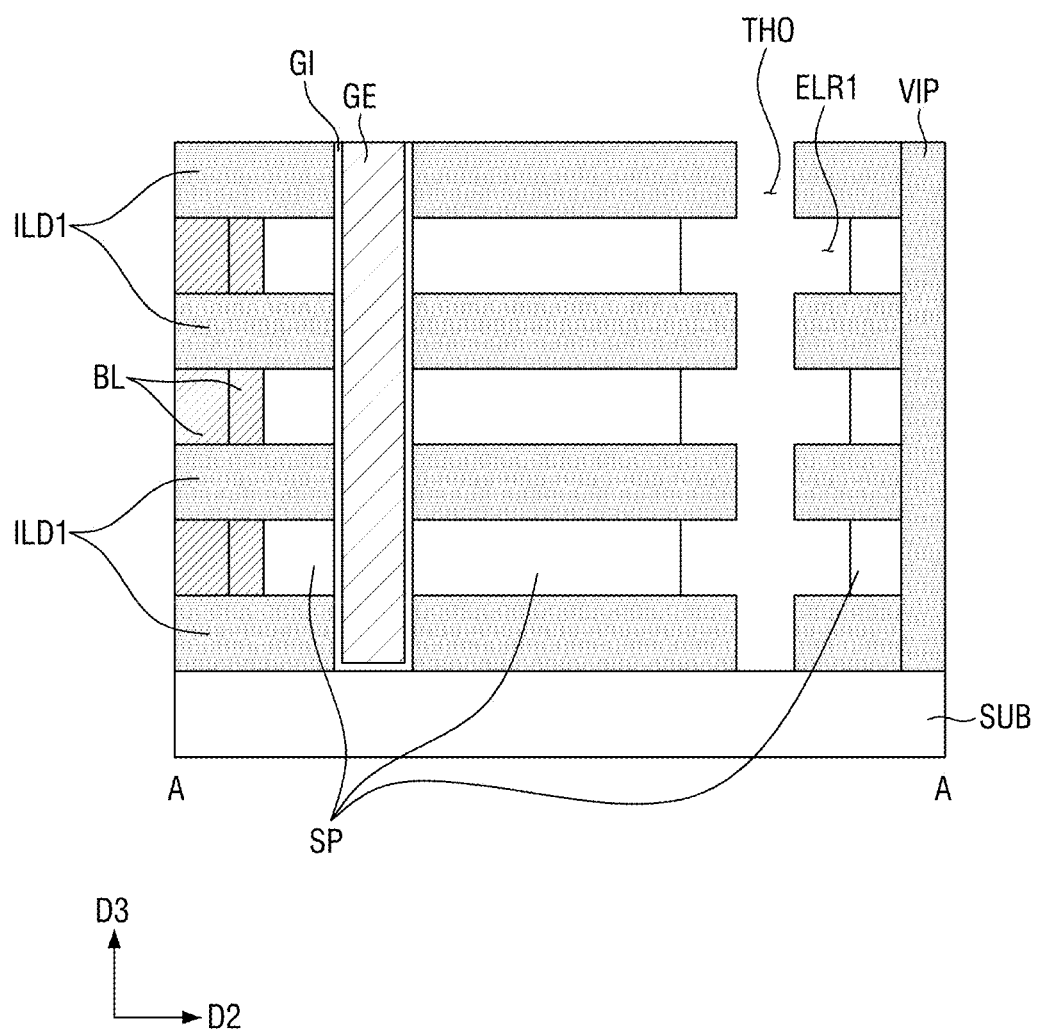

Referring to FIGS. 25a and 25b, a lower electrode recess ELR1 may be formed between the first mold insulating layers ILD1, by partially etching the semiconductor pattern SP exposed through the penetration hole THO.

The lower electrode recess ELR1 may be connected to the penetration hole THO.

Figure 26A:
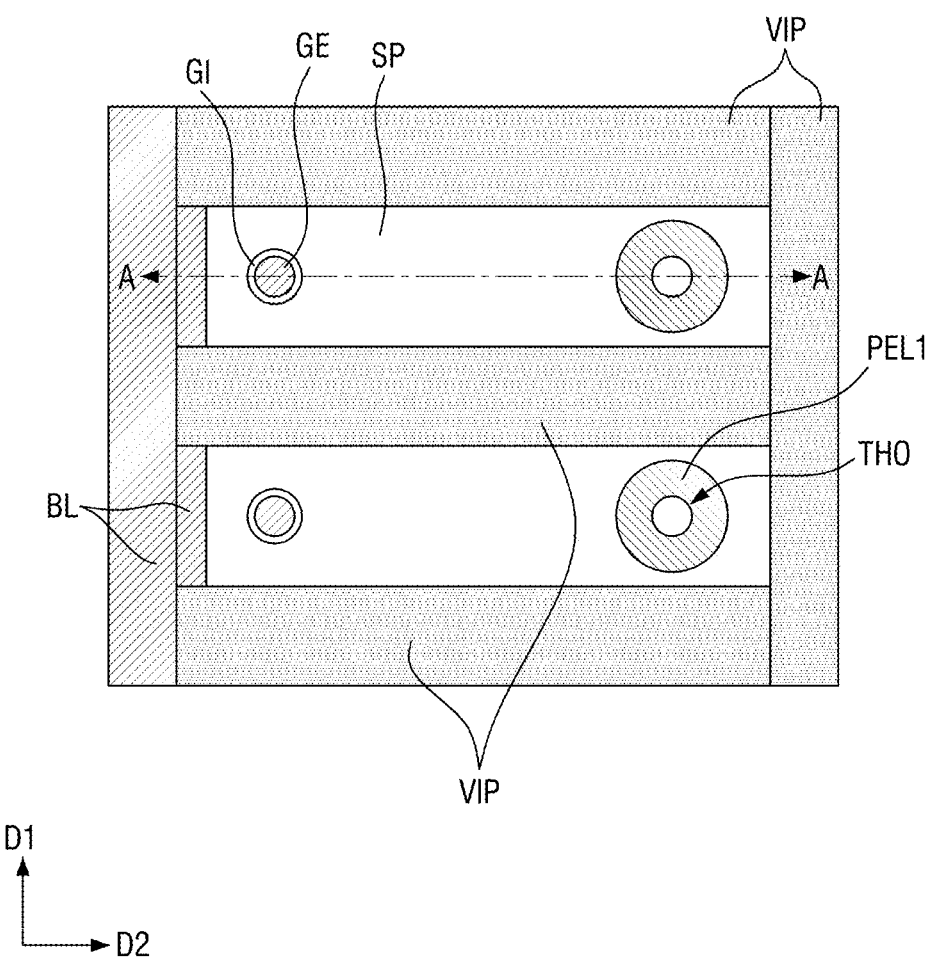
Figure 26B:
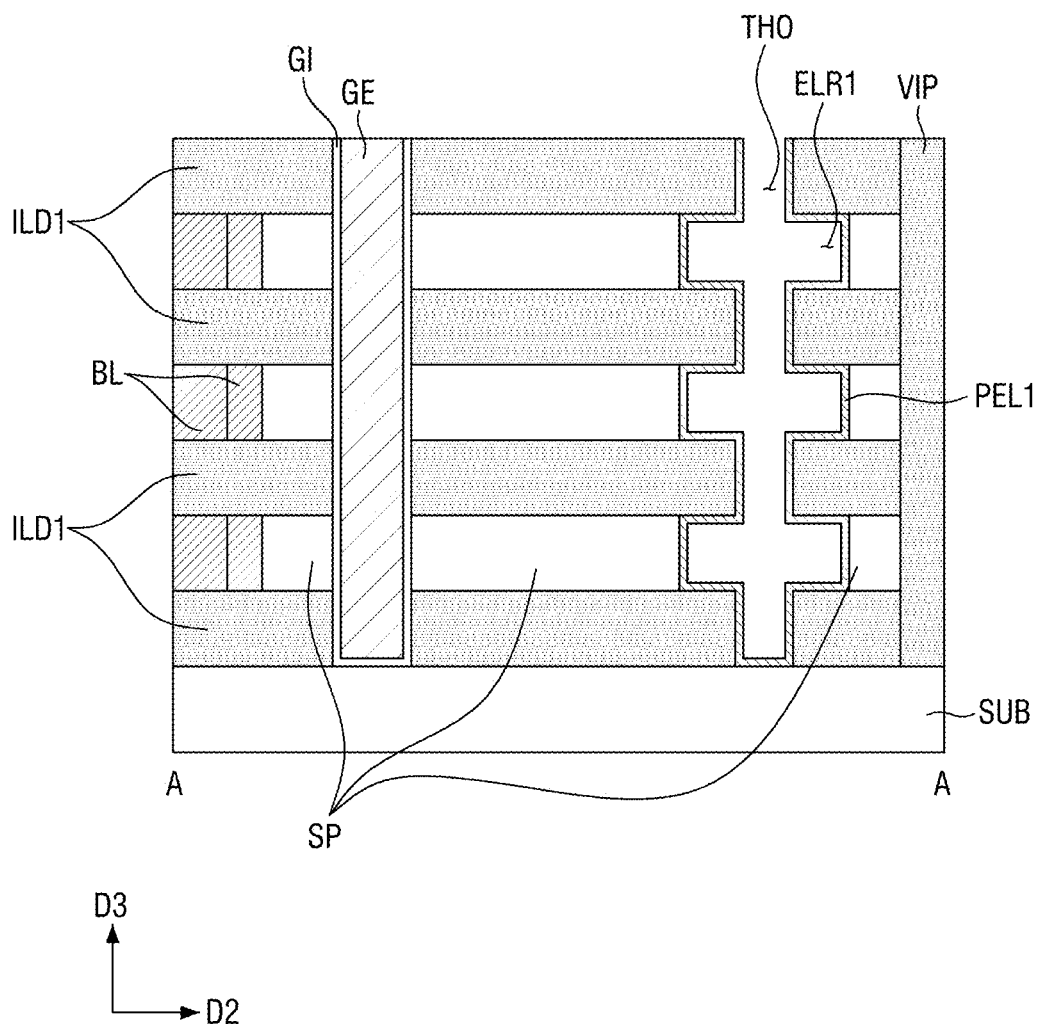

Referring to FIGS. 26a and 26b, a pre-electrode film PEL1 may be formed along the profile of the penetration hole THO and the profile of the lower electrode recess ELR1.

The pre-electrode film PEL1 may be formed conformally along the profile of the penetration hole THO and the profile of the lower electrode recess ELR1.

Figure 27A:
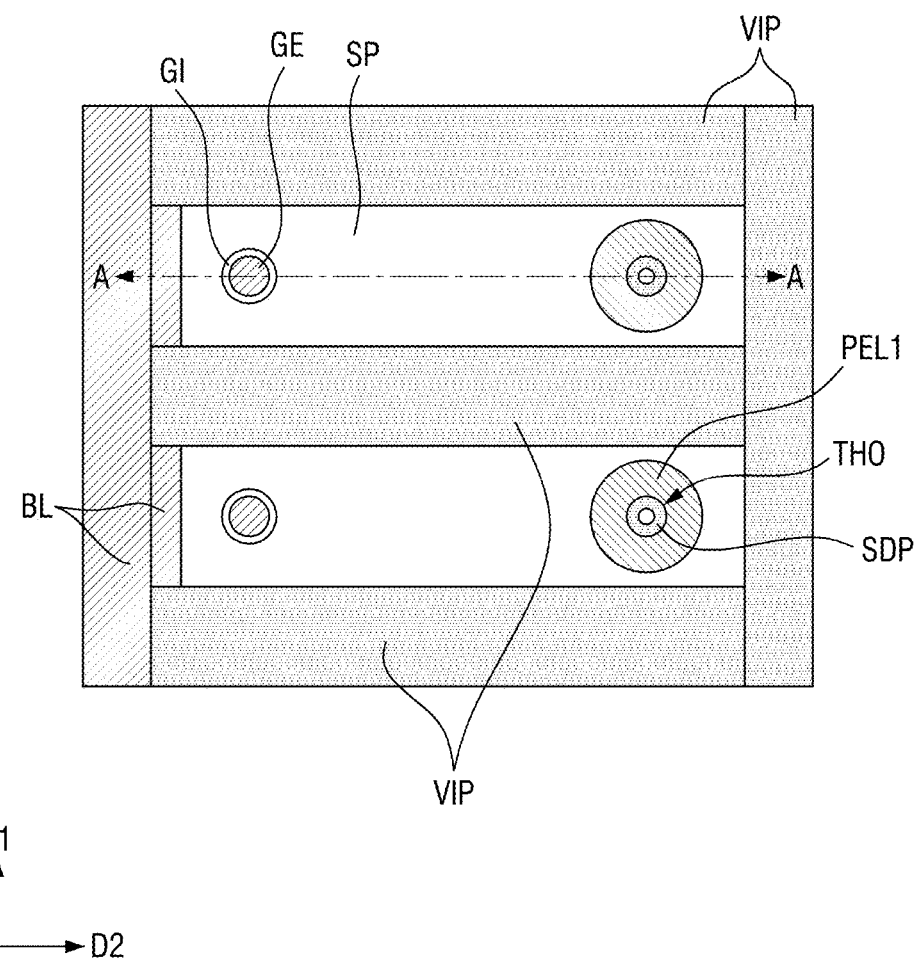
Figure 27B:
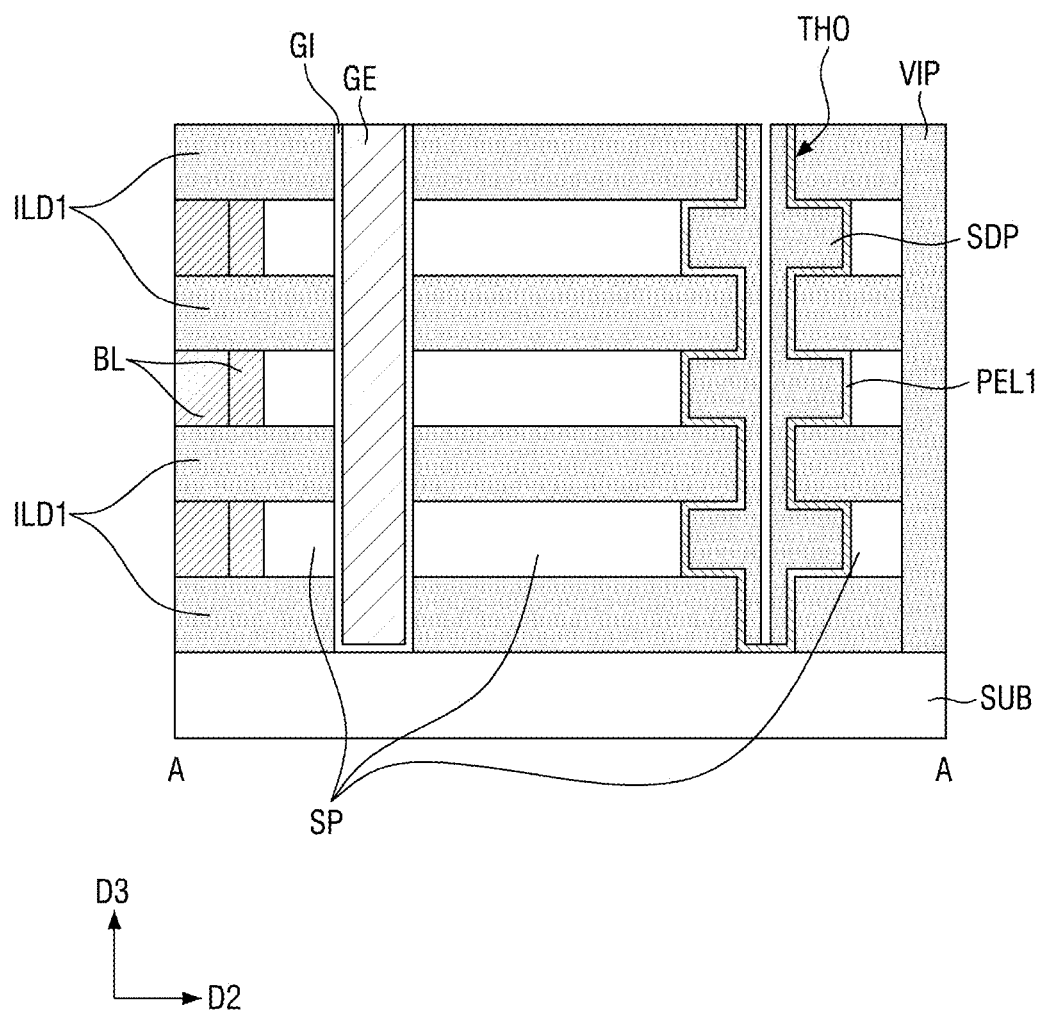

Referring to FIGS. 27a and 27b, a sacrificial insulating film SDP which fills at least some of the lower electrode recess ELR1 and the penetration hole THO may be formed on the pre-electrode film PEL1.

The sacrificial insulating film SDP may cover the pre-electrode film PEL1 formed along the profile of the penetration hole THO and the profile of the lower electrode recess ELR1.

Figure 28:
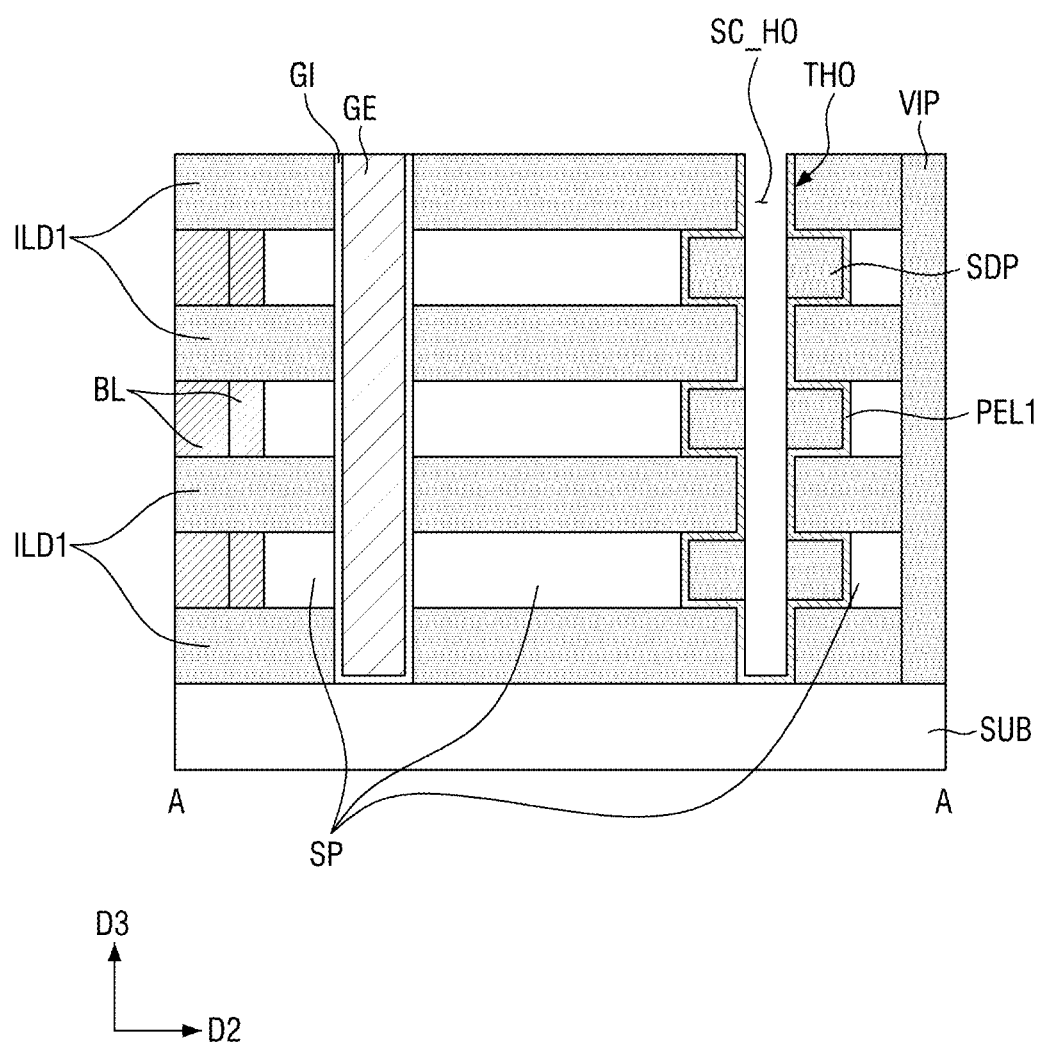

Referring to FIG. 28, a sacrificial hole SC_HO may be formed in the sacrificial insulating film SDP, by removing a part of the sacrificial insulating film SDP. A part of the side wall of the sacrificial hole SC_HO may be defined by the sacrificial insulating film SDP which fills the lower electrode recess ELR1.

The sacrificial hole SC_HO may expose the pre-electrode film PEL1 formed on the side wall of the first mold insulating layer ILD1.

Figure 29:
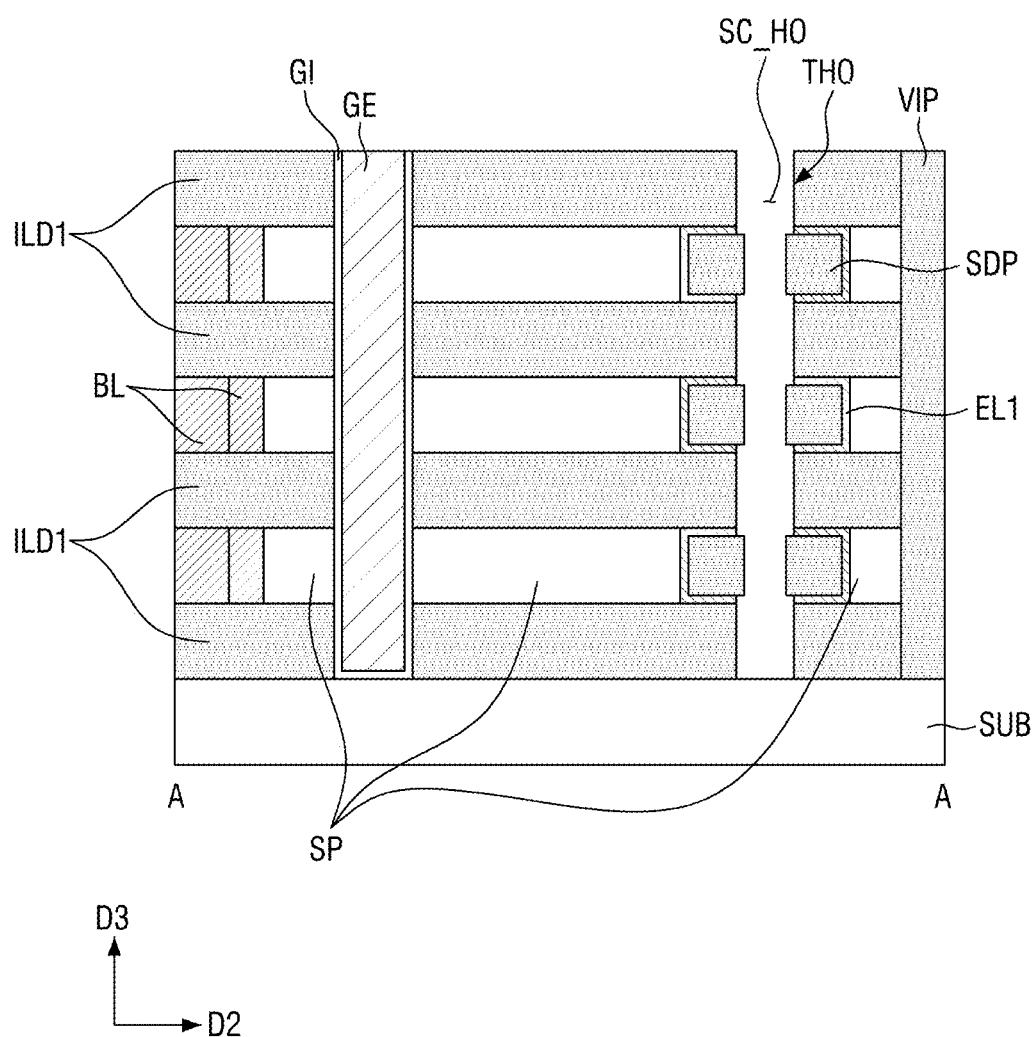

Referring to FIG. 29, the pre-electrode film PEL1 exposed by the sacrificial hole SC_HO may be removed. Therefore, the first electrode EL1 may be formed along the profile of the lower electrode recess ELR1.

By removing the pre-electrode film PEL1 on the side wall of the first mold insulating layer ILD1, a plurality of first electrodes EL1 stacked in the third direction D3 and spaced apart from each other may be formed.

The first electrode EL1 may extend along the first mold insulating layer ILD1 which defines the lower electrode recess ELR1. The first electrode EL1 may include an upper plate region (EL11 of FIG. 4a) and a lower plate region (EL12 of FIG. 4a) extending along the first mold insulating layer ILD1. The first electrode EL1 may have a closed-loop shape.

Figure 30:
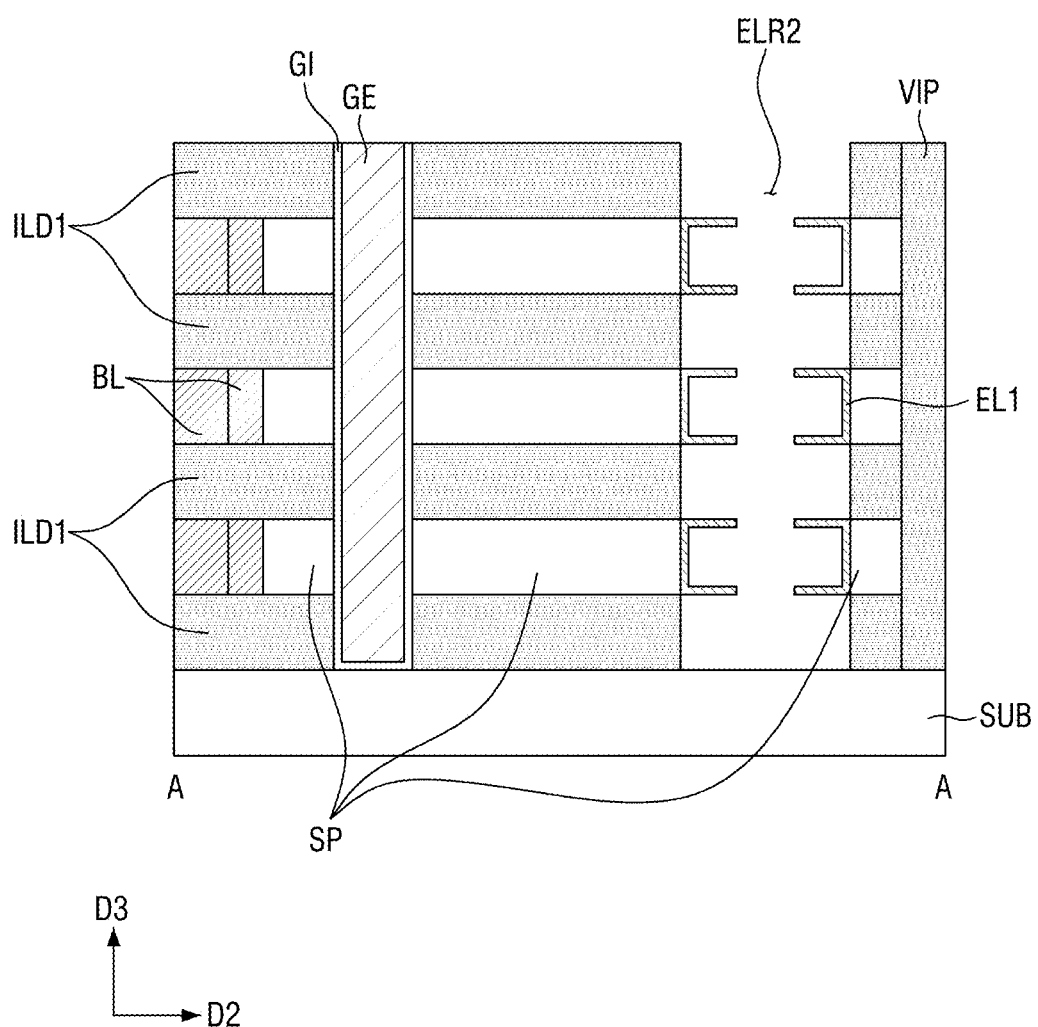

Referring to FIG. 30, a mold recess ELR2 may be formed by partially etching the first mold insulating layer ILD1 exposed by the penetration hole THO.

The mold recess ELR2 may be formed, by simultaneously removing the sacrificial insulating film SDP disposed between the first electrodes EL1, and a part of the first mold insulating layer ILD1.

Referring to FIG. 11a, the dielectric film DL may be formed along the profile of the first electrode EL1 and the profile of the mold recess ELR2.

Subsequently, a second electrode EL2 which fills the mold recess ELR2 may be formed on the dielectric film DL.

FIGS. 31a to 32b are intermediate stage diagrams for explaining a method for fabricating a semiconductor memory device according to some embodiments.

Figure 31A:
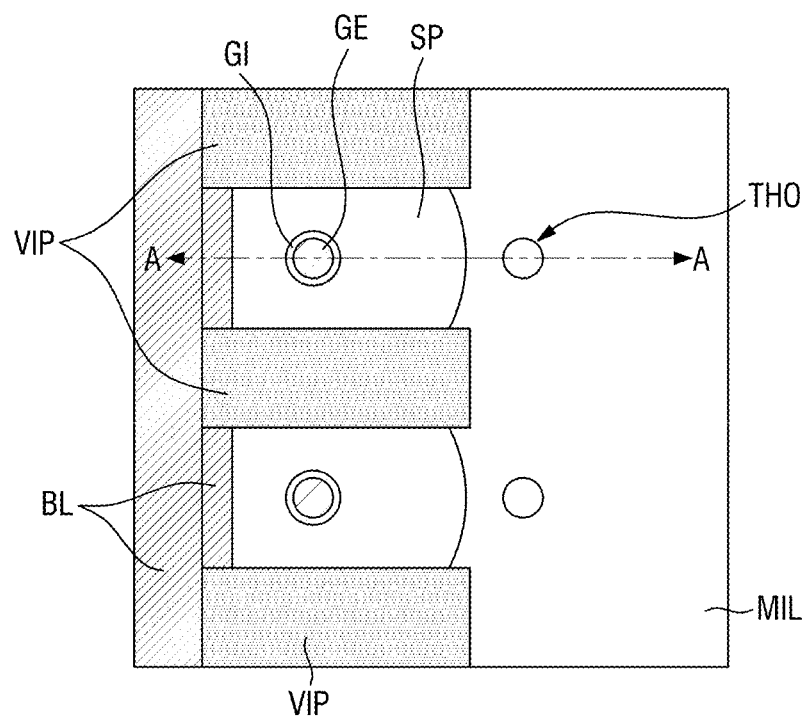
FIGS. 31a to 32b are intermediate stage diagrams for explaining the method for fabricating the semiconductor memory device according to some embodiments.
Figure 31B:
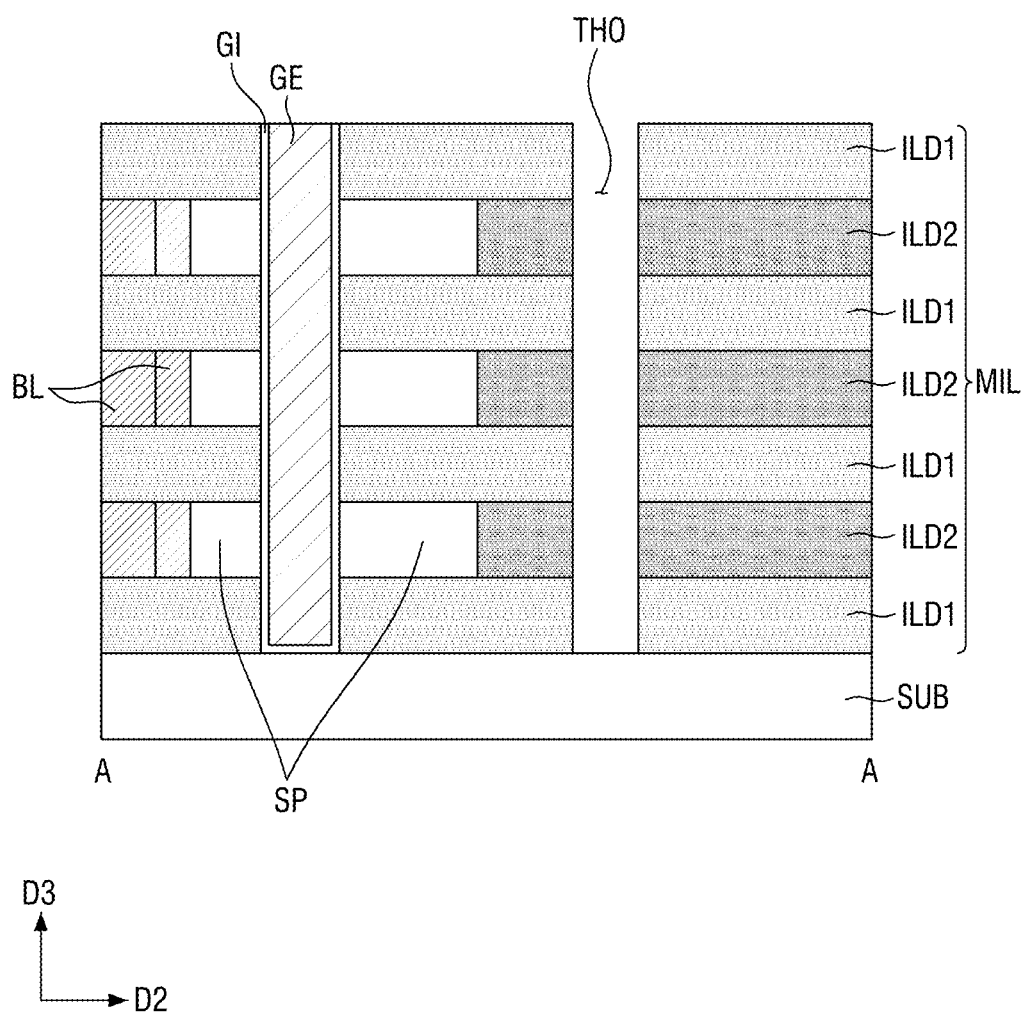

Referring to FIGS. 31a and 31b, a mold layer including the first mold insulating layer ILD1 and the second mold insulating layer ILD2 may be formed on the substrate SUB. A stacked structure including a plurality of mold layers may be formed on the substrate SUB.

The stacked structure including the first mold insulating layer ILD1 and the second mold insulating layer ILD2 may be a mold structure MIL.

The first mold insulating layer ILD1 may include a silicon oxide film. The second mold insulating layer ILD2 may include a silicon nitride film.

A penetration hole THO which penetrates the mold structure MIL may be formed. The penetration hole THO may be defined by the first mold insulating layer ILD1 and the second mold insulating layer ILD2.

Figure 32A:
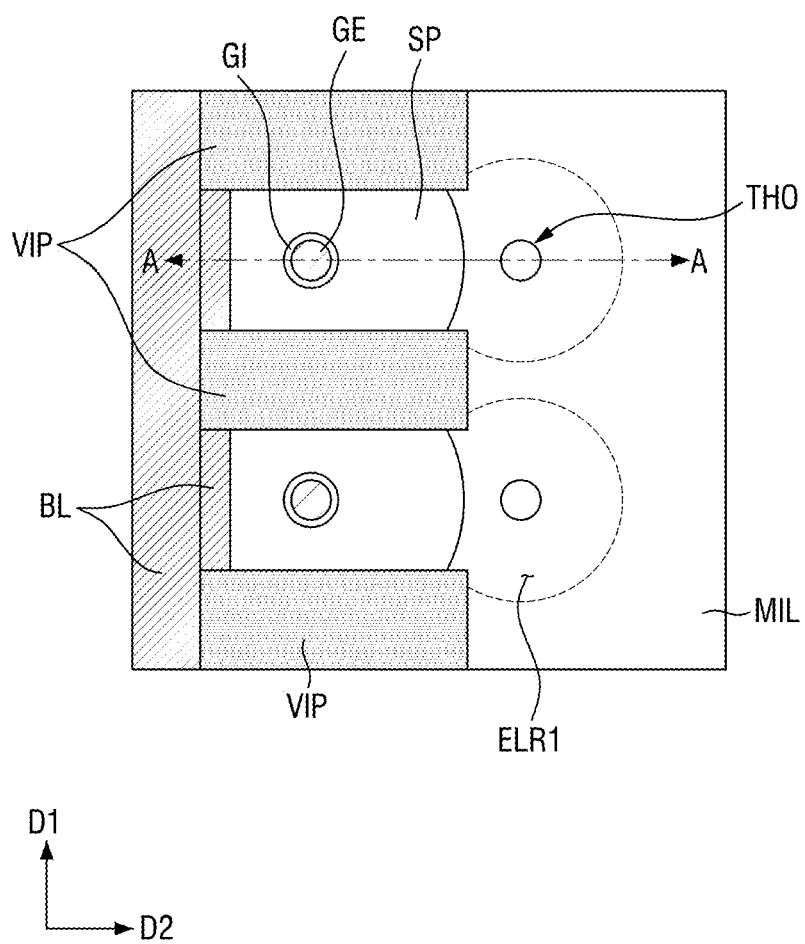
Figure 32B:
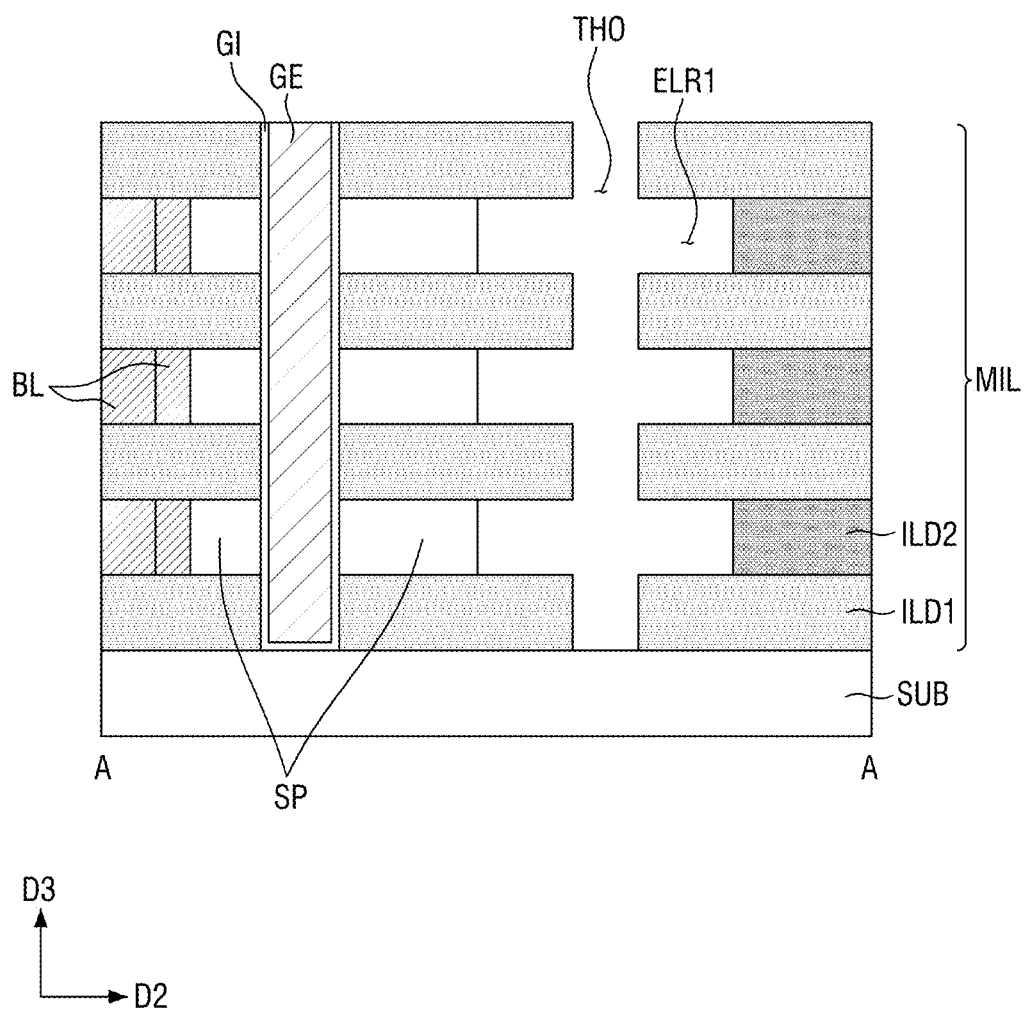

Referring to FIGS. 32a and 32b, the lower electrode recess ELR1 may be formed between the first mold insulating layers ILD1, by partially etching the second mold insulating layer ILD2 exposed by the penetration hole THO.

The semiconductor pattern SP formed at the same level as the second mold insulating layer ILD2 may be exposed by the lower electrode recess ELR1.

Subsequently, the fabricating process explained using FIGS. 26a to 30 may be performed.

FIGS. 33a to 34b are intermediate stage diagrams for explaining a method for fabricating a semiconductor memory device according to some embodiments.

Figure 33A:
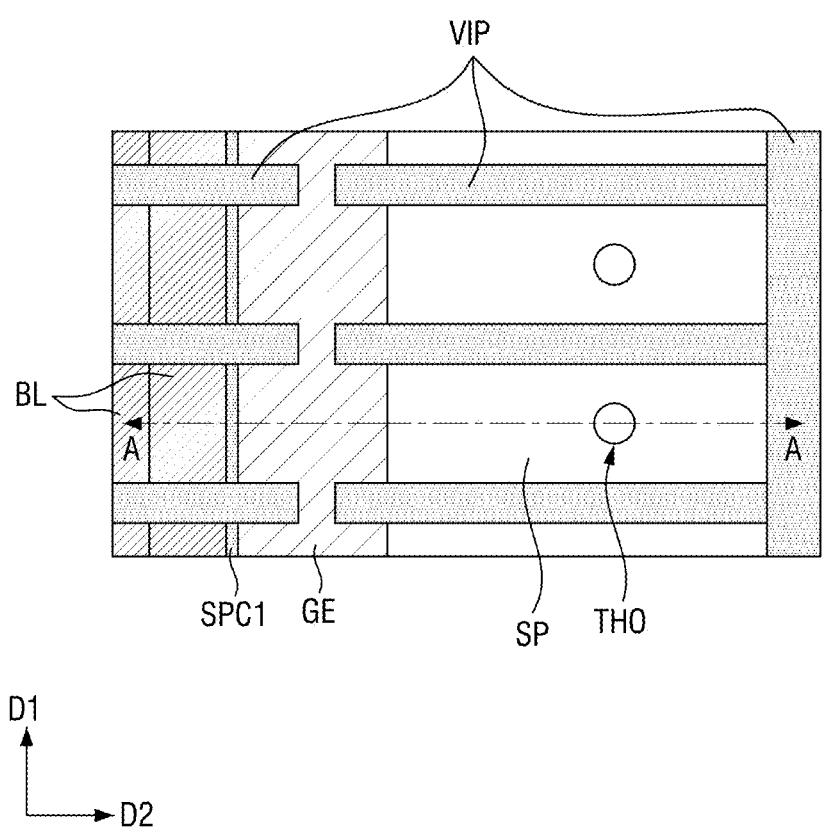
FIGS. 33a to 34b are intermediate stage diagrams for explaining the method for fabricating the semiconductor memory device according to some embodiments.
Figure 33B:
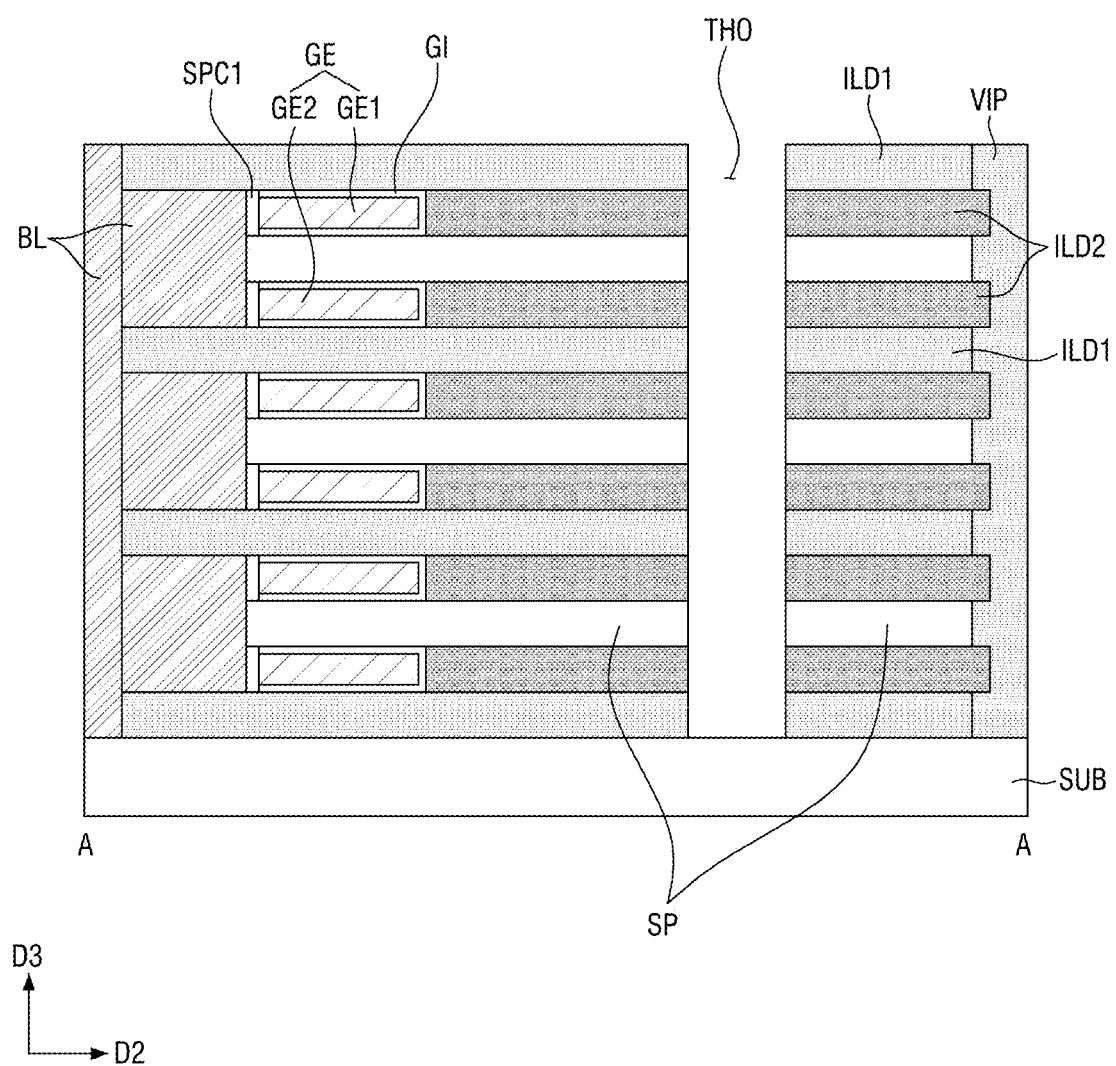

Referring to FIGS. 33a and 33b, a mold layer in which the first mold insulating layer ILD1, the second mold insulating layer ILD2, the semiconductor pattern SP and the second mold insulating layer ILD2 are sequentially stacked may be formed on the substrate SUB. A stacked structure including a plurality of mold layers may be formed on the substrate SUB.

The first mold insulating layer ILD1 may include a silicon oxide film. The second mold insulating layer ILD2 may include a silicon nitride film. The semiconductor pattern SP may include a silicon film.

A penetration hole THO which penetrates the stacked structure may be formed. The penetration hole THO may be defined by the first mold insulating layer ILD1, the second mold insulating layer ILD2, and the semiconductor pattern SP.

Figure 34A:
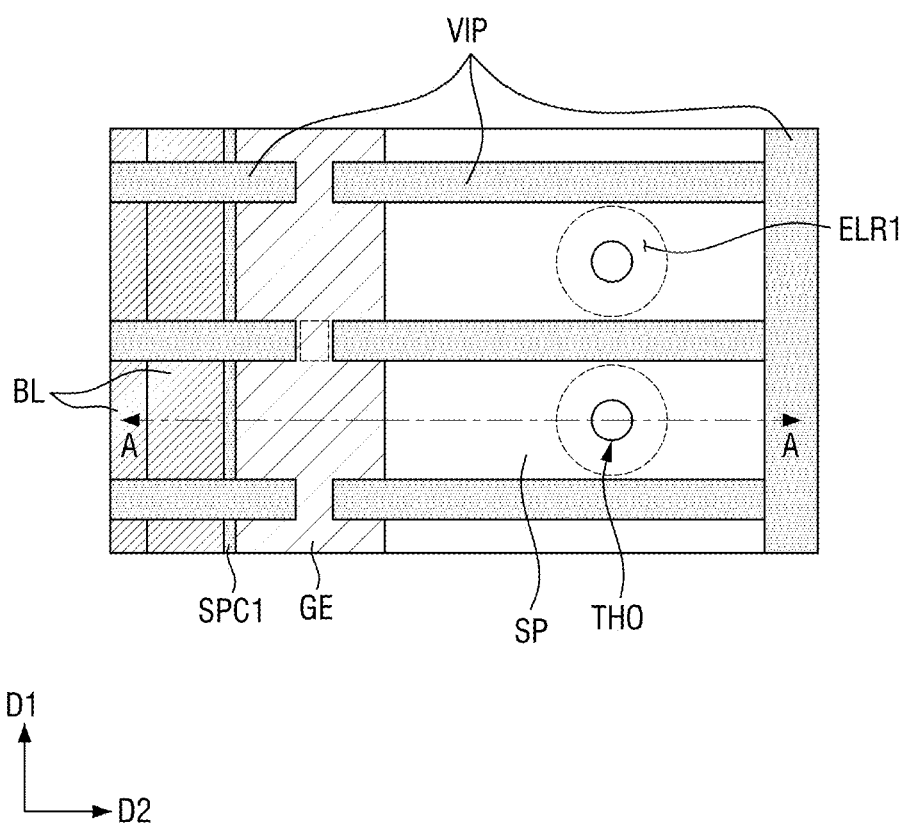
Figure 34B:
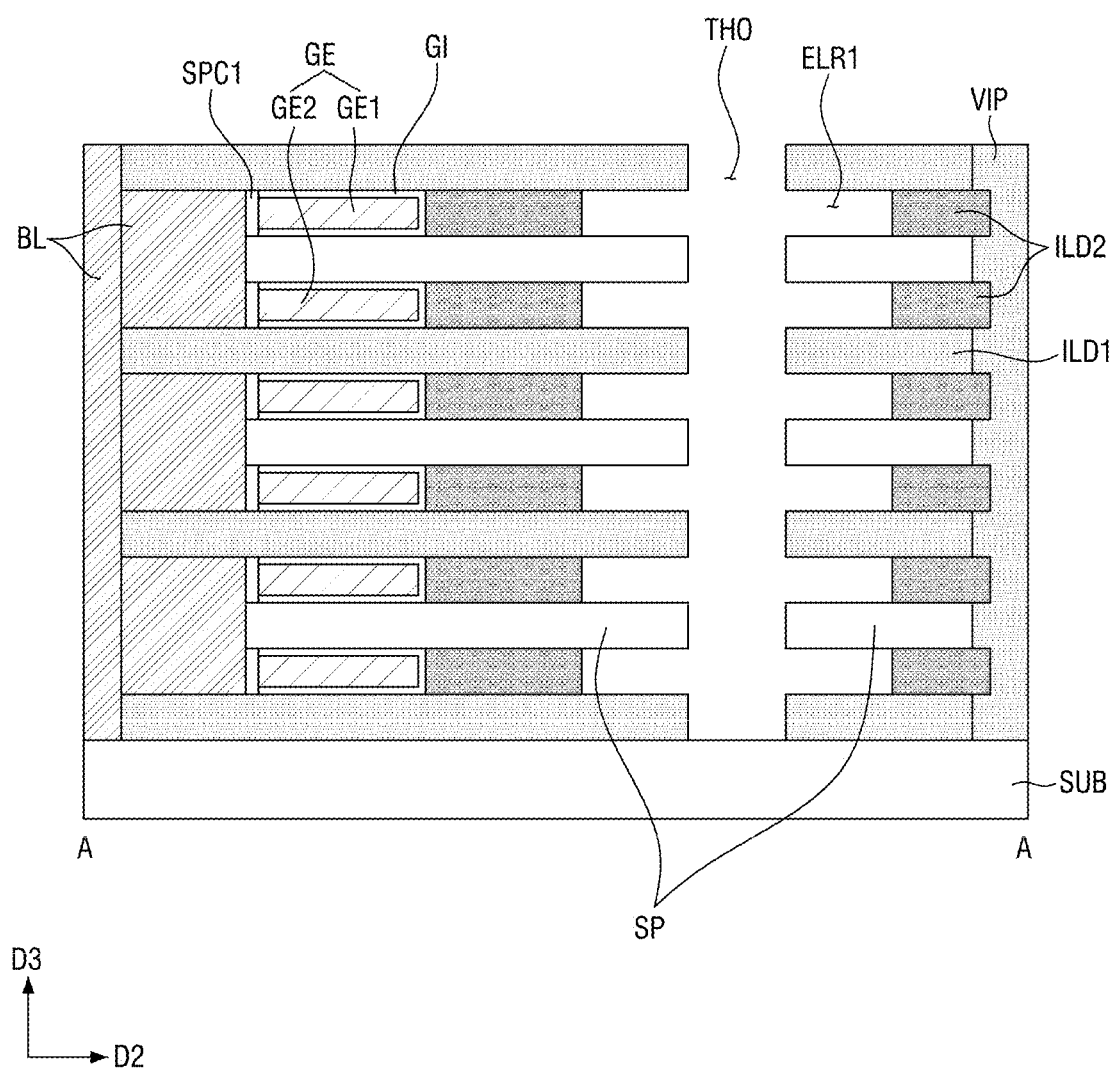

Referring to FIGS. 34a and 34b, a lower electrode recess ELR1 may be formed between the first mold insulating layer ILD1 and the semiconductor pattern SP, by partially etching the second mold insulating layer ILD2 exposed by the penetration hole THO.

The lower electrode recess ELR1 may be formed above and below the semiconductor pattern SP, respectively.

Subsequently, the fabricating process explained using FIGS. 26a to 30 may be performed.

Or, additionally, the semiconductor pattern SP exposed by the penetration hole THO may be partially etched, before performing operations in FIGS. 26a and 26b.

While some embodiments of inventive concepts have been described, the embodiments described herein should be considered in a descriptive sense only and not for purposes of limitation. Those skilled in the art will appreciate that many variations and modifications in form and detail may be made without substantially departing from the sprit and scope of inventive concepts as defined in the following claims.

What is claimed is:

1. A semiconductor memory device comprising:
  a substrate;
  a bit line on the substrate, the bit line extending in a first direction;
  a gate electrode on the substrate, the gate electrode extending in a second direction different from the first direction;
  a semiconductor pattern connected to the bit line, the semiconductor pattern extending in a third direction different from the first direction and the second direction, one of the first direction or the second direction being perpendicular to an upper surface of the substrate; and
  a capacitor including a first electrode connected to the semiconductor pattern, a second electrode spaced apart from the first electrode, and a dielectric film between the first electrode and the second electrode,
  the first electrode including an upper plate region and a lower plate region parallel to the upper surface of the substrate, and a connecting region that connects the upper plate region and the lower plate region,
  each of the upper plate region of the first electrode and the lower plate region of the first electrode including an upper surface and a lower surface facing each other, and
  the dielectric film is in contact with the upper surface of the upper plate region of the first electrode and the lower surface of the upper plate region of the first electrode, the dielectric film is in contact with the upper surface of the lower plate region of the first electrode and the lower surface of the lower plate region of the first electrode, and the dielectric film is in contact with a side surface of the connecting region of the first electrode.

2. The semiconductor memory device of claim 1, wherein the first electrode has a closed-loop shape.

3. The semiconductor memory device of claim 1, wherein the semiconductor pattern is along an entire periphery of the connecting region of the first electrode.

4. The semiconductor memory device of claim 1, wherein
the connecting region of the first electrode includes an outer wall facing the semiconductor pattern and an inner wall opposite to the outer wall, and
the semiconductor pattern covers a part of the outer wall of the connecting region of the first electrode.

5. The semiconductor memory device of claim 1, wherein the second electrode penetrates the upper plate region of the first electrode and the lower plate region of the first electrode.

6. The semiconductor memory device of claim 5, wherein the second electrode includes at least one of a metallic conductive film and a semiconductor material film.

7. The semiconductor memory device of claim 1, wherein
the first direction is parallel to the upper surface of the substrate, and
the second direction is perpendicular to the upper surface of the substrate.

8. The semiconductor memory device of claim 7, wherein the gate electrode penetrates the semiconductor pattern.

9. The semiconductor memory device of claim 7, wherein
the semiconductor pattern includes side walls facing each other in the first direction, and
the gate electrode is on the side walls of the semiconductor pattern.

10. The semiconductor memory device of claim 1, wherein the
first direction is perpendicular to the upper surface of the substrate, and
the second direction is parallel to the upper surface of the substrate.

11. The semiconductor memory device of claim 10, wherein
the gate electrode includes an upper gate electrode and a lower gate electrode,
the upper gate electrode is on a first surface of the semiconductor pattern, and
the lower gate electrode is on a second surface of the semiconductor pattern facing the first surface of the semiconductor pattern.

12. The semiconductor memory device of claim 1, wherein
the dielectric film is in contact with a side surface of the upper plate region of the first electrode between the upper surface of the upper plate region of the first electrode and the lower surface of the upper plate region of the first electrode, and
the dielectric film is in contact with a side surface of the lower plate region of the first electrode between the upper surface of the lower plate region of the first electrode and the lower surface of the lower plate region of the first electrode.

13. A semiconductor memory device comprising:
a substrate;
a bit line on the substrate, the bit line extending in a first direction;
a gate electrode on the substrate, the gate electrode extending in a second direction different from the first direction;
a semiconductor pattern connected to the bit line, the semiconductor pattern extending in a third direction different from the first direction and the second direction, one of the first direction and the second direction being perpendicular to an upper surface of the substrate; and
a capacitor including a first electrode connected to the semiconductor pattern, a second electrode spaced apart from the first electrode, and a dielectric film between the first electrode and the second electrode,
in a cross-sectional view taken in the third direction, the first electrode including a first sub-electrode region and a second sub-electrode region on both sides with the second electrode therebetween,
each of the first sub-electrode region and the second sub-electrode region including a connecting part extending in a direction perpendicular to the upper surface of the substrate, a first protruding part protruding from one end of the connecting part in the third direction, and a second protruding part protruding from an other end of the connecting part in the third direction, and
the dielectric film is in contact with an upper surface of the first protruding part of the first sub-electrode region, a lower surface of the first protruding part of the first sub-electrode region, an upper surface of the second protruding part of the first sub-electrode region and a lower surface of the second protruding part of the first sub-electrode region, the dielectric film is in contact with an upper surface of the first protruding part of the second sub-electrode region, a lower surface of the first protruding part of the second sub-electrode region, an upper surface of the second protruding part of the second sub-electrode region and a lower surface of the second protruding part of the second sub-electrode region, and the dielectric film is in contact with a side surface of the connecting part of the first sub-electrode region and a side surface of the connecting part of the second sub-electrode region.

14. The semiconductor memory device of claim 13, wherein
the first sub-electrode region is closer to the bit line than the second sub-electrode region, and
the first sub-electrode region and the second sub-electrode region are connected to the semiconductor pattern.

15. The semiconductor memory device of claim 13, further comprising:
a mold insulating film, wherein
the first sub-electrode region is closer to the bit line than the second sub-electrode region,
the connecting part of the first sub-electrode region is connected to the semiconductor pattern, and
the connecting part of the second sub-electrode region is in contact with the mold insulating film.

16. The semiconductor memory device of claim 13, further comprising:
a semiconductor liner extending along profiles of the first sub-electrode region and the second sub-electrode region, wherein
each of the first sub-electrode region and the second sub-electrode region are between the semiconductor liner and the dielectric film.

17. The semiconductor memory device of claim 13, wherein
the first direction is parallel to the upper surface of the substrate, and the second direction is perpendicular to the upper surface of the substrate.

18. The semiconductor memory device of claim 13, wherein
the first direction is perpendicular to the upper surface of the substrate, and
the second direction is parallel to the upper surface of the substrate.

19. The semiconductor memory device of claim 13, wherein
the dielectric film is in contact with a side surface of the first protruding part of the first sub-electrode region between the upper surface of the first protruding part of the first sub-electrode region and the lower surface of the first protruding part of the first sub-electrode region and a side surface of the second protruding part of the first sub-electrode region between the upper surface of the second protruding part of the first sub-electrode region and the lower surface of the second protruding part of the first sub-electrode region, and
the dielectric film is in contact with a side surface of the first protruding part of the second sub-electrode region between the upper surface of the first protruding part of the second sub-electrode region and the lower surface of the first protruding part of the second sub-electrode region and a side surface of the second protruding part of the second sub-electrode region between the upper surface of the second protruding part of the second sub-electrode region and the lower surface of the second protruding part of the second sub-electrode region.

* * * * *